US007343594B1

(12) United States Patent
Metzgen

(10) Patent No.: US 7,343,594 B1
(45) Date of Patent: Mar. 11, 2008

(54) SOFTWARE-TO-HARDWARE COMPILER WITH SYMBOL SET INFERENCE ANALYSIS

(75) Inventor: Paul Metzgen, Chiswick (GB)

(73) Assignee: Altera Corporation, San Jose, CA (US)

( * ) Notice: Subject to any disclaimer, the term of this patent is extended or adjusted under 35 U.S.C. 154(b) by 435 days.

(21) Appl. No.: 10/210,997

(22) Filed: Jul. 31, 2002

Related U.S. Application Data

(63) Continuation-in-part of application No. 09/924,272, filed on Aug. 7, 2001, which is a continuation-in-part of application No. 09/924,274, filed on Aug. 7, 2001.

(60) Provisional application No. 60/223,471, filed on Aug. 7, 2000.

(51) Int. Cl.
*G06F 9/45* (2006.01)
(52) U.S. Cl. ...................... 717/140; 717/151
(58) Field of Classification Search ................ 717/140, 717/151
See application file for complete search history.

(56) References Cited

U.S. PATENT DOCUMENTS

| 5,068,823 A | 11/1991 | Robinson .................... 395/500 |
| 5,134,884 A | 8/1992 | Anderson |
| 5,142,625 A | 8/1992 | Nakai ......................... 395/275 |
| 5,442,792 A | 8/1995 | Chun |
| 5,469,003 A | 11/1995 | Kean |
| 5,535,342 A | 7/1996 | Taylor ......................... 395/307 |
| 5,535,406 A | 7/1996 | Kolchinsky |
| 5,541,849 A | 7/1996 | Rostoker et al. |
| 5,548,228 A | 8/1996 | Madurawe .................... 326/41 |
| 5,684,980 A | 11/1997 | Casselman ................... 395/500 |
| 5,705,938 A | 1/1998 | Kean |
| 5,761,484 A | 6/1998 | Agarwal et al. |
| 5,819,064 A | 10/1998 | Razdan et al. |
| 5,822,570 A | 10/1998 | Lacey |

(Continued)

FOREIGN PATENT DOCUMENTS

EP  0 419 105 A2  3/1991

(Continued)

OTHER PUBLICATIONS

Stephenson, Mark William. "Bitwise: Optimizing Bitwidths Using Data-Range Propagation", Submitted to the Department of Electrical Engineering and Computer Science at the Massachusetts Institue of Technology on May 5, 2000, pp. 1-63.*

(Continued)

*Primary Examiner*—Tuan Dam
*Assistant Examiner*—John J Romano
(74) *Attorney, Agent, or Firm*—Ropes & Gray LLP; Alexander Shvarts; Michael J. Chasan

(57) ABSTRACT

A software-to-hardware compiler is provided that generates hardware constructs in programmable logic resources. The programmable logic resources may be optimized in terms of being configured to make additional copies of regions on memory devices other than on the programmable logic resources (e.g., RAM). This facilitates multiple reads during a single clock cycle. Symbol set analysis is used to minimize the size of regions to allow for more efficient use of hardware resources.

19 Claims, 63 Drawing Sheets

U.S. PATENT DOCUMENTS

| | | | |
|---|---|---|---|
| 5,835,734 | A | 11/1998 | Alkalaj et al. |
| 5,966,534 | A | 10/1999 | Cooke et al. ............... 395/705 |
| 5,968,161 | A | 10/1999 | Southgate .................... 712/37 |
| 5,999,990 | A | 12/1999 | Sharrit et al. |
| 6,044,211 | A | 3/2000 | Jain |
| 6,085,317 | A | 7/2000 | Smith ........................... 713/1 |
| 6,219,628 | B1 | 4/2001 | Kodosky et al. |
| 6,219,785 | B1 | 4/2001 | Smith |
| 6,226,776 | B1 | 5/2001 | Panchul et al. |
| 6,282,627 | B1 | 8/2001 | Wong et al. .................. 712/15 |
| 6,421,809 | B1 * | 7/2002 | Wuytack et al. ............... 716/2 |
| 6,457,173 | B1 | 9/2002 | Gupta |
| 6,467,075 | B1 * | 10/2002 | Sato et al. .................... 716/18 |
| 6,477,683 | B1 | 11/2002 | Killian et al. |
| 6,608,638 | B1 | 8/2003 | Kodosky et al. |
| 6,625,797 | B1 | 9/2003 | Edwards et al. |
| 6,658,564 | B1 | 12/2003 | Smith et al. |
| 6,745,160 | B1 | 6/2004 | Asher et al. |
| 2002/0100032 | A1 | 7/2002 | Metzgen |
| 2002/0124238 | A1 | 9/2002 | Metzgen |

FOREIGN PATENT DOCUMENTS

| | | |
|---|---|---|
| EP | 0 419 105 A3 | 3/1991 |
| EP | 0 445 913 A2 | 9/1991 |
| EP | 0 759 662 A2 | 2/1997 |
| EP | 0 801 351 A2 | 10/1997 |
| EP | 0 801 351 A3 | 10/1997 |
| EP | 0 829 812 A2 | 3/1998 |
| GB | 1 444 084 | 7/1978 |
| WO | WO 94/10627 | 5/1994 |
| WO | WO 97/09930 | 3/1997 |
| WO | WO 97/13209 | 4/1997 |
| WO | WO 00/38087 | 6/2000 |

OTHER PUBLICATIONS

Callahan, Timothy J. et al. "The Garp Architecture and C Compiler," *Computer*, Apr. 2000, pp. 62-69.

Cardoso, J M P et al. "Macro-based Hardware Compilation of Java™ Bytecodes into a Dynamic Reconfigurable Computing System," *Proceedings of Seventh Annual IEEE Symposium*, Apr. 21, 1999, Los Alamitos, CA, pp. 2-11.

Edwards, M.D. et al. "Software acceleration using programmable hardware devices," Jan. 1996, pp. 55-63.

Electronik, DE, Franzis Verlag GMBH—"MIT Programmierbarer Logik Verheiratet," Mar. 31, 1998, vol. 47, No. 7, p. 38.

Guccione, Steve. List of FPGA-based Computing Machines, <http://www.io.com/~guccione/HW_list.html>, Last Modified Mar. 31, 1999.

IBM, "Programmable Manual Cable Assembly Board," May 1989, IBM Technical Disclosure Bulletin, vol. 31, pp. 306-309.

Iseli et al. "A C++ compiler for FPGA custom execution synthesis," *Proceedings of IEEE Symposium*, Apr. 19, 1995, Los Alamitos, CA, pp. 173-179.

Isshiki, T et al. "Bit-serial pipeline synthesis and layout for large-scale configurable systems," *Proceedings of The ASP-DAC '97*, Jan. 28, 1997, Chiba, Japan, pp. 441-446.

Kastrup, Bernardo et al. "ConCISe: A Compiler-Driven CPLD-Based Instruction Set Accelerator," *Proceedings of Seventh Annual IEEE Symposium*, Apr. 21, 1999, Los Alamitos, CA, pp. 92-101.

Nanya, T. "Asynchronous VSLI System Design," ASP-DAC '98 Tutorials, Feb. 10, 1998, Yokohama, Japan.

Nanya, T. et al. "Scalable-Delay-Insensitive Design: A high-performance approach to dependable asynchronous systems," *Proceedings of International Symposium on Future of Intellectual Integrated Electronics*, Mar. 1999, pp. 531-540.

Page, Ian. "Constructing Hardware-Software Systems from a Single Description," *Journal of VSLI Signal Processing*, vol. 12, No. 1, Jan. 1996, pp. 87-107.

Semeria, L. et al. "SpC: synthesis of pointers in C application of pointer analysis to the behavioral synthesis from C," *Proceedings of ICCAD International Conference on Computer Aided Design*, Nov. 8-12, 1998, San Jose, CA, pp. 340-346.

Wazlowski, M. et al. "PRISM-II compiler and architecture," *Proceedings of IEEE Workshop*, Apr. 5, 1994, Los Alamitos, CA, pp. 9-16.

Wirthlin, Michael J. et al. "Improving Funtional Density Using Run-Time Circuit Reconfiguration," IEEE Transactions on Very Large Scale Integration (VSLI) Systems, vol. 6, No. 2, Jun. 1998, pp. 247-256.

Wo, D. et al. Compiling to the gate level for a reconfigurable co-processor, *Proceedings of IEEE Workshop*, Apr. 10, 1994, Los Alamitos, CA, pp. 147-154.

Tsukasa Yamauchi et al., "SOP: A Reconfigurable Massively Parallel System and Its Control-Data-Flow based Compiling Method," NEC Laboratory, pp. 148-156, IEEE 1996.

\* cited by examiner

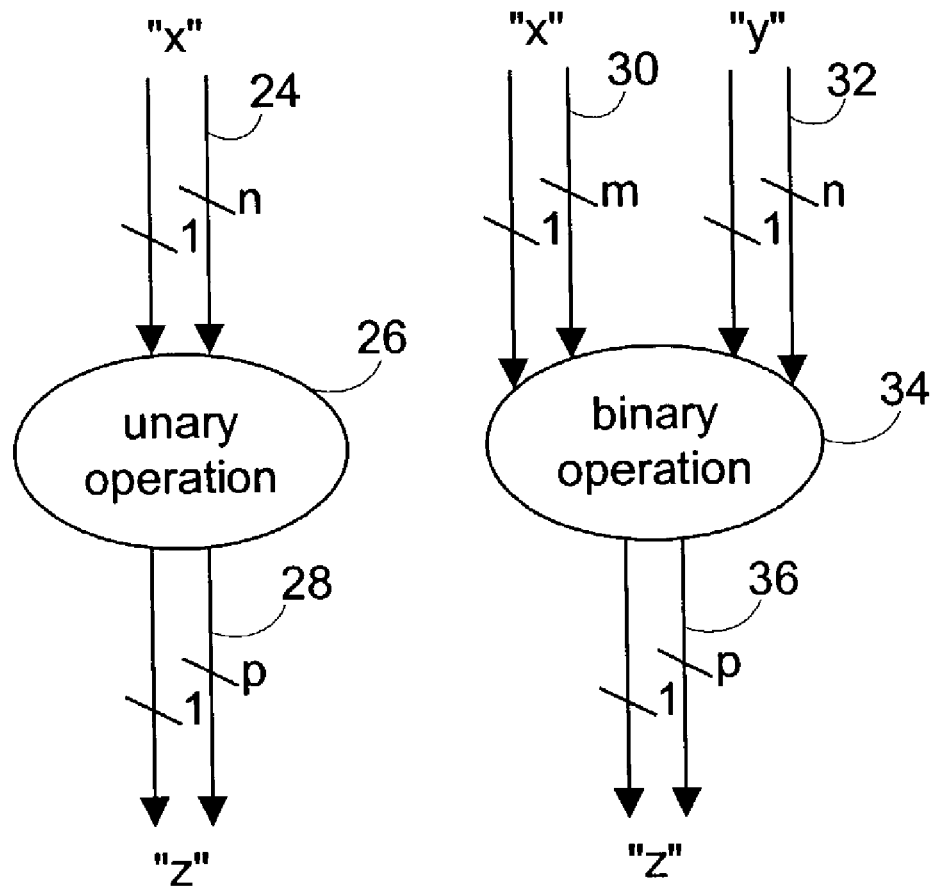
FIG. 8     FIG. 9

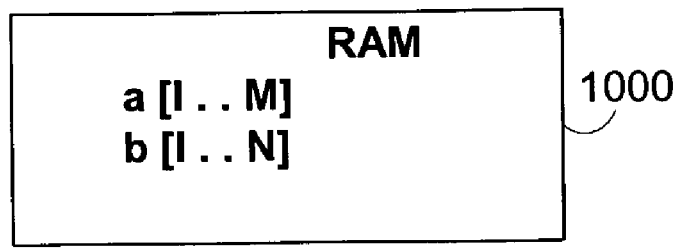
FIG. 43
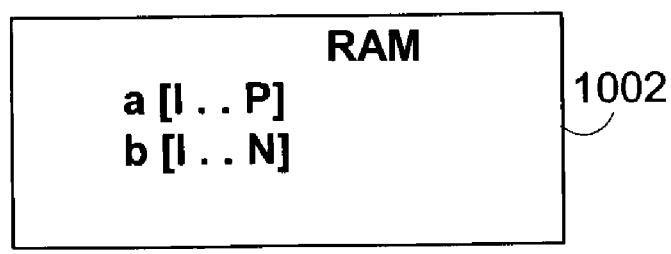
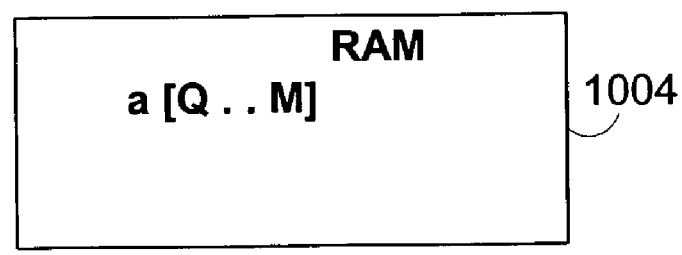
FIG. 44

SOFTWARE-TO-HARDWARE COMPILER WITH SYMBOL SET INFERENCE ANALYSIS

This application is a continuation-in-part application of U.S. patent application Ser. Nos. 09/924,272 and 09/924,274, both filed Aug. 7, 2001, which both claim the benefit of U.S. provisional application No. 60/223,471, filed Aug. 7, 2000, all of which are hereby incorporated by reference herein in their entireties.

BACKGROUND OF THE INVENTION

This invention relates to a high-level programming language compiler, and more particularly, this invention relates to a high-level programming language compiler that converts a high-level programming language into hardware constructs.

Programmable logic provides many benefits in the design and manufacture of hardware and software systems. For example, efficiencies with respect to cost and time are known benefits. Programmable logic allows designers to avoid having to hard-wire circuits. Designers typically use specialized hardware design software to create logic circuits by interconnecting various types of logic gates, memory, etc on a computer screen.

Some known software packages allow the designer to write code in which various hardware constructs are specified. These software packages are typically specially designed for use with particular programmable logic hardware.

These tools do not, however, reach the ease of use and range of compatibility as do high-level language software compilers. For example, JAVA and C++ are widely used high-level languages that can be used to create various types of software constructs, such as loops, conditionals, functions, etc. with ease. These software constructs are compiled into a software program that can be executed on a computer's microprocessor (i.e., using the built-in instruction set). There does not exist any such high-level language compiler that can compile pure software constructs (i.e., that are transparent with regard to hardware) into programmable logic configuration data.

Moreover, the tools that are available for generating programmable logic in hardware typically lack the ability to produce efficient circuitry. For example, most of these tools implement software variables as registers in hardware. This leads to the necessity of having to multiplex every write to a register. Because multiplexers are large and slow in programmable logic, this implementation inherently leads to inefficiencies and makes retiming the circuit difficult.

One of the advantages of using hardware over software implementations is that hardware offers a greater degree of parallelism than does software. Software constructs typically execute in a sequential order. For example, loop iterations execute one after the other and conditional statements are evaluated before deciding whether to execute an ELSE construct or a THEN construct. The parallel nature of hardware has the potential to provide for more efficient execution and decision-making than that offered by software. However, present-day programmable logic compilers and tools do not generate programmable logic that takes full advantage of its parallel nature.

It would therefore be desirable to have a software-to-hardware compiler that maps pure software constructs into hardware constructs implemented in programmable logic.

It would further be desirable to be able to generate hardware in programmable logic that is optimized for parallelism.

SUMMARY OF THE INVENTION

It is therefore an object of the present invention to provide a software-to-hardware compiler that maps pure software constructs into hardware constructs implemented in programmable logic.

It is a further object of the present invention to generate hardware in programmable logic that is optimized for parallelism.

These and other objects are accomplished in accordance with the principles of the present invention by providing a compiler that converts a high-level programming language into hardware constructs implemented on programmable logic resources.

A software-to-hardware compiler parses through code written in a high-level programming language that defines pure software constructs. That is, hardware configurations and constructs are not included anywhere in the code. The software constructs are mapped directly into hardware constructs such that the program defined by the software constructs executes substantially the same in the hardware implementation with respect to doing what the program was intended to do.

The hardware constructs are implemented in programmable logic using programmable logic resources such as programmable logic devices, field programmable gate arrays, or any other suitable programmable logic resources. In order to avoid the use of too many large multiplexers, variables may be implemented in hardware as a set of wires. One wire of a variable is used to indicate whether that value has been computed (i.e., is valid for use) while the remainder of the wires indicate what the value is.

Based on this mapping, expressions, arrays, pointers, and any other suitable data structures (or regions) may likewise be implemented using wires (i.e., as opposed to registers). In one suitable approach, wires and registers may both be used concurrently to represent variables (e.g., for retiming optimizations, off-chip communications, etc.).

The software-to-hardware compiler of the present invention may perform optimization analysis at a later stage of a software-to-hardware compilation. Based on the optimization analysis, suitable modifications to the resultant circuit may be made to maximize data flow, increase the clock's frequency, or optimize the hardware in any other suitable way. For example, the software-to-hardware compiler may analyze the critical path of the hardware and place registers at points in the circuit to maintain a balance in the circuit.

Programmable logic is divided into blocks of operations. The blocks are coupled to one another using a programmable interconnect. A control flow is passed into every block that specifies whether and how the block is to execute. The control flow may be used to make run-time decisions by the hardware in terms of parallel execution of blocks.

Parallel execution may include speculation, pipelining (e.g., loop-pipelining), shared blocks, or any other suitable form of parallel execution.

Speculation may take place in the situation where there is an uncertainty with regard to whether a block will be executed. If execution of the block will not result in relevant changes in the system, then the block may be executed in parallel with other blocks. For example, the THEN part and ELSE part of a conditional block may be executed speculatively (i.e., in parallel) assuming there are no consequences in doing so.

The software-to-hardware compiler of the present invention may generate hardware that is capable of sharing blocks (i.e., to implement different parts of the software program). The shared blocks may be explicitly defined by a user using functions in the high-level language code. In another suitable approach, the software-to-hardware compiler may be given the ability to recognize common expressions and implement them as shared blocks in the hardware.

Loop-pipelining allows more than one iteration of a loop to be executed simultaneously. A pertinent state register may be used to store and update intermediate values that are used in the loop iterations. The intermediate values are eventually merged into a final output of the loop.

The software-to-hardware compiler may perform an analysis to determine whether making simultaneous reads to particular regions (e.g., corresponding to objects defined in a program) would result in a net optimization. The software-to-hardware compiler may generate hardware constructs configured to make a particular number of copies of certain regions in memory devices, such as in RAM or in registers, based on the results of the analysis.

In one suitable approach, the software-to-hardware compiler may generate hardware constructs configured to perform the analysis during run-time of the program. Based on the results of the analysis, the hardware constructs may create an appropriate number of copies of the regions needed to result in an optimization.

The software-to-hardware compiler may perform symbol set analysis in determining further ways in which hardware constructs may be made more efficient. Symbol set analysis may involve analyzing the range (e.g., set) of values (e.g., symbols) that a particular object in a program may represent. The software-to-hardware compiler may minimize this set and generate hardware in accordance with this minimization. For example, in the case of variables, the software-to-hardware compiler may determine a minimized set of values that a particular variable could possibly represent during execution of the program. The software-to-hardware compiler may then generate hardware constructs that use regions needing less space to represent variables, thus minimizing resources used (e.g., wires in the case of programmable logic resources, and RAM bits in the case of RAM devices).

In the case of pointers, with respect to, for example, ANSI-C, pointers may point to any object. The software-to-hardware compiler may perform a symbol set analysis to determine to what types of objects a particular pointer can possibly point during execution of the program. Based on this analysis, the software-to-hardware compiler may generate hardware constructs configured to use pointers that may point to only those types of objects to which they can possibly point during execution of the program.

Recursive functions may be compiled into hardware constructs by the software-to-hardware compiler. The software-to-hardware compiler may collapse the functions into a series of loops and conditionals and generate hardware based on these collapsed functions in accordance with the present invention.

Each function (i.e., whether recursive or not) may be associated with a stack and a stack pointer. The stack may include information related to function arguments, local variables, a return address, return variables, and any other suitable information. The software-to-hardware compiler may generate function stacks that use only the resource necessary to store what needs to be stored. That is, the stack need not be bit-aligned, or padded in any way in conformance with the specification of any particular software programming language.

BRIEF DESCRIPTION OF THE DRAWINGS

The above and other objects of the present invention will be apparent upon consideration of the following detailed description, taken in conjunction with the accompanying drawings, in which like reference characters refer to like parts throughout, and in which:

FIG. 8 shows an illustrative unary operator in accordance with the present invention;

FIG. 9 shows an illustrative binary operator in accordance with the present invention;

FIG. 43 is a block diagram of an illustrative RAM device storing region elements in accordance with the present invention;

FIG. 44 is a block of multiple illustrative RAM devices storing region elements in accordance with the present invention;

DETAILED DESCRIPTION OF THE INVENTION

The present invention provides application programmers, engineers, and designers with the ability to use a high-level programming language (e.g., C, C++, JAVA, COBOL, Fortran, LISP, BASIC, Pascal, or any other suitable high-level programming language) to configure programmable logic resources. A programmable logic resource may include one or more programmable logic devices (PLD), one or more field programmable gate arrays (FPGA), one or more of any other suitable device, or any combination thereof.

For brevity and clarity, the functions of the present invention are described primarily in terms of a software-to-hardware compiler. This is merely an illustrative abstraction of the present invention. For example, in another suitable embodiment, the present invention may be described in terms of a parser or any other suitable utility that may be used to convert high-level code into configuration data for one or more programmable logic resources.

The goals of the present invention are accomplished by creating mappings from high-level programming language constructs to hardware constructs. For example, an addition instruction in a programming language is mapped to a set of gates that implement addition in hardware. The mappings may be complete mappings. That is, every software construct may be mapped to a corresponding hardware construct. This avoids having to take into account hardware when writing software programs. Thus, any software program may be translated into hardware without the need to resort to writing some portions in a hardware language.

Figure 1:
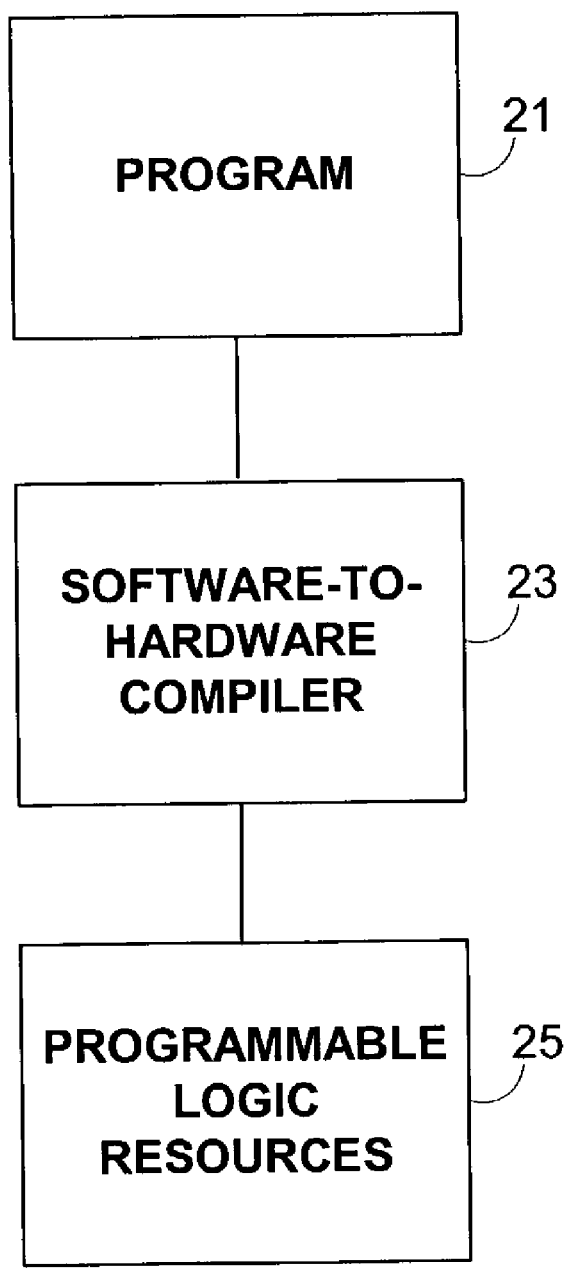
FIG. 1 is a block diagram showing how the software-to-hardware compiler generates hardware in accordance with the present invention.

FIG. 1 is a block diagram illustrating how the software-to-hardware compiler of the present invention is used to generate hardware. Program 21 may be written in a high-level programming language. It is parsed and analyzed by software-to-hardware compiler 23, which generates configuration data. The configuration data may be any suitable configuration data that is used to program programmable logic resources 25. Thus, software-to-hardware compiler 23 generates hardware via programmable logic resources 25 using software-based program 21. It will be understood that other components may be introduced into the arrangement of FIG. 1. For example, debuggers, interfaces (i.e., either software or hardware), intervening hardware components, or any other suitable component may be introduced.

Figure 2:
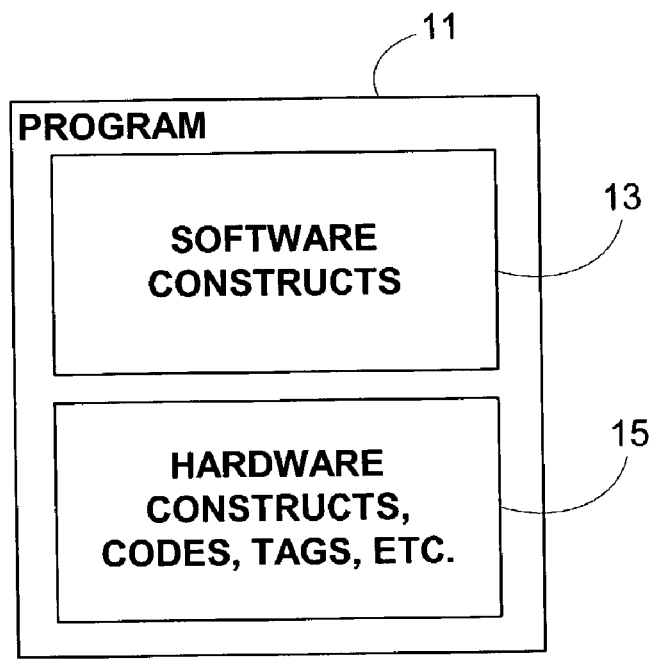
FIG. 2 is a block diagram of a program having software constructs and hardware constructs.
Figure 3:
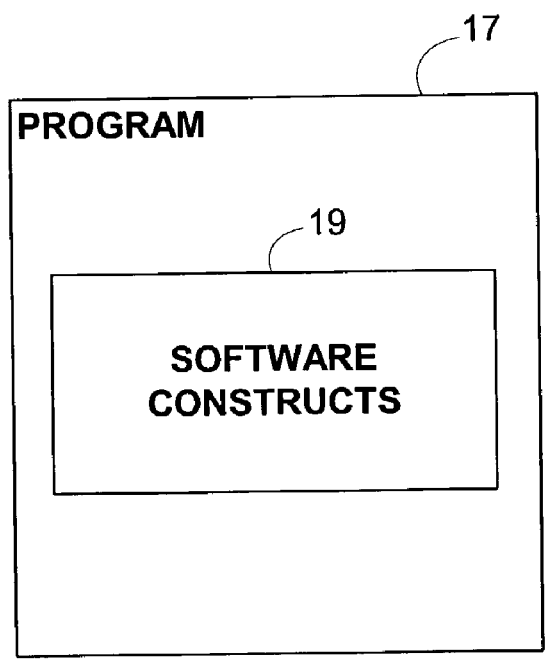
FIG. 3 is a block diagram of a program having only software constructs in accordance with the present invention.

FIG. 2 shows one way in which hardware may be generated using a high-level programming language. Program 11 is written using software constructs 13 and hardware constructs, codes, tags, etc. 15. In this embodiment, the author of program 11 must acknowledge the hardware on which program 11 will execute. The software-to-hardware compiler of the present invention, may use the approach shown in FIG. 1. In another embodiment, the software-to-hardware compiler of the present invention may compile programs such as program 17 of FIG. 3 by allowing the program author to provide only software constructs 19—without the need to specify any hardware-related information.

Software constructs 19 may include any suitable software-based constructs, such as commands, expressions, data structures, modules, variables, or any other suitable high-level language software constructs.

Software variables, as used herein, refer to the commonly accepted definition in the art (i.e., value and expression placeholders). Software variables may hold any suitable types of data, such as integers, floating point numbers, characters, arrays, pointers, or any other suitable types of data.

Software may be regarded as a sequence of nested "blocks." The software-to-hardware compiler of the present invention translates each block into hardware, connecting blocks together by attaching the values of variables at the output of preceding blocks to the values of the corresponding variables at the input to subsequent blocks.

The software-to-hardware compiler of the present invention represents the value of a variable at a particular point in the software program as a set of wires in hardware. The value of the same variable at different points in the software program may be represented by different sets of wires.

During the execution of a software program, the value of a software variable may change. At any given point in the program, the value of a software variable is either computed or not computed (i.e., the variable is either valid for use or not valid for use, respectively). Loops and sharing may break this rule in a limited way.

At any given point in the execution of a software program, there are a set of variables that are in scope. An "environment" is a mapping from those variable names to the wires representing their values at any given point in the execution. The environment need not change unless a new variable comes into scope.

Figure 4:
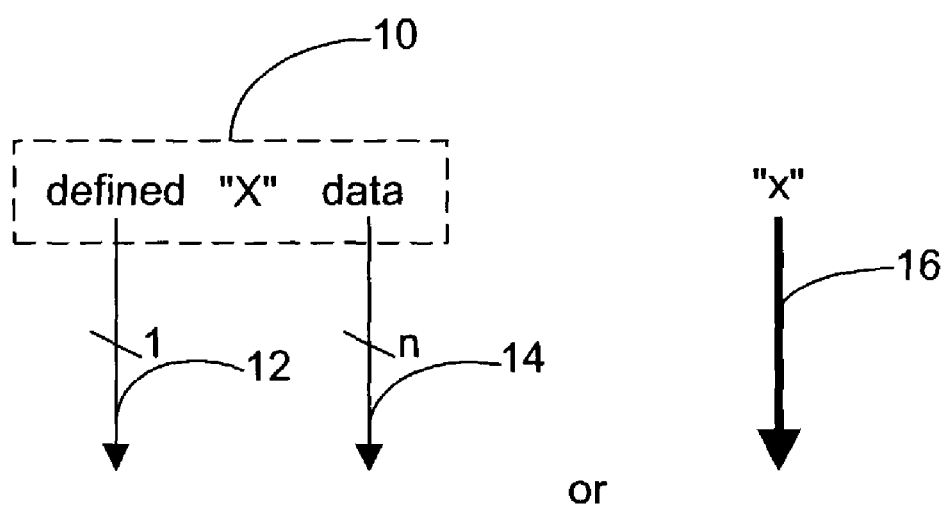
FIG. 4 shows how a variable and its value is mapped into hardware in accordance with the present invention.

FIG. 4 shows an illustrative representation of the value of a software variable in hardware 10. N data wires 14 are used to represent the value itself, and an additional wire 12 indicates whether the value is computed. For purposes of brevity and clarity, the values of variables are primarily illustrated herein as bold wires. For example, variable 10 is identical to variable 16. The bold wire of variable 16 may include the N+1 wires of variable 10.

Figure 5:
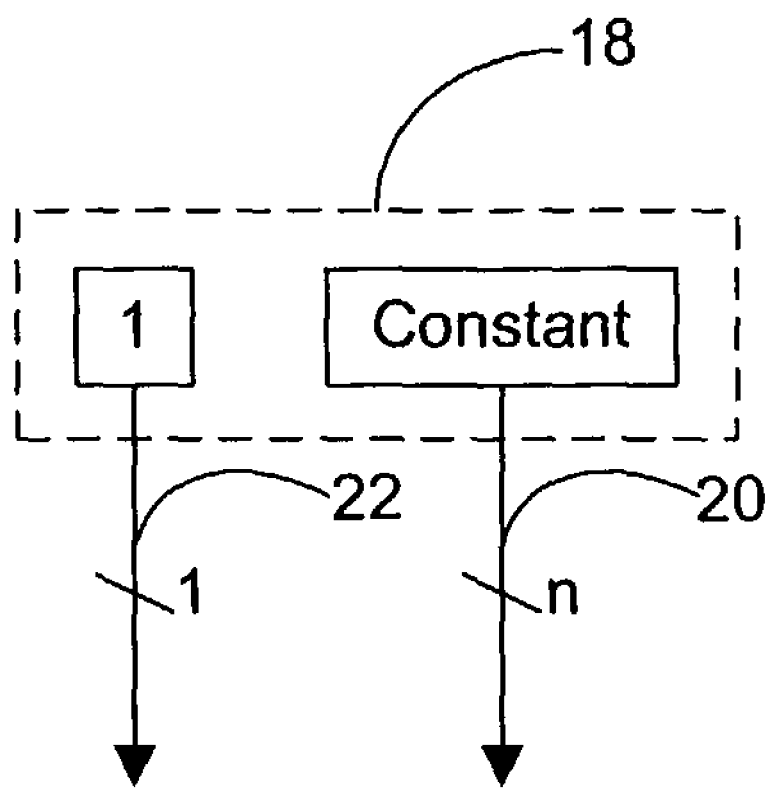
FIG. 5 shows how a constant and its value is mapped into hardware in accordance with the present invention.

A variable that only ever has one value is termed constant. In hardware, a constant is represented as a set of wires having a particular value and an additional wire indicating that the value is always computed. FIG. 5 illustrates this representation of a constant 18. Wires 20 are used to hold the constant value. Wire 22 indicates that the constant is computed.

Figure 6:
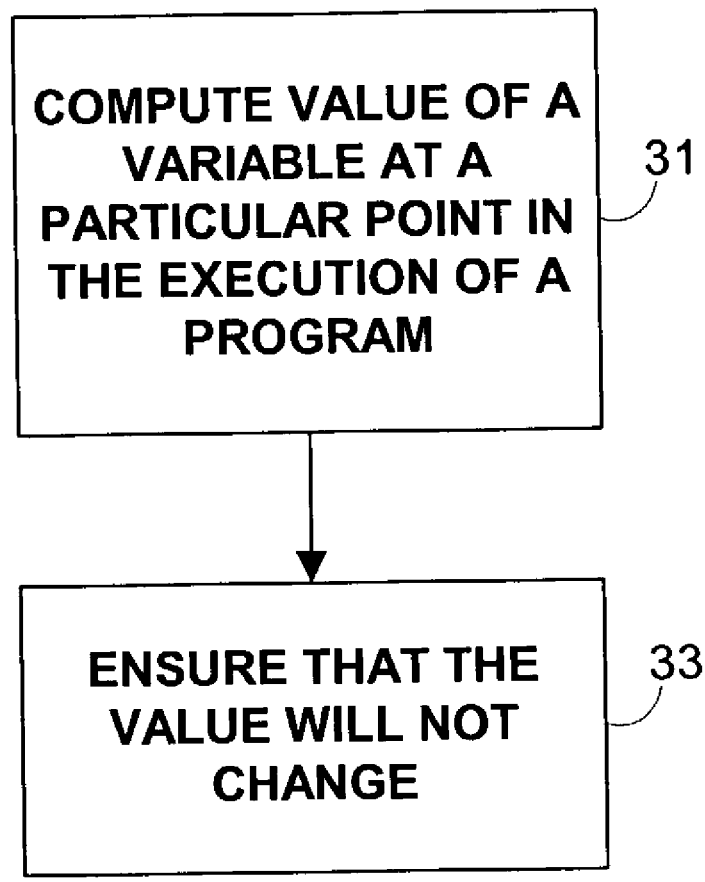
FIG. 6 is a flow chart of illustrative steps involved in computing a value of a variable in accordance with the present invention.

Assuming no loops or sharing, the software-to-hardware compiler of the present invention may ensure that once the value of a variable at a particular point in the execution of the program is computed, its value will not change. That is, the compiler generates hardware that ensures that this rule is not broken. FIG. 6 is a flow chart of illustrative steps reiterating this process. At step 31, the hardware generated by the software-to-hardware compiler computes the value of a variable at a particular point in the execution of a program. At step 33, hardware generated by the software-to-hardware compiler ensures that the value computed does not change for the duration of the execution of the program. One of the advantages of this feature of the software-to-hardware compiler is the ability to make hardware control circuitry very small. Applying retiming optimizations is made easier as well.

Figure 7:
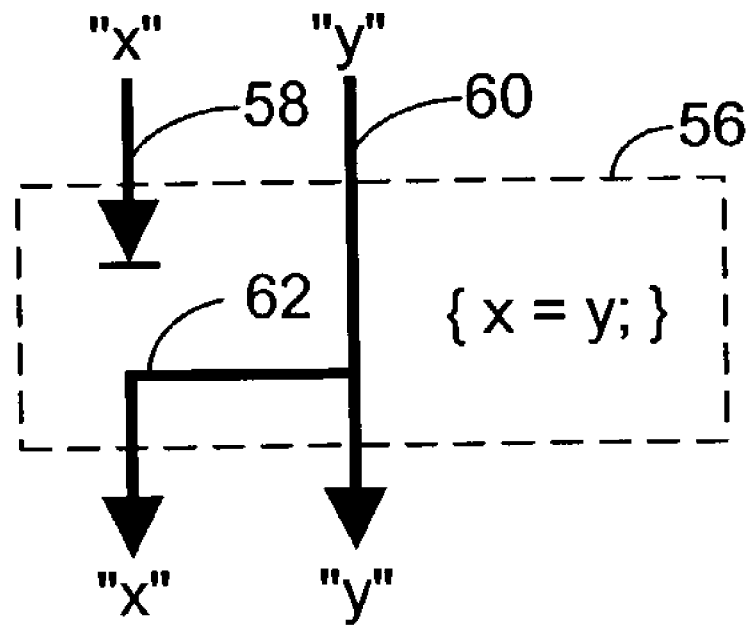
FIG. 7 is a schematic of an illustrative assignment operator in accordance with the present invention.

In a software program, execution proceeds by performing operations (e.g., arithmetic operations, movement of data, generation of data, etc.). Some operations may affect the value of variables. The software-to-hardware compiler of the present invention may be given the ability to implement software operations into hardware. An operation in hardware takes wires representing the value of variables in the current environment as input, and has additional wires representing the values of variables as output. The environment is updated so that the variable names to which the operation assigns its results map to the wires used to store its new value. FIG. 7 illustrates this technique. Operator 56 assigns the value of one variable (i.e., represented by wires 60) to another variable (i.e., represented by wires 58). This may be done by replacing the representation of the assignee variable from wires 58 to wires 62. Thus, subsequent reads to "x" use wires 62 rather than wires 58.

Operations may occur in large expressions in which variables are not directly updated. In these cases, new variable names may be used to represent intermediate results. By keeping track of how values are computed, it may be possible to identify when two variables compute the same value, and hence can be "merged," reducing hardware resources being used.

The value of the variable at the output of an operation is deemed computed when all the values at the input of the operation, upon which the output depends, are computed.

Operations may be represented in hardware using purely asynchronous logic. In another suitable approach, operations may be represented in hardware using pipelined circuitry. If using pipelined circuitry, output data may not become computed until after some number of clock cycles. Different outputs may even have different delays. The software-to-hardware compiler may ensure that the overall functionality of the hardware is the same irrespective of delays that the operations may have.

FIGS. 8 and 9 show illustrative unary and binary operators 26 and 34, respectively. In the case of a unary operation, input data 24 may be used by unary operator 26 to produce output data 28. In the case of a binary operation, input data 30 and 32 may be used by binary operator 34 to produce output data 36. The operators of FIGS. 8 and 9 are merely illustrative. Any other suitable number of inputs and outputs may be implemented for any suitable corresponding operator.

Figure 10:
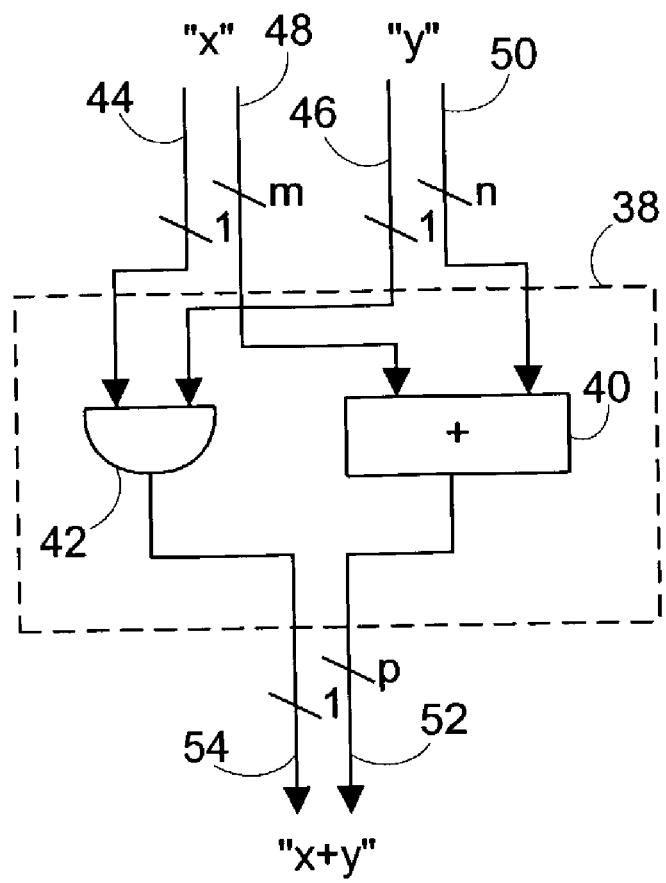
FIG. 10 is a schematic of an illustrative addition operator in accordance with the present invention.

FIG. 10 shows an illustrative addition operator 38 that may be implemented in hardware using the software-to-hardware compiler. Value wires 48 and 50 correspond to the values of addends of an addition operation. Value wires 48 and 50 may be inputs to a sub-addition operator 40 (i.e., used to determine the value of the sum of the addends). Defined wires 44 and 48 indicate whether the addends are valid. If at AND gate 42, addition operator 38 determines that the addends are valid, then defined wire 54 of the output of addition operator 38 is also valid. Wires 54 and 52 correspond to the expression of the sum of the inputs.

Figure 11:
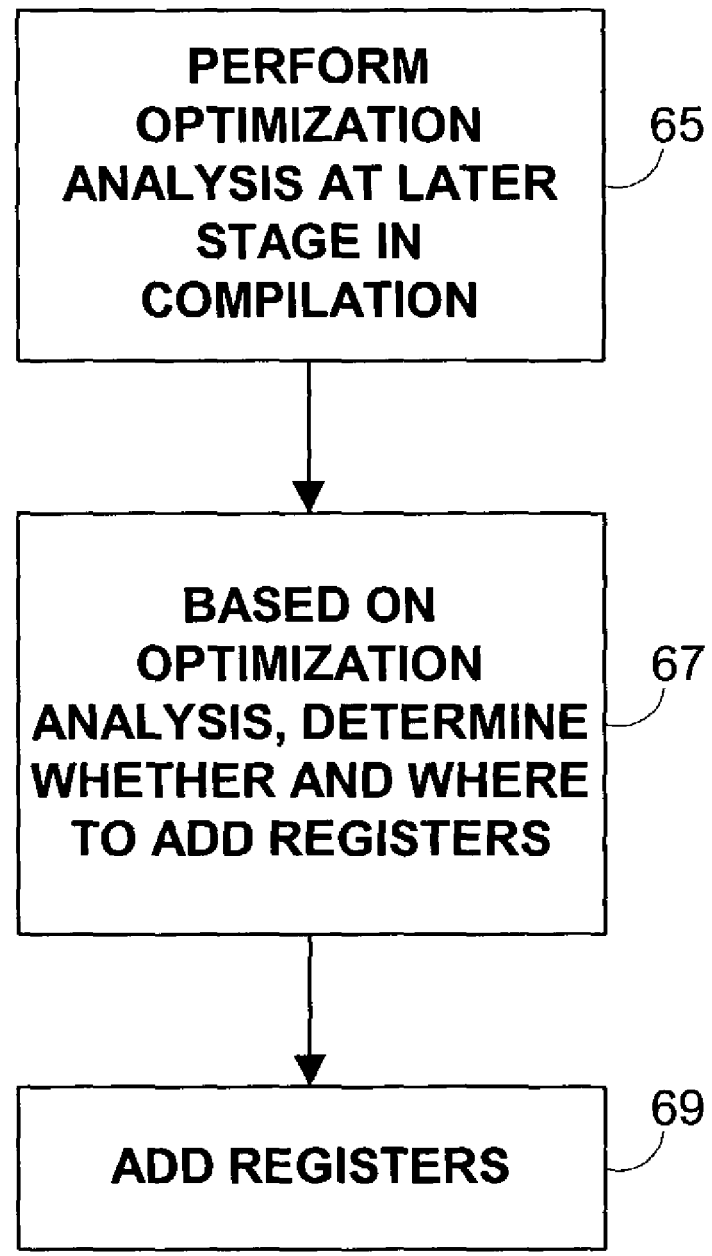
FIG. 11 is a flow chart of illustrative steps involved in optimizing a circuit by adding registers in accordance with the present invention.

In one suitable approach, the software-to-hardware compiler need not add pipelining to operations initially. Rather, as shown in FIG. 11, at step 65 a late stage performance optimization phase may run an analysis on the software to be compiled. At step 67, based on this analysis, the software-to-hardware compiler may determine various optimizations to make to the hardware to make it more efficient (e.g., decrease the time-critical path of the whole design). For example, the compiler may determine that the addition of registers (i.e., at step 69) at particular points will allow the hardware to be clocked at a higher frequency. This may result in an overall increase in data throughput, despite the extra register stage. In programmable logic, registers are closely associated with asynchronous logic blocks, and may often be added without incurring a size penalty. Any other suitable optimizations may be made by the software-to-hardware compiler at this late stage.

Reading a variable may be accomplished by coupling a read port of an operator to the current set of wires representing the variable.

Figure 12:
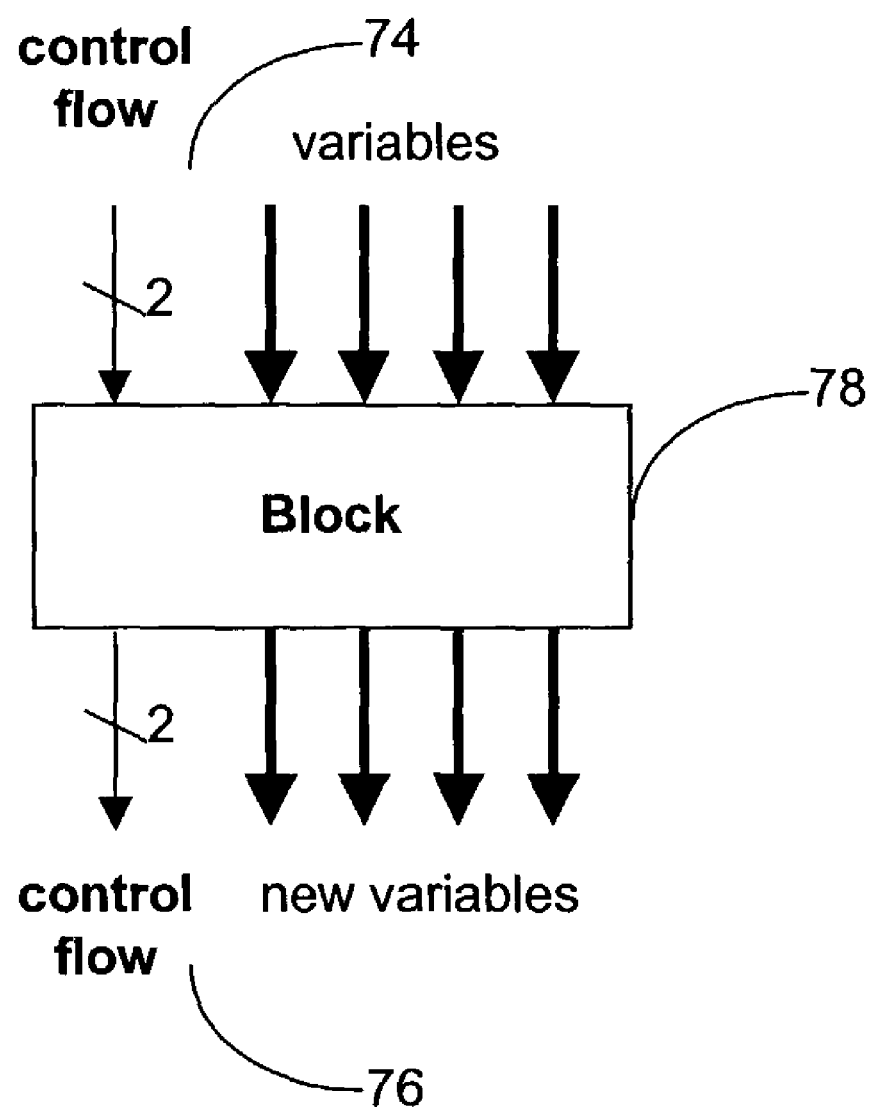
FIG. 12 shows a simplified block in accordance with the present invention.

Blocks are another representation of software in the hardware context. Programmable logic is composed of a number of basic blocks of hardware coupled together with programmable interconnect. A block takes wires from a single input environment and generates wires for a single output environment. FIG. 12 illustrates this process. Environment 74 is taken as an input by block 78. Block 78 may perform any suitable operations using environment 74 to produce the output—environment 76.

FIG. 12 is merely an illustrative and simplified representation of a block and its inputs and outputs. It will be apparent that additional control signals are needed.

A block is composed of operations that may be arranged such that there are no looping dependencies. Because a block can modify control flow, whereas an operation cannot, a block is not necessarily a composite operation.

Figure 13:
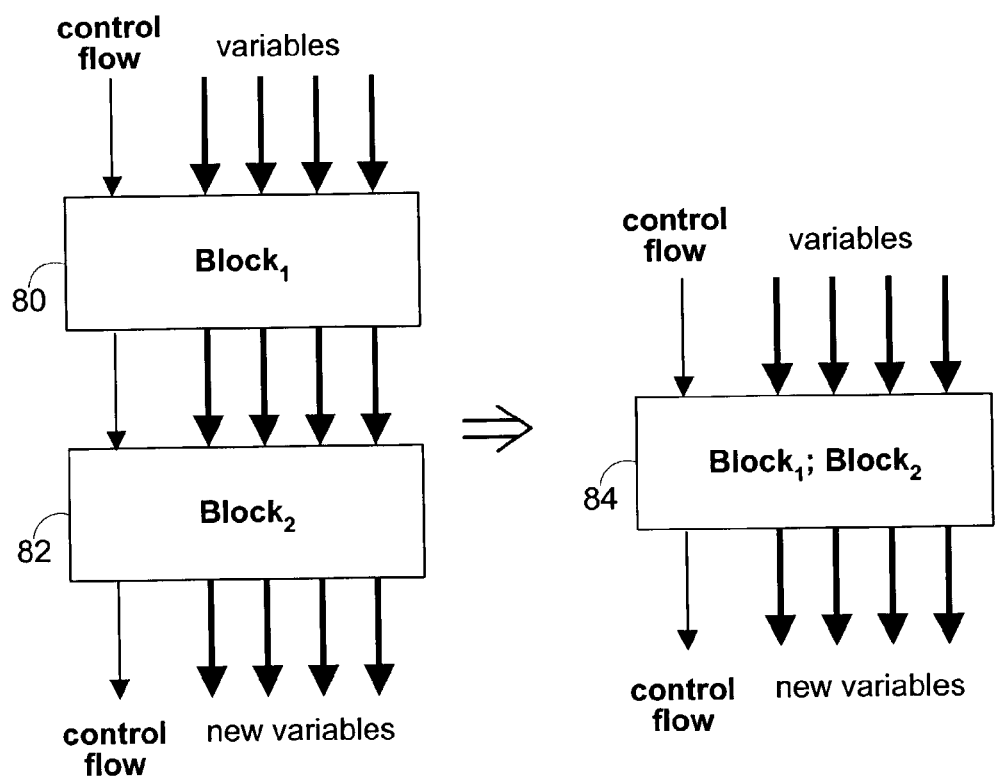
FIG. 13 shows the amalgamation of two blocks into a single block in accordance with the present invention.

Sequential blocks may be amalgamated into a single block (without introducing an extra hierarchy). This is illustrated in FIG. 13 in which sequential blocks 80 and 82 are amalgamated into block 84. For reasons to be introduced later (e.g., speculation), sequential blocks do not necessarily execute in sequential order. Control flow dictates the order in which operations should be executed.

In a sequential program (i.e., in software), control flow is generally sequential. Exceptions occur when jumps or conditional instructions are encountered. In these cases it is necessary to wait for the control flow to specify which operations will be executed and which operations will not be executed.

Hardware allows a large number of operations to be executed simultaneously. The software-to-hardware compiler of the present invention uses a run-time control flow system to maximize the number of operations that can be executed simultaneously (while ensuring that execution behaves as though the operations were executed sequentially). In one suitable approach, operations may be executed even though it is not guaranteed that their results will be needed. This form of execution is called speculative execution, and may only be performed on operations whose changes can be undone.

Figure 14:
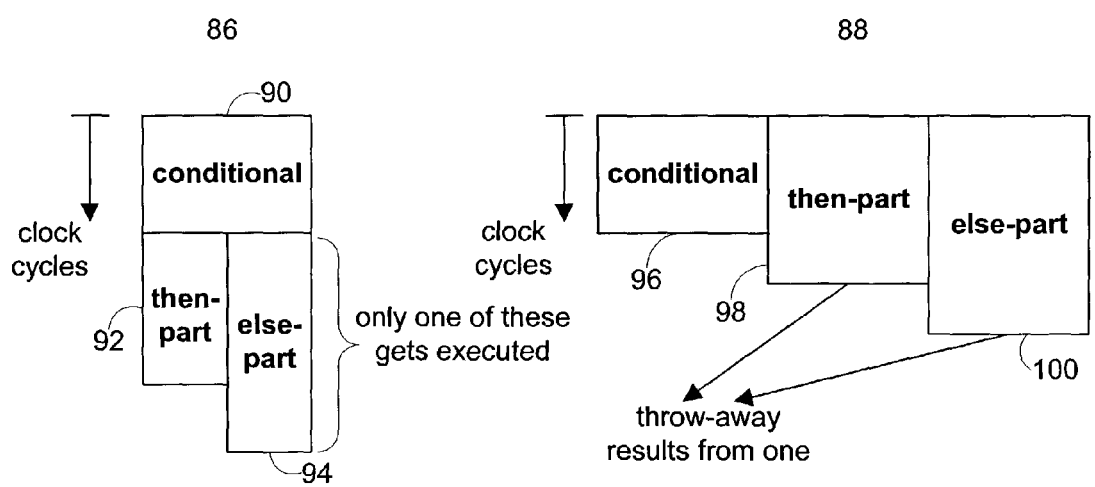
FIG. 14 shows how speculation may be carried out on an IF-THEN-ELSE construct in accordance with the present invention.

FIG. 14 shows how speculative execution can be used to reduce the latency of a conditional statement (e.g., IF-THEN-ELSE) where the condition takes several clock cycles to evaluate. In approach 86, after conditional 90 is evaluated, depending on the result of conditional 90, either a THEN-part 92 may be executed or an ELSE-part 94 may be executed. In approach 88, using speculative execution, conditional part 96, THEN-part 98, and ELSE-part 100 may be executed simultaneously. Depending on the result of conditional 96, the result of either THEN-part 98 or ELSE-part 100 is thrown away. As illustrated, the number of clock-cycles used for speculative execution is less than using sequential execution.

Figure 15:
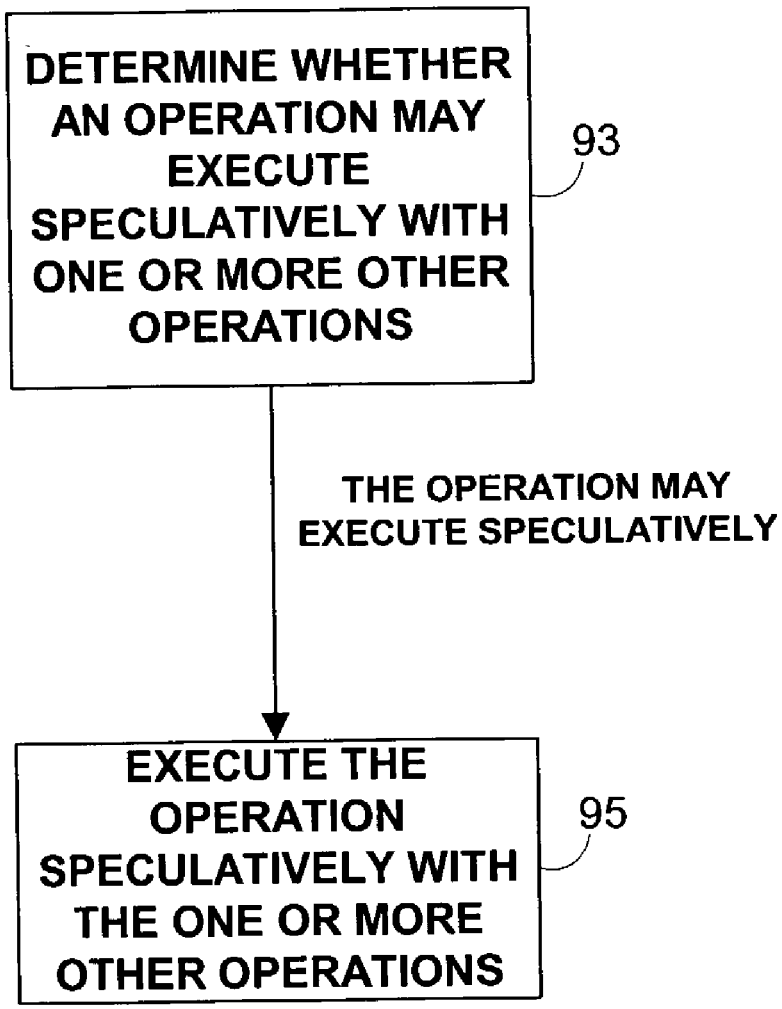
FIG. 15 is a flow chart of illustrative steps involved in executing an operation speculatively in accordance with the present invention.

FIG. 15 shows the general process for speculation performed by the hardware generated by the software-to-hardware compiler. At step 93, hardware generated by the software-to-hardware compiler determines whether a particular operation may execute speculatively with one or more other operations. If the operation may be executed speculatively, then, at step 95, the hardware executes that operation speculatively with the one or more other operations.

Hardware control flow is synthesized using a special set of control flow wires that are used to enable or disable operations within blocks. For a given operation, control flow may specify one of four states, outlined in the table below:

| Control flow | Description |
| --- | --- |
| 10 | Commit: Control flow is guaranteed to reach this operation |
| 01 | Cancel: Control flow is guaranteed not to reach this operation |
| 00 | Speculate: Control flow may nor may not reach this operation (allows speculation i.e., execution of non mutable operations) |
| 11 | Invalid state |

It will be understood that even though control flow is guaranteed to reach an operation, that operation may still have to wait for valid input variables.

Figure 16:
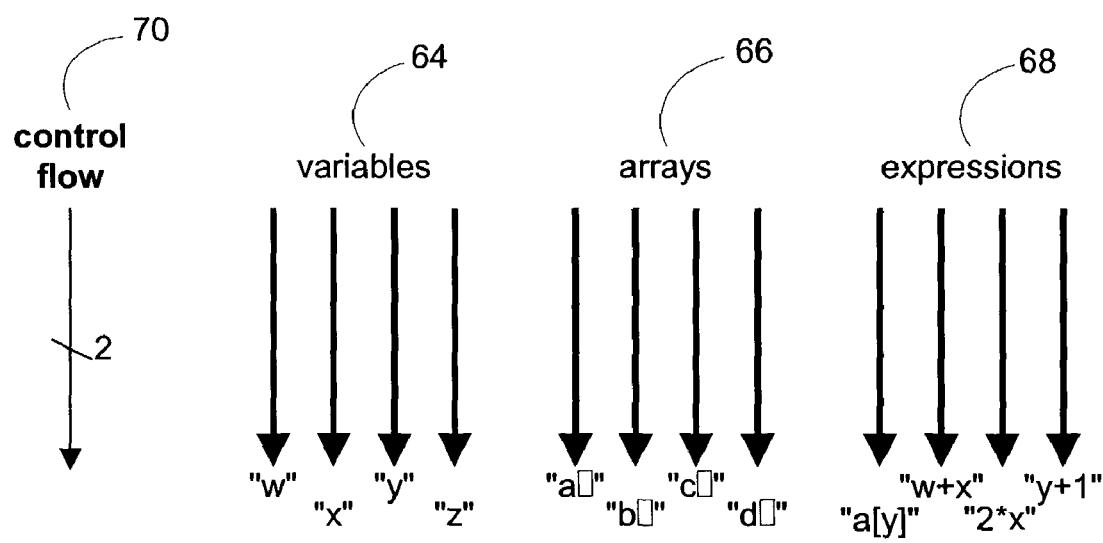
FIG. 16 is an illustrative environment in accordance with the present invention.

Environments include references to the current value of the control flow. FIG. 16 shows an illustrative environment 72. Environment 72 includes variable value wires 64, array values wires 66, expression value wires 68, and control flow wires 70.

The hardware may ensure that control flow maintains the following invariants: control values may only change from (00) to (10), or from (00) to (01) (i.e., control flow cannot change its mind and revoke a previous guarantee); all speculation must eventually end with a guarantee; and when control flow is cancelled, it does not matter whether the data is valid or not. This latter rule will enable further reductions in the size of the control logic needed.

Some operations may irreversibly affect the state of the hardware (e.g., a RAM write or a FIFO "push"). With few exceptions, these operations cannot be executed speculatively. Operations that can affect the state of the hardware are termed mutable operations.

Figure 17:
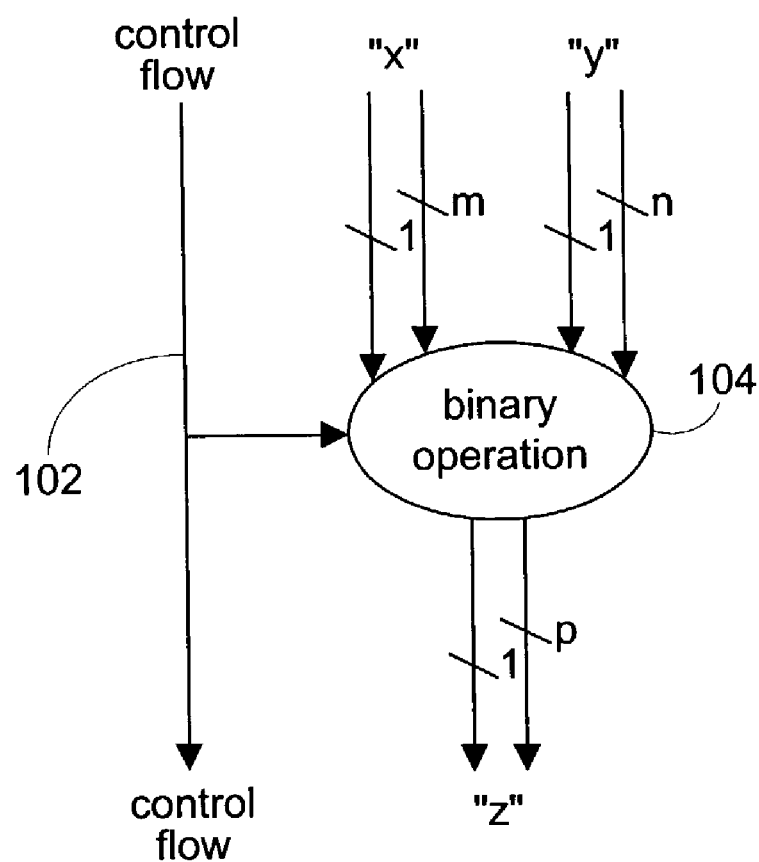
FIG. 17 shows the relationship between control flow and an operator in accordance with the present invention.

Under most circumstances, mutable operations may not be executed speculatively. Extra control logic may be added to ensure that mutable operations do not erroneously execute speculatively. The control flow signals specify when mutable operation is permitted, but consistent with the definition of an operation, no operation is able to change the control flow as shown in FIG. 17. Control flow 102 may be used by operation 104, but control flow 102 cannot by altered by operation 104.

Mutable operations should generally not execute more than once. In one suitable approach, extra control logic may be added to ensure this.

There may be times when a mutable operation may safely execute speculatively. For example, when it is known that the state being overwritten is not needed (e.g., when initializing an array), a mutable operation may execute speculatively. For purposes of brevity and clarity, the present invention is primarily described herein without taking these cases in account. It will be understood that these cases may be taken into account when implementing the present invention.

Figure 18:
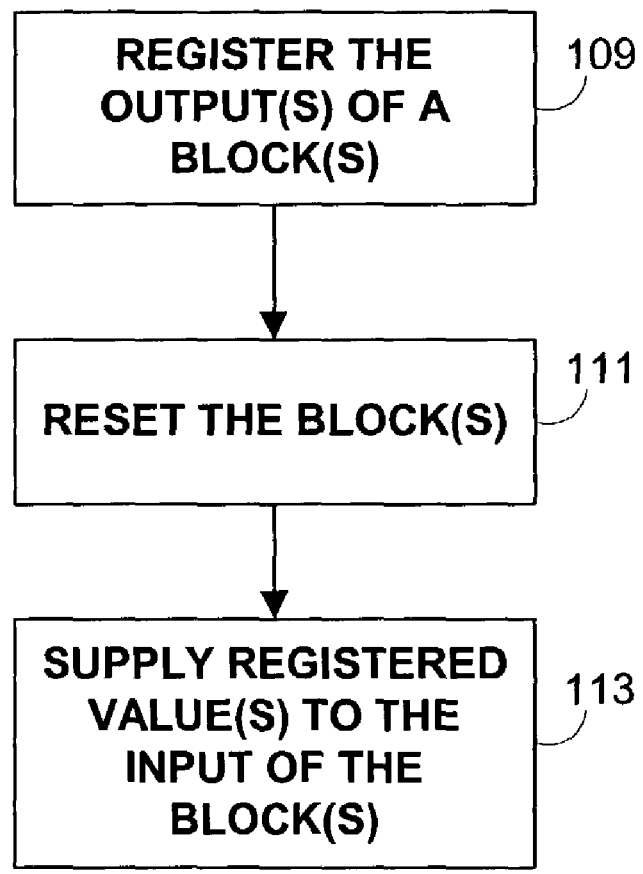
FIG. 18 is a flow chart of illustrative steps involved in coupling the input to a block or blocks to the output of that block or blocks in accordance with the present invention.

In one suitable arrangement, loops may require that the input and output of a block (or set of blocks) are coupled to one another. The software-to-hardware compiler may perform this coupling without generating an asynchronous loop. In one suitable approach, the outputs of a block may be registered, the block may be reset, and the registered values may then be supplied to the input of the block. This approach may be used in any circumstance where the input and output of a block (or set of blocks) are coupled to one another. FIG. 18 illustrates the process. At step 109, one or more outputs of one or more blocks are registered. At step 111, the block or blocks are reset. At step 113, the registered values are supplied to the input of the one or more blocks.

Because the inputs and outputs of a block have different environments, they, themselves, may be different. Thus, the different environments may be merged in accordance with the present invention, and this is done by augmenting the output environment by computing the additional sub-expressions needed by the input environment.

The software-to-hardware compiler generates every block with a reset input that is used to reset all the states within that block at the next clock edge. After a block is reset, all values of variables within that block return to their uncomputed state, and all control flow signals are reset. In one suitable approach, reset should only be used when all the operations within the block have executed.

As described thus far, the software-to-hardware compiler of the present invention synthesizes a unique hardware equivalent for every operation in the software source language. In one suitable approach, common sub-expressions may be implemented using the same hardware resources in a way that is transparent to users.

In another suitable approach, the software-to-hardware compiler may provide users with the ability to explicitly specify that a block of hardware should be reused. One way in which this may be accomplished, while maintaining transparency, is through the use of functions.

Figure 19:
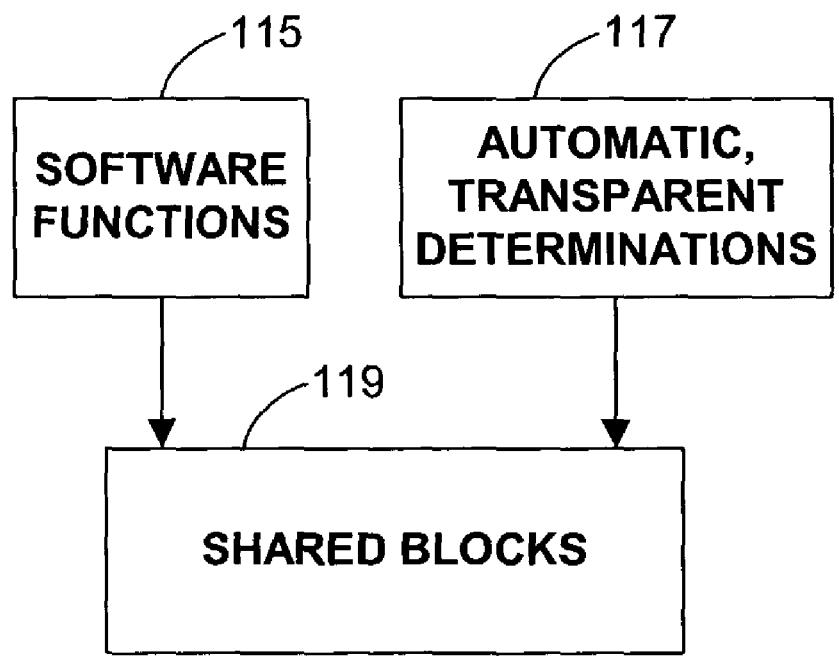
FIG. 19 is a diagram illustrating how shared blocks may be defined in accordance with the present invention.

These two approaches are illustrated in FIG. 19. Software functions 115 that are explicitly defined by the author of a software program may be regarded by the software-to-hardware compiler as a shared block 119. Shared blocks 119 may also be defined by the software-to-hardware compiler using automatic, transparent determinations 117 that may be based on, for example, an optimization analysis. Approaches 115 and 117 may be used independently or in combination with one another.

Every location within a context that requires the use of a shared block will be termed a "usage instance." As used herein, a "context" is the present carpeting of computed data and control guarantees. Data that is between a context and not being computed (i.e., in the process of being computed) is referred to herein as an "execution frontier." Every usage instance can only use a shared block once per context. However, different usage instances may require the same shared operation to be reused within the same context.

This form of sharing may be made possible by adding latched outputs and resetting the shared block (i.e., making the shared block ready for use by another instance).

Figure 20:
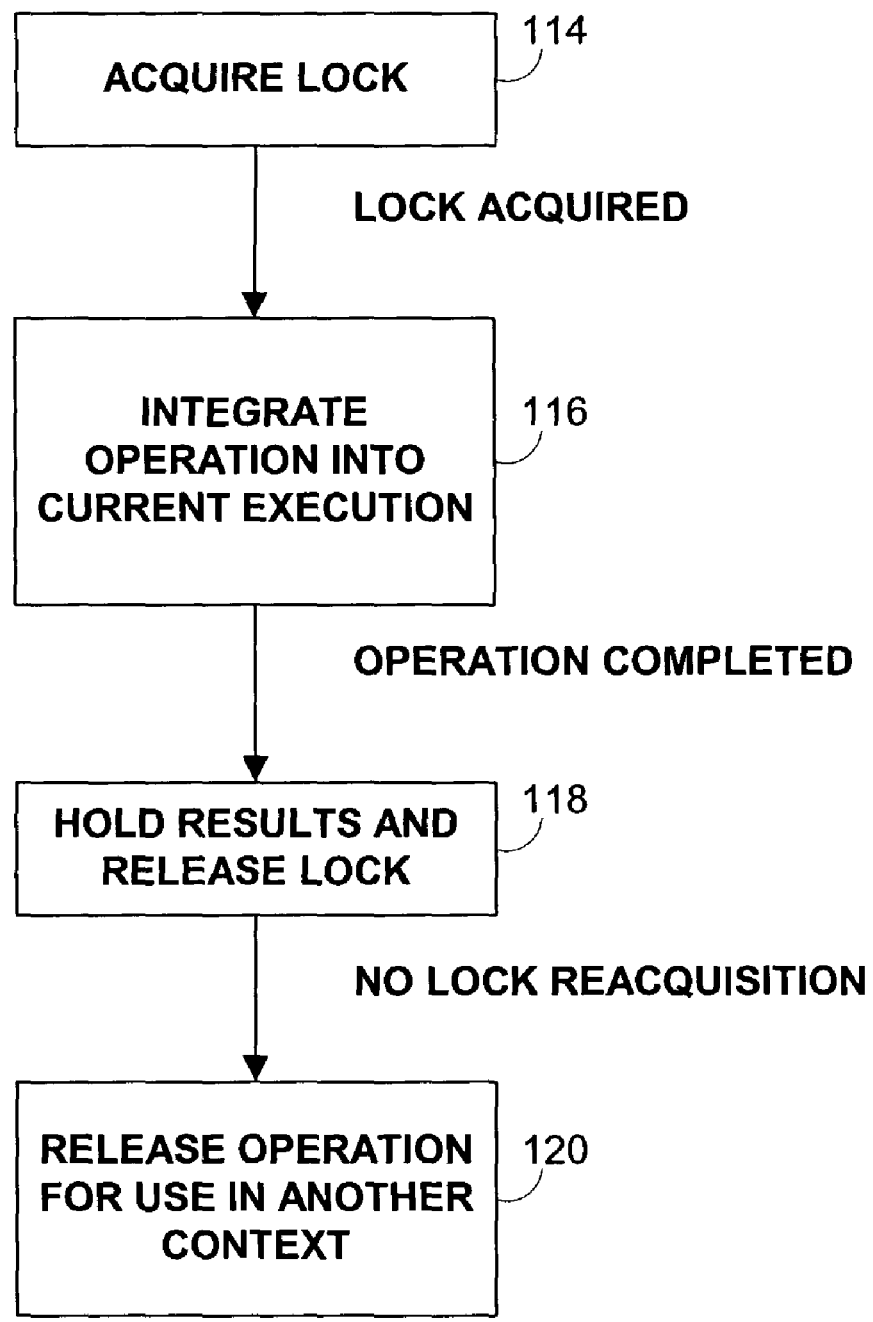
FIG. 20 is a flow chart of illustrative steps involved in sharing a resource in the same context in accordance with the present invention.

FIG. 20 shows how a resource can be shared in the same context. At step 114, an exclusive lock on the operation is acquired. In the case of multiple simultaneous requests, an arbitrator may determine who acquires the lock. At step 116, the shared operation's context is then integrated into the current context at the appropriate point. Once execution of the operation has completed, then at step 118, the results are held (on a per usage instance basis), so that the shared operation, as well as the usage instance's lock, can be released. Once a usage instance's lock is released at step 120, it cannot be used further within the same context (i.e., until a context reset).

Figure 21:
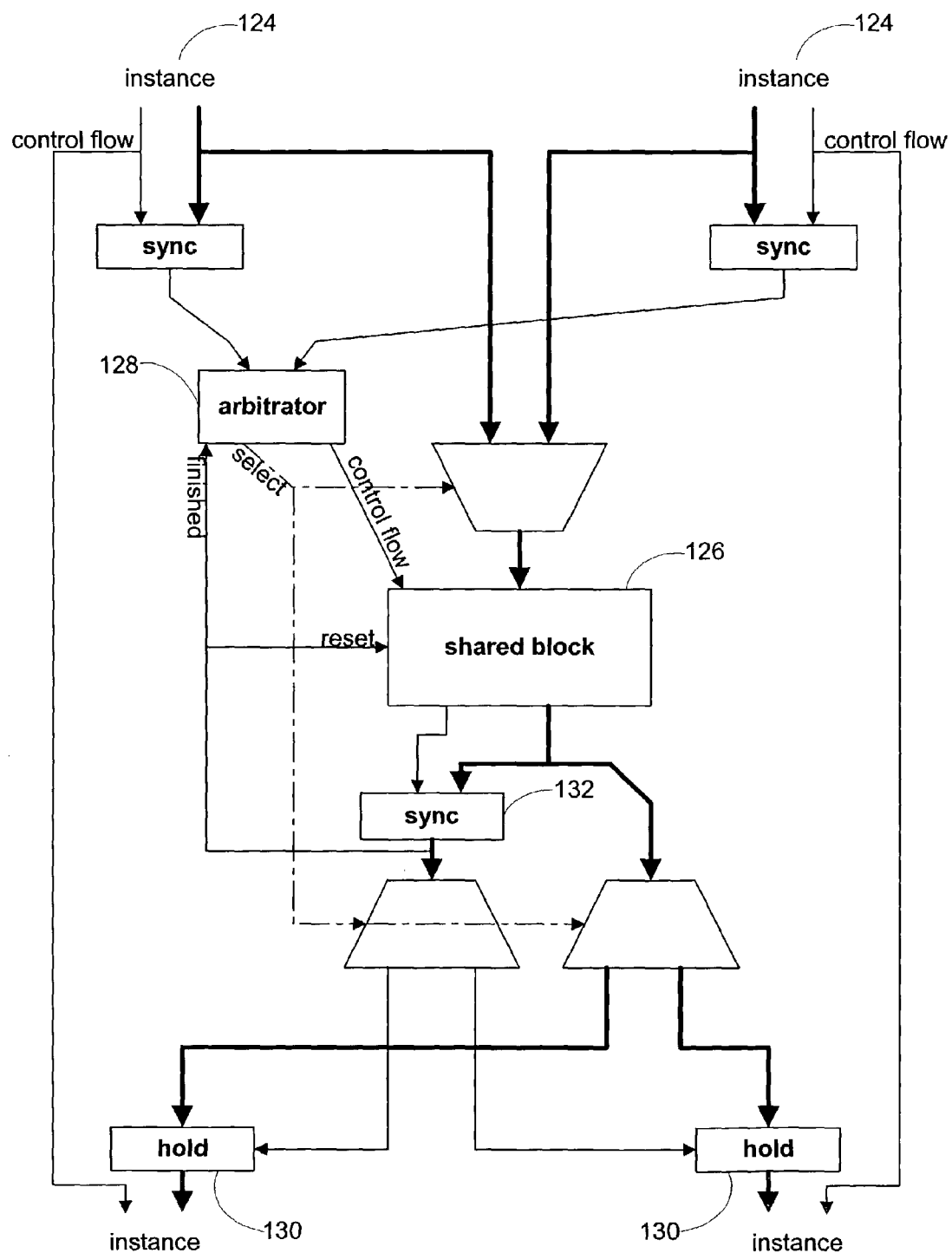
FIG. 21 is a schematic diagram illustrating how sharing may be implemented in accordance with the present invention.

FIG. 21 is a circuit that illustrates how sharing may be implemented in accordance with the present invention. Every calling instance 124 can only request shared block 126 when all the variables needed are valid, and the control flow state is "commit".

To account for the simultaneous usage requests that is inherent with parallelism and speculation, arbitrator 128 may be used. Arbitrator 128 decides which instance 124 should be granted exclusive use of shared block 126. Once shared block 126 has finished (i.e., when all the output variables are valid, and the control flow is in its commit state), the output environment is latched in the appropriate hold blocks (e.g., hold blocks 130). Arbitrator 128 then resets shared block 126. Thus, shared block 126 is then ready for use by the next instance. Arbitrator 128 notes which instances 124 have already be granted access, and prevents them from accessing shared block 126 again.

If there are no "jumps" or exceptions from within a block, shared block 126 is guaranteed to finish once started. Hence, control flow from each instance 124 may be passed directly through to holding block 130.

Some variables may remain invariant within a block (i.e., they do not change). These invariant variables may be passed directly to holding block 130, and arbitrator 128 does not need to wait for these variables to become valid before allocating shared block 126.

There are some circumstances when a shared block can be allocated to a speculative instance. In general, there is a danger of deadlock occurring. However, in the case of blocks that do not contain any mutable operations, deadlock may be guaranteed not to occur.

Figure 22:
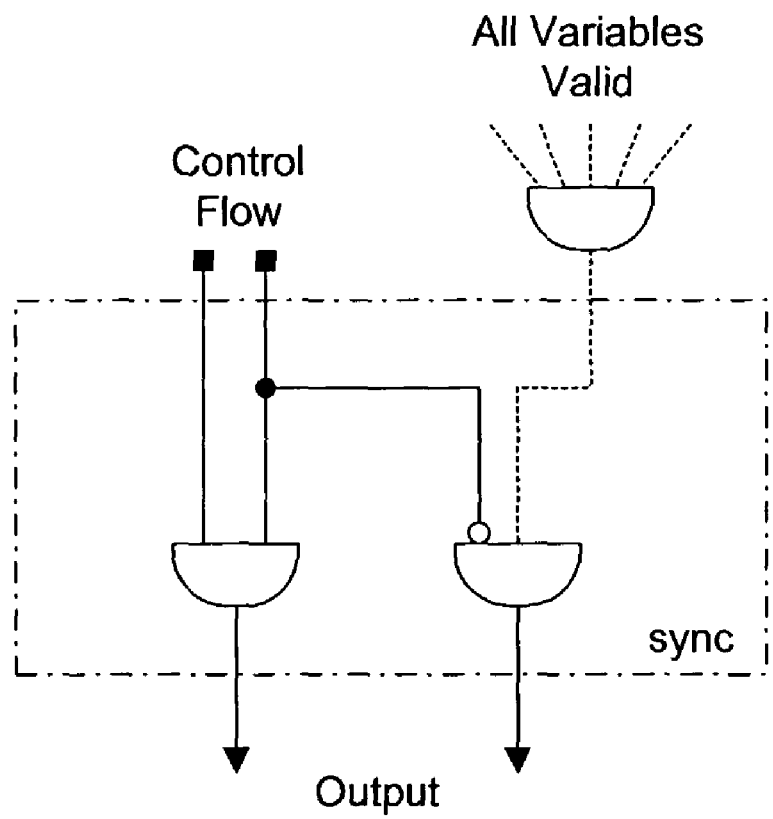
FIG. 22 is a schematic diagram of an illustrative sync block in accordance with the present invention.

Sync block 132 waits for all variables in an instance's environment to become computed (i.e., valid). Sync block 132 may be implemented as illustrated in FIG. 22 with the accompanying specification as follows:

| | Sync | |
|---|---|---|
| Control flow | All variables | Output |
| Commit | Undefined | NotReady |
| Commit | Defined (X) | CommitDone |
| Cancel | Undefined | NotReady |
| Cancel | Defined (X) | NotReady |
| Speculate | Undefined | NotReady |
| Speculate | Defined (X) | SpeculateDone |

Hold blocks 130 register the shared resources output variables when hold blocks 130 receive a SpeculateDone or CommitDone signal.

Usage instances may request a shared operation when one of two particular conditions are met. First, when the instance's environment's control flow is committed, and all the data needed is available. Second, if no instances satisfy the first condition, then speculative resource sharing is permitted, provided that all the data needed is available, and the shared operation is guaranteed not to stall.

Both of these conditions are necessary to ensure that deadlock does not occur. Deadlock may occur if a shared operation is locked into an instance that is waiting for a valid value for one of the variables, but the variable is dependent on the result of a different usage instance that is waiting (in vain) for the resource to become available.

Figure 23:
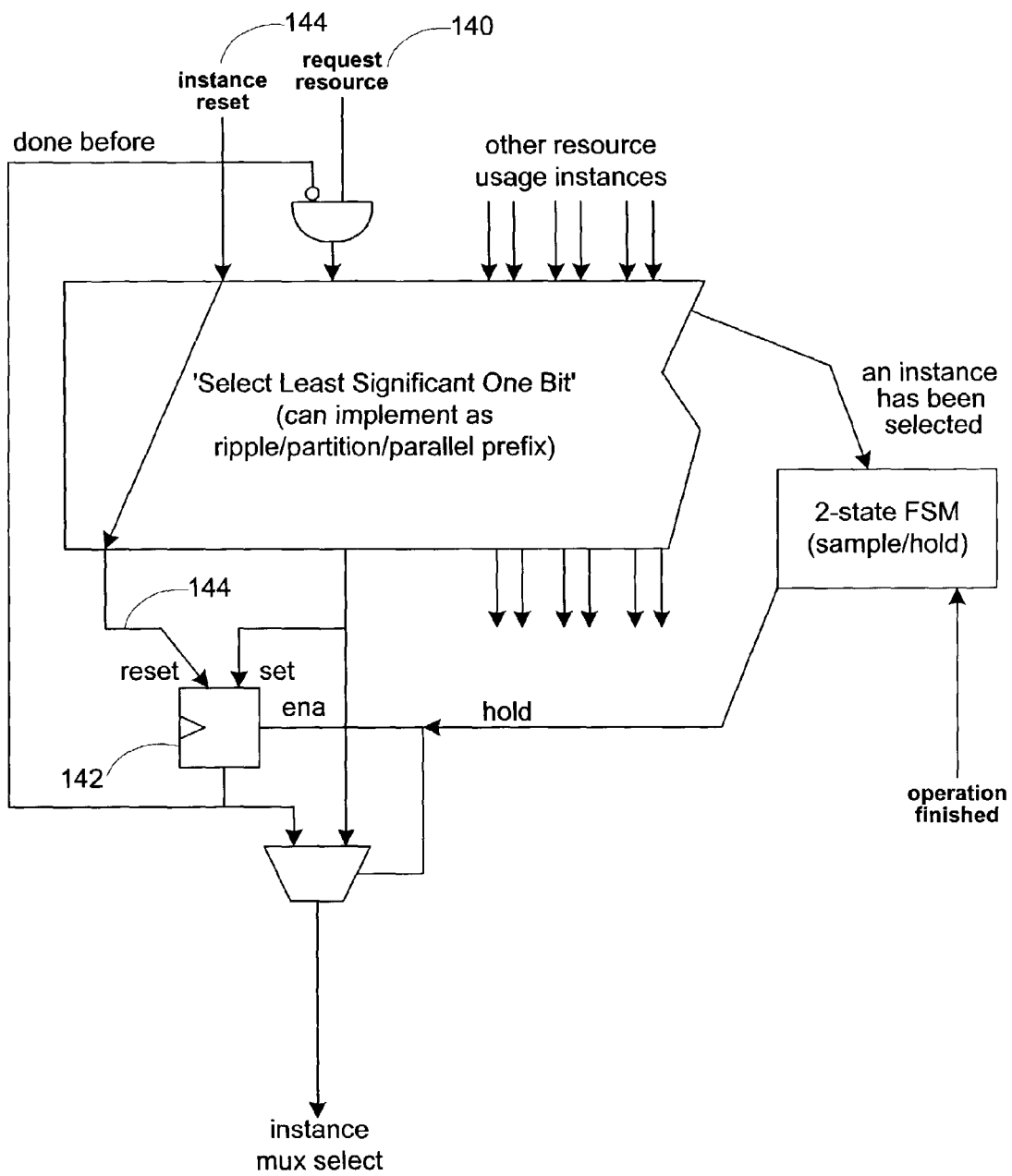
FIG. 23 is a schematic diagram of an illustrative arbitration scheme in accordance with the present invention.

FIG. 23 is a circuit that illustrates how an arbitration scheme may be implemented in accordance with the present invention. The arbitration scheme chooses left-most resource request 140 to be granted exclusive use of the shared resource. Every instance has an associated latch 142 that remembers whether that instance has ever been granted. Latch 142 is considered to be part of the usage instance's context, and hence the usage instance's reset signal 144 is able to reset it. A shared operation cannot be reset mid-execution, and therefore the usage instances' reset signals never need to propagate to the shared block.

FIG. 23 assumes that all usage instances have the potential to request the shared resource simultaneously. In practice, this will not be the case because data dependencies may result in two usage instances not being able to request the same resource simultaneously. In these cases, arbitration has the potential to be simplified. For example, usage instances that are guaranteed not to conflict may be ORed together.

The software-to-hardware compiler of the present invention may provide support for arrays. In one suitable approach, arrays may be implemented as a set of variables. Although this allows multiple read and write accesses per clock cycle, this may sometimes consume too many hardware resources. In this case, the software-to-hardware compiler may determine that it is more appropriate to implement an array using on-chip or off-chip RAM. RAM-based arrays are state-based, and can only be accessed in word-sized chunks. That is, extra circuitry may be needed to read and write to the arrays, and some mechanism is needed for ordering reads and writes.

All reads and writes to the same RAM preferably are ultimately arbitrated, treating the RAM as a shared resource.

The sequence of write operations affecting a RAM may be important and is often preferably preserved. Between write operations, read operations may occur in any order. However, arrays that use different regions of a RAM do not need their reads and writes ordered with respect to each other.

Figure 24:
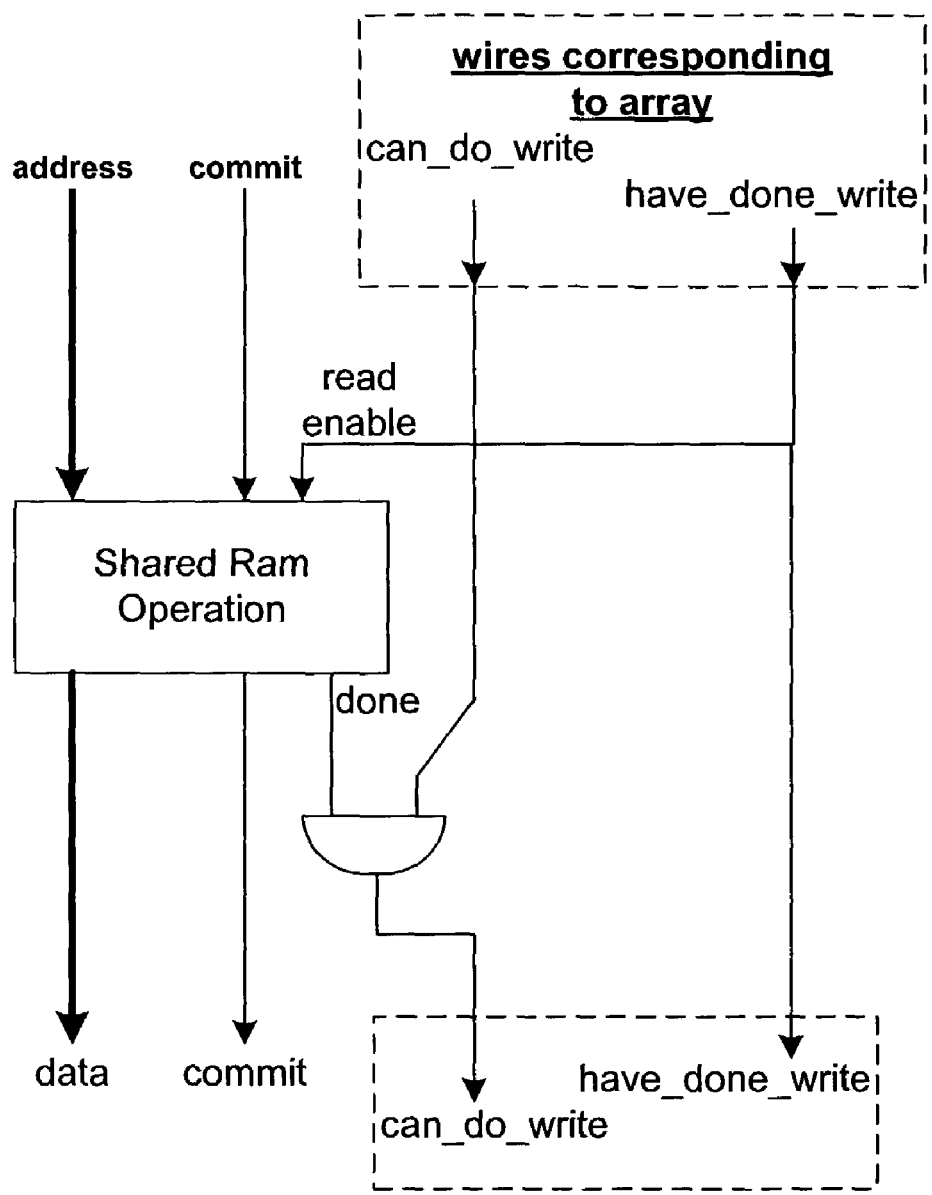
FIG. 24 is a schematic diagram illustrating how an array may be read in accordance with the present invention.
Figure 25:
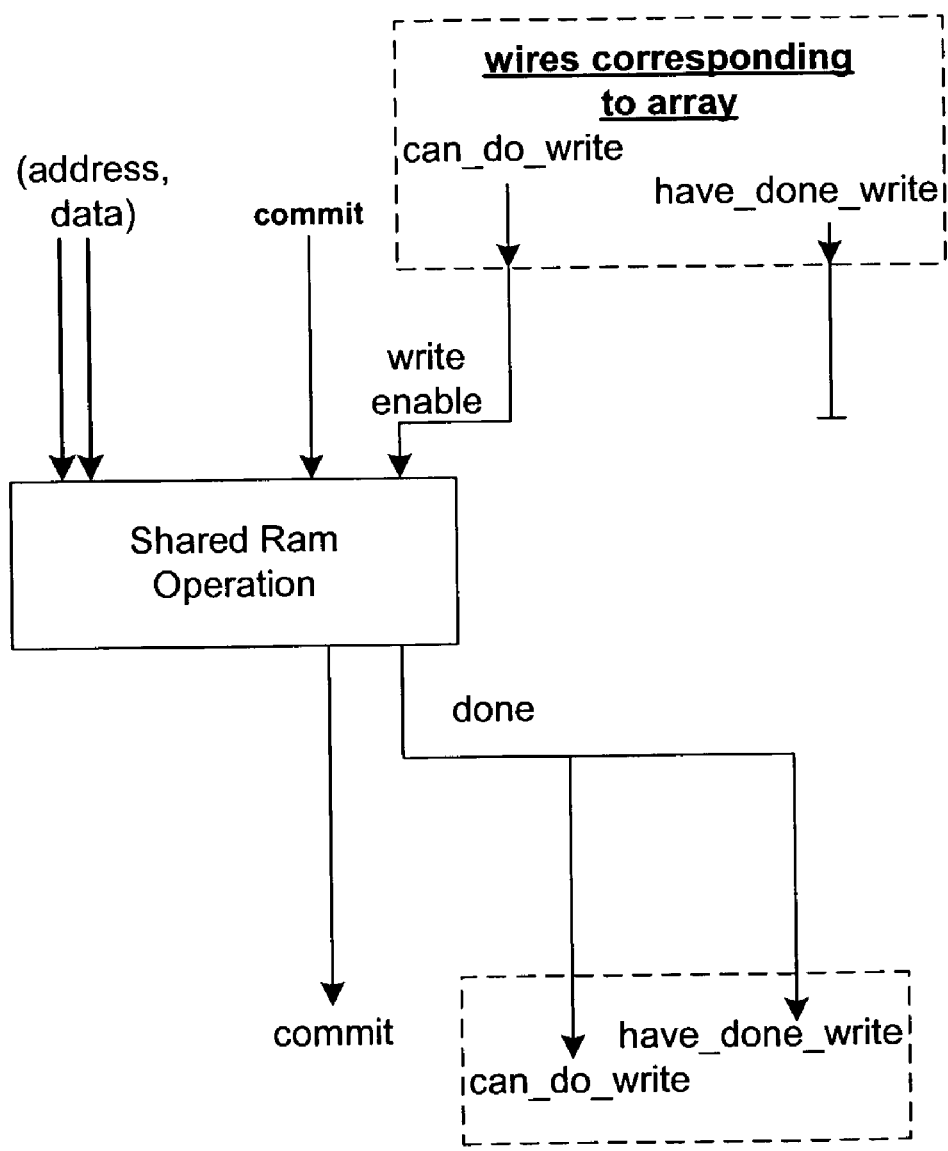
FIG. 25 is a schematic diagram illustrating how an array may be written to in accordance with the present invention.

This read and write operation ordering may be maintained by per-array token passing. One suitable embodiment of the present invention is to use the following additional wires for each array: Have_Done_Write, and Can_Do_Write. Have_Done_Write will indicate whether a write operation has to be performed (i.e., it is safe to do an intermediary read operation). The Can_Do_Write wire will indicate whether all intermediary read operations have completed, and that it is therefore safe to do a write operation. FIGS. 24 and 25 illustrate the use of these wires in arbitrating a read and write operation, respectively.

A sequence of reads and writes to a RAM-based resource are coupled such that the output wires of a read and write are coupled to the next read or write of the next operation. Before any reads or writes, Can_Do_Write or Have_Done_Write are set to "1." As shown in FIG. 25, a write operation may not only wait for address and data values to be valid, and the control flow to be in the commit state, but also for the write enable wire to be "1." As can be seen in FIGS. 24 and 25 the write enable is only "1" when the previous write operation has completed, and all read operation since that previous write have completed. The Have_Done_Write signal is used to enable all reads between two writes.

The techniques described above are not limited to arrays and RAM accesses. It will be understood that any shared resource may be represented in this way. In general, a "write" operation may be defined as any operation that can affect the state of the resource (i.e., a mutable operation). A "read" operation may be defined as any operation that does not affect the state of the resource (i.e., a constant, or immutable operation).

In general, functions and operations may be executed in any order provided that the data needed by each function and operation is valid. However, there are instances when this will not result in the desired behavior. For example, file reads and writes need to preserve their ordering. In the case of files, the file is an example of a shared resource, and functions that operate on files are preferably annotated by the user to show that a shared resource is involved.

The software-to-hardware compiler of the present invention may support pointers. Pointers have the ability to read and write to one of a number of variables, arrays, or both.

For many software languages, it is possible to identify the subset of variables, arrays, or both to which a pointer can point to at any one time. All other variables or arrays are unaffected by writes through that pointer.

Figure 26:
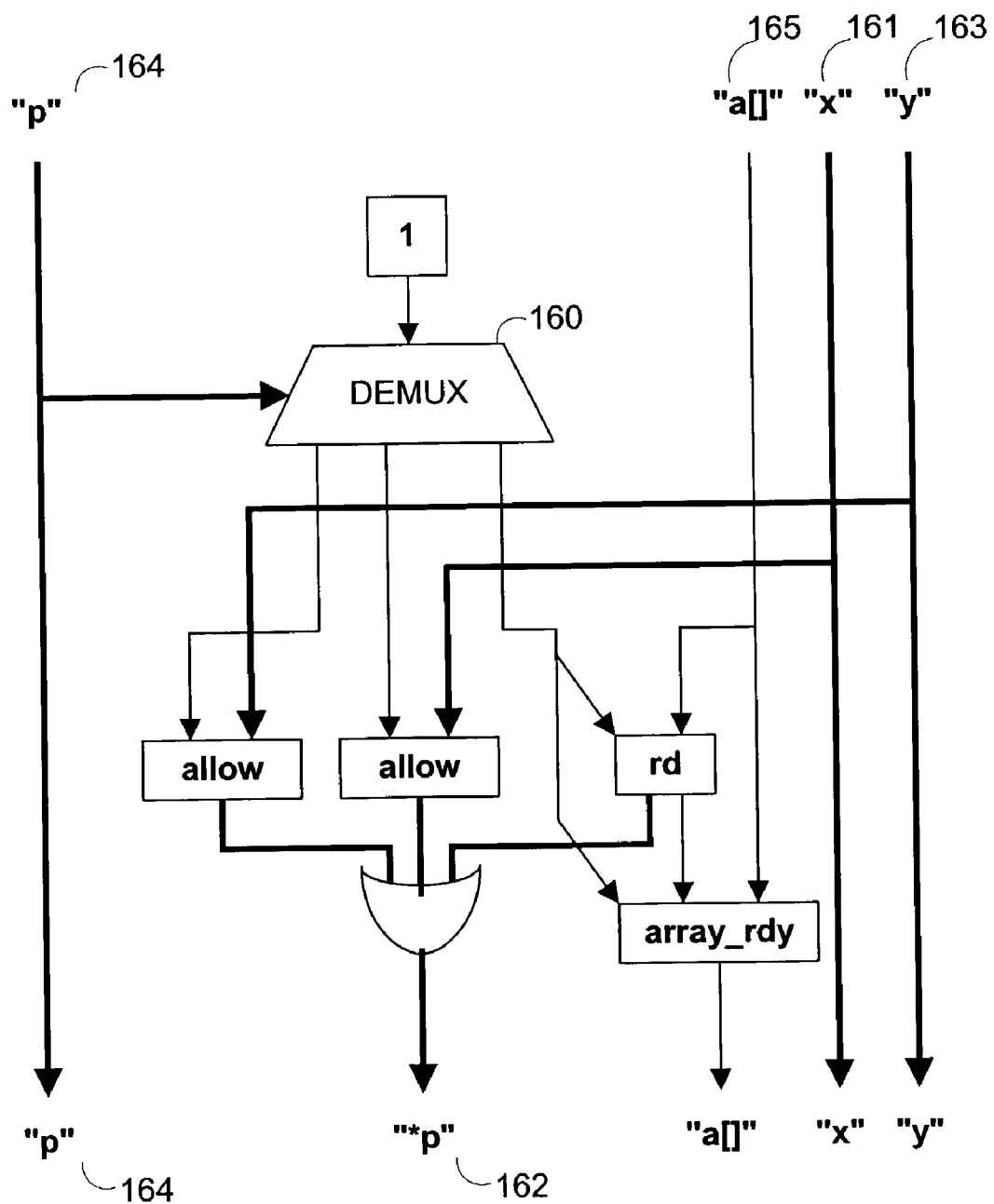
FIG. 26 is a schematic diagram illustrating how an indirect pointer read may be implemented in accordance with the present invention.

FIG. 26 shows how an indirect pointer read may be implemented in accordance with the present invention. In this example, the software-to-hardware compiler has determined that pointer variable (p) 164 can only point to one of three things: a variable (x) 161, a variable (y) 163, or an element in an array (a[ ]) 165. Demultiplexer 160 decodes which object the pointer is currently pointing to, such that value (*p) 162 may be computed. Until pointer variable (p)

164 is computed, value (*p) 162 remains uncomputed. Any array that may be referenced by variable (p) 164 may wait for variable (p) 164 to become computed, even if value (*p) 162 does not end up reading from this array. This ensures that no array writes occur before the array is potentially read. Apart from arrays, all other variables are unaffected by indirect pointer reads.

Figure 27:
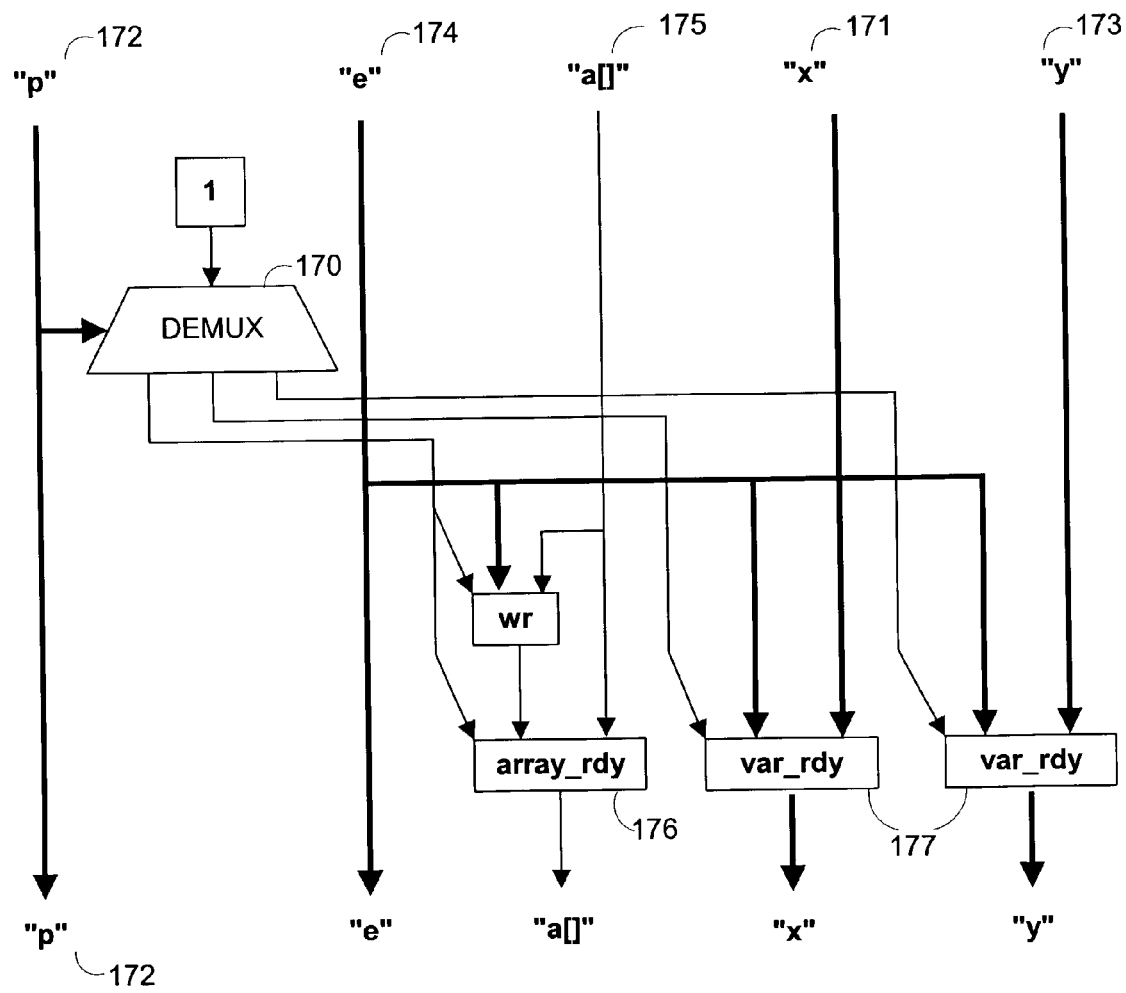
FIG. 27 is a schematic diagram illustrating how an indirect pointer write may be implemented in accordance with the present invention.
Figure 28:
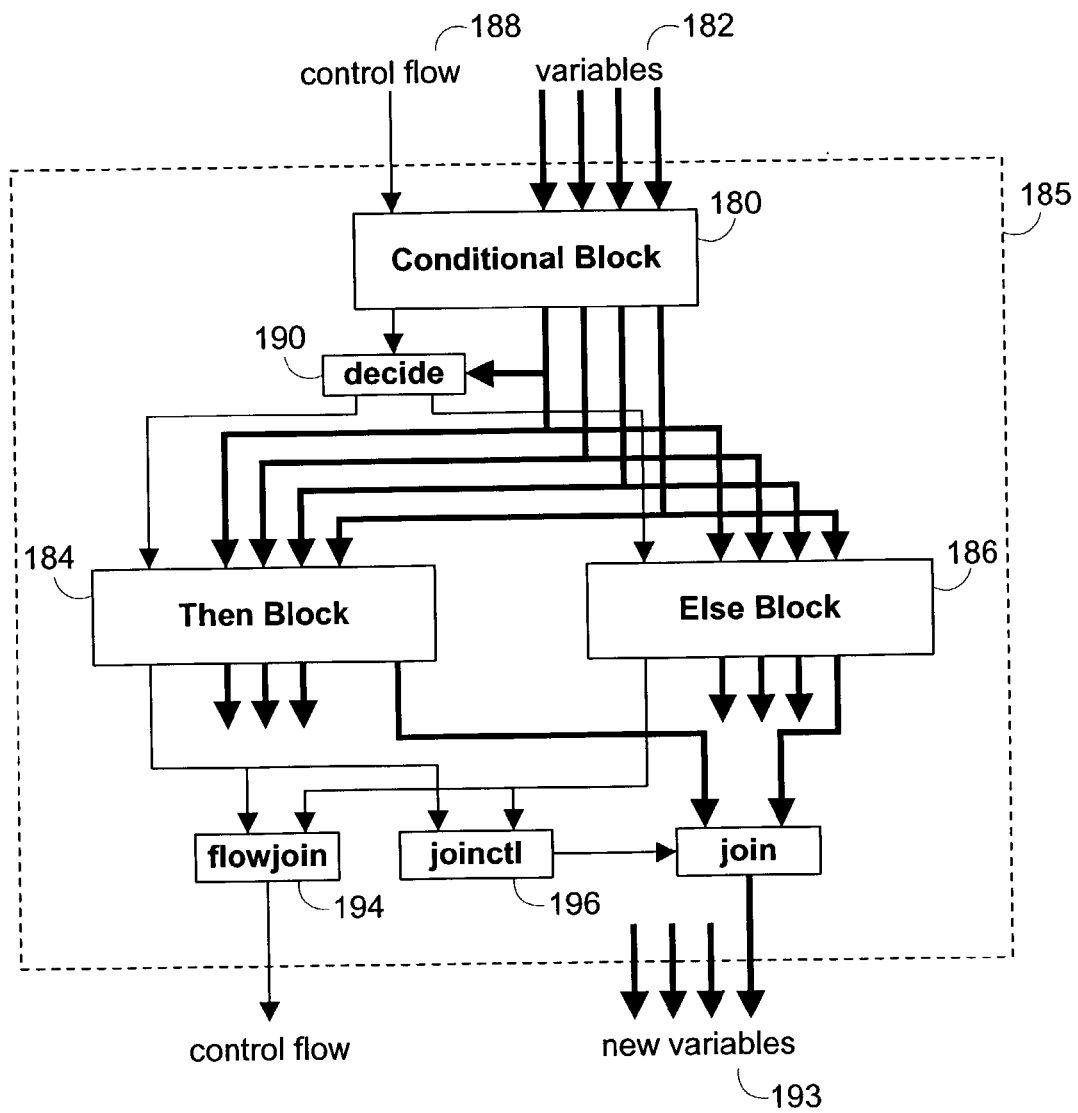
FIG. 28 is a schematic diagram of an illustrative IF-THEN-ELSE hardware construct in accordance with the present invention.

FIG. 27 shows how an indirect pointer write may be implemented. In this example, the software-to-hardware compiler has determined that variable (p) 172 can only point to one of three things: a variable (x) 171, a variable (y) 173, or an element in an array (a[ ]) 175. Variable (e) 174 is intended to be written to the variable or array pointed to by pointer variable (p) 172. Pointer variable (p) 172 is demultiplexed by demultiplexer 170 so that the correct object can be updated. None of the candidate variables or arrays are deemed computed until the pointer value is itself computed, and this is ensured by array_rdy block 176 and var_rdy blocks 177.

The software-to-hardware compiler of the present invention may be used to implement conditional statements in hardware. For example, FIG. 21 shows how an IF statement may be synthesized in hardware in accordance with the present invention.

Conditional block 180 is used to evaluate a conditional expression to determine whether THEN block 184 or ELSE block 186 is executed. Conditional block 180 may also update variables—a common feature in some programming languages (e.g. C, C++). "Decide" block 190 passes control flow to THEN block 184 or ELSE block 186. THEN and ELSE blocks 184 and 186 both have access to the value of all variables in the current environment, but may change these values in different ways (e.g. THEN block 184 may add one to a variable, whereas ELSE block may multiply another variable by five). The output of THEN and ELSE blocks 184 and 186 is the value of all the variables in the environments resulting from executing each. The output of IF-THEN-ELSE block 185 has a single value for each variable. Thus, "join" block 192 establishes which value is appropriate. This is done by determining which of blocks 184 and 186 was executed.

Speculation allows conditional block 180, THEN block 186, and ELSE block 184 to execute simultaneously, provided that the value of variables needed in each are computed. Flowjoin, joinctl, and join blocks 194, 196, and 192, respectively, determine the final values of variables 193 in the environment at the end of IF-THEN-ELSE block 185.

Figure 29:
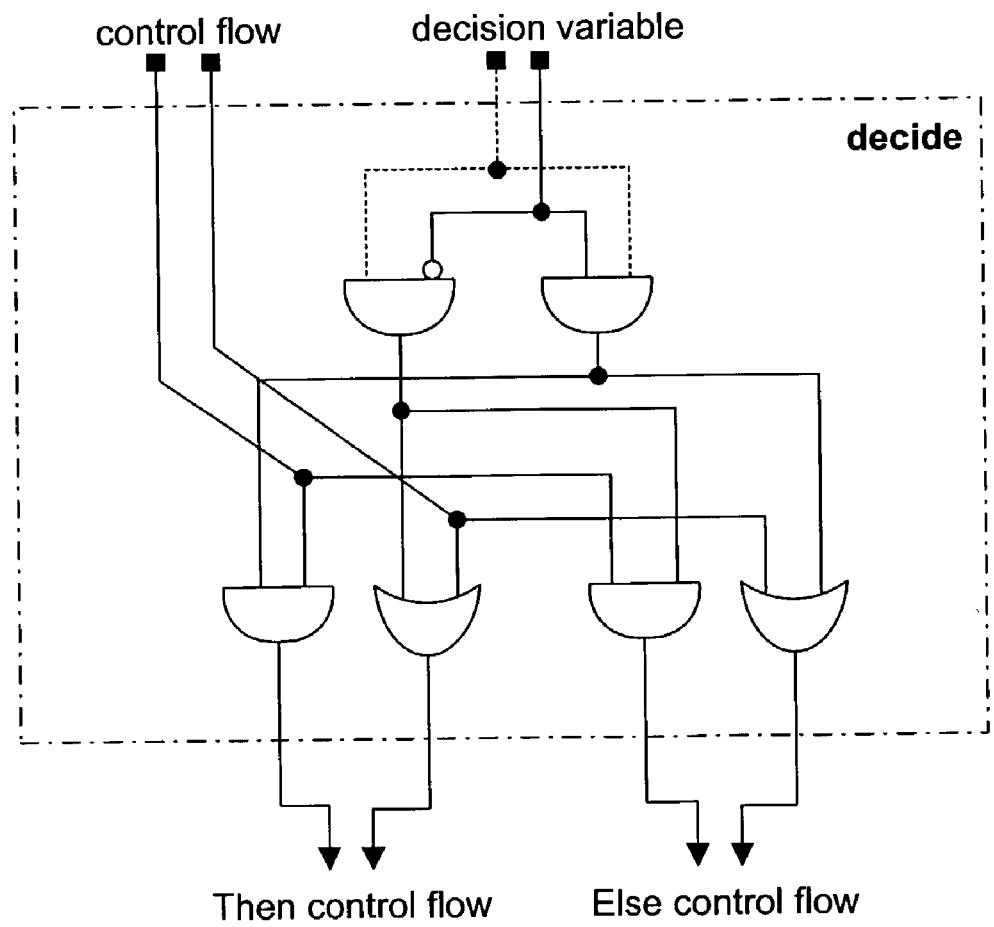
FIG. 29 is a schematic diagram of an illustrative decide block in accordance with the present invention.

If a variable is unchanged by conditional block 180, THEN block 186, and ELSE block 184, then there will be a direct path from the value of the variable at the input and outputs of IF-THEN-ELSE block 185. If the value of such a variable is computed at the input of IF-THEN-ELSE block 185, then it is computed at the output. This may allow the next block in the program to begin execution provided that the values of variables needed are computed. The specification for decide block 190 is outlined in the following table, and an illustrative implementation for decide block 190, in accordance with the specification, is shown in FIG. 29. It will be understood that the hardware shown in FIG. 29 is merely illustrative and that any other suitable implementation may be used. It will further be understood that the hardware shown in FIG. 29 relies on the "speculate," "commit," and "cancel" encoding previously defined.

| DECIDE | | | |
|---|---|---|---|
| Control flow | Decision variable | Then-Control flow | Else-Control flow |
| Commit | Undefined | Speculate | Speculate |
| Commit | True | Commit | Cancel |
| Commit | False | Cancel | Commit |
| Cancel | Don't Care | Cancel | Cancel |
| Speculate | Undefined | Speculate | Speculate |
| Speculate | True | Speculate | Cancel |
| Speculate | False | Cancel | Speculate |

Figure 30:
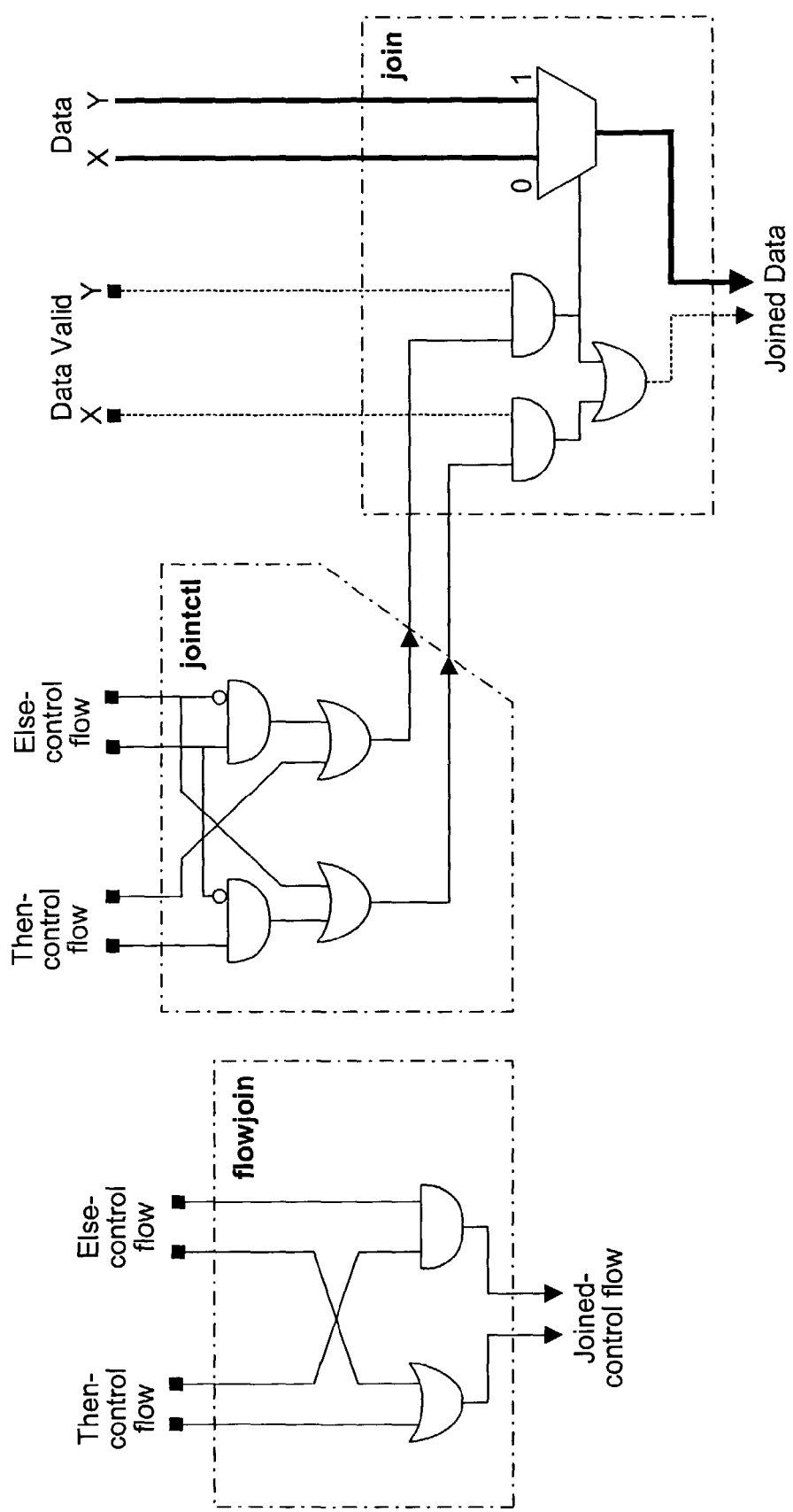
FIG. 30 are schematic diagrams of illustrative join, flow-join, and joinctl blocks in accordance with the present invention.

The specification for join block 192 and flowjoin block 194 is outlined in the following table, and illustrative implementations for join block 192, flowjoin block 194, and joinctl block 196 are shown in FIG. 30. It will be understood that the hardware shown in FIG. 30 is merely illustrative and that any other suitable implementation may be used. It will further be understood that the hardware shown in FIG. 30 relies on the "speculate," "commit," and "cancel" encoding previously defined.

| FLOWJOIN AND JOIN | | | | | |
|---|---|---|---|---|---|
| Then-Control flow | Then-Data | Else-Control flow | Else-Data | Joined-Control flow | Joined-Data |
| Commit | Undefined | Don't Care | Don't Care | Commit | Undefined |
| Commit | Defined(X) | Don't Care | Don't Care | Commit | Defined (X) |
| Cancel | Don't Care | Cancel | Don't Care | Cancel | Don't Care |
| Cancel | Don't Care | Speculate | Undefined | Speculate | Undefined |
| Don't Care | Don't Care | Commit | Defined (Y) | Commit | Defined (Y) |
| Cancel | Don't Care | Speculate | Defined (Y) | Speculate | Defined (Y) |
| Don't Care | Don't Care | Commit | Undefined | Commit | Undefined |
| Speculate | Undefined | Cancel | Don't Care | Speculate | Undefined |
| Speculate | Defined(X) | Cancel | Don't Care | Speculate | Defined (X) |
| Speculate | Don't Care | Speculate | Don't Care | Speculate | Undefined |

The software-to-hardware compiler of the present invention may be designed to cope with speculation that enables the execution of two or more loops in parallel under certain circumstances. Because speculation beyond a loop may be hampered by a context reset, a more speculation friendly approach may be adopted in which only the loop body is reset.

When the loop exits, the resulting environment is used to initiate the next instruction. Any speculation that occurs before the loop exit should result in values that will exist in the final environment (i.e., not the intermediary values from the loop).

In one suitable approach, the software-to-hardware compiler recognizes what variables are loop-invariant, or value-predictable from the outset of the loop. Hardware is then generated based on these findings. For example, if an input of a block does not change value throughout the operations executed in that block, then the value of the output is computed at the input. In such a case, the software-tohardware compiler may optimize the hardware by allowing loops to execute in parallel assured that variables will not be erroneously overwritten. In the case of conditionals, a join may be avoided (i.e., after having speculatively executed an ELSE-part and a THEN-part) because the variable remained unchanged.

Figure 31:
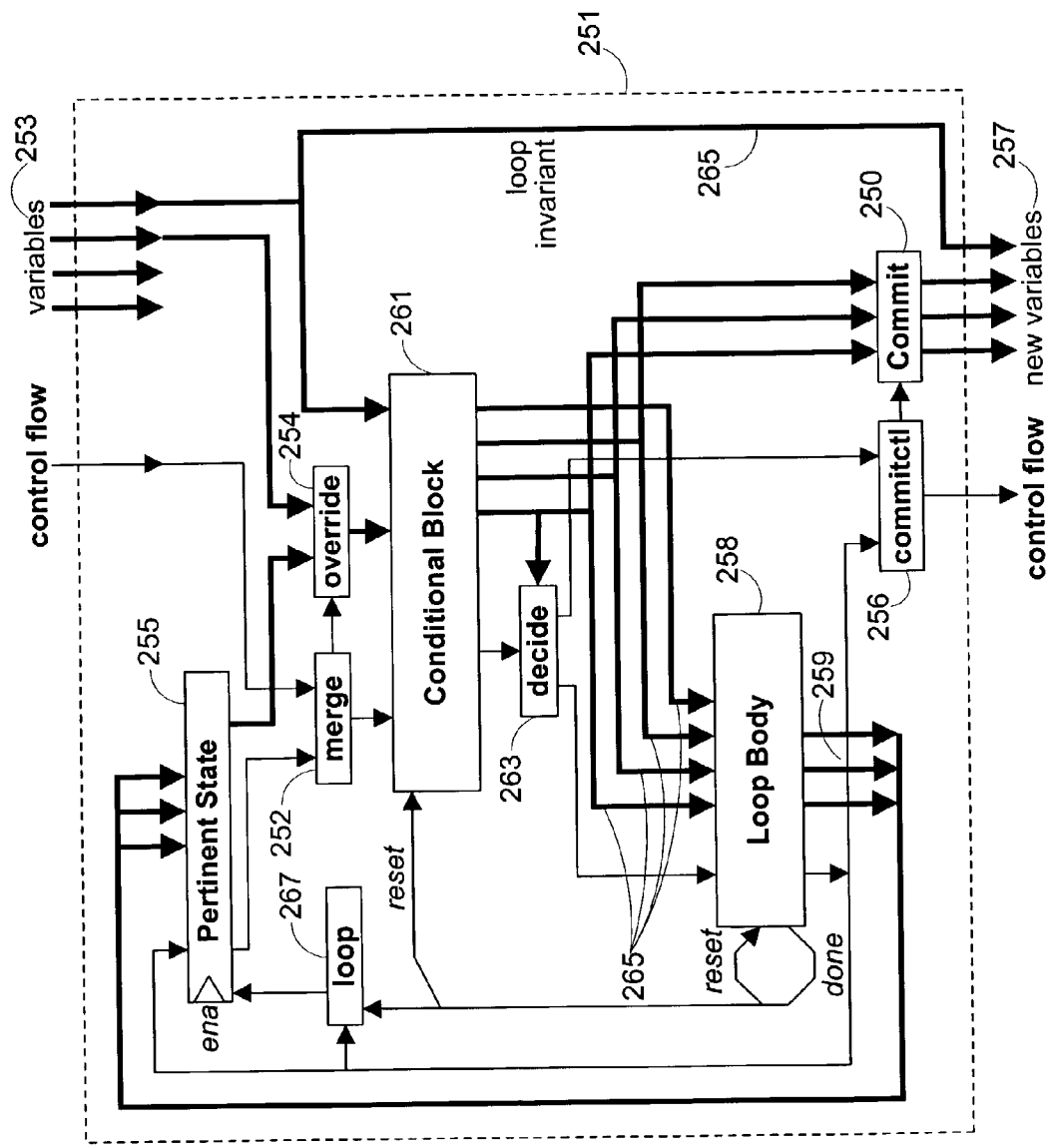
FIG. 31 is a schematic diagram of an illustrative loop mapped into hardware in accordance with the present invention.

FIG. 31 shows how the software-to-hardware compiler may construct hardware that behaves as a WHILE loop. A WHILE loop that does not include jumps has only one entry and one exit point. WHILE loop 251 takes as input, the values of variables 253 from the current environment, and outputs the values of variables 257 in the new environment.

The body of WHILE loop 251 is a single block 258. The values of variables 253 at the input to block 251 are derived from one of two sources. If this is the first iteration of WHILE loop 251, then the values are derived from the values of variables 253 at the input to the WHILE loop. Otherwise, these values are derived from pertinent state 255. Override block 254 performs this selection. Pertinent state 255 holds the values of variables 259 from the previous iteration of the WHILE loop 251. Thus, the values of variables 259 at the output of loop body block 258 are used to update pertinent state 255. When pertinent state 255 is assigned, conditional block 261, and loop-body block 258 are reset such that the next iteration of values may be computed.

In one suitable arrangement, the hardware responsible for executing the body of a WHILE loop is shared between the iterations of the WHILE loop. Consequently, a fixed amount of hardware may be used to perform an unlimited number of iterations. The software-to-hardware compiler may also determine that loop-unrolling or similar static optimizations yield a better performance in terms of hardware-area or speed. These optimizations may be implemented in the hardware generated by the compiler.

When the conditional expression in WHILE loop 251 evaluates to false, conditional block 261 causes decide block 263 to assign the values of variables to output 257 of WHILE loop block 251. Until this time, wires 265 containing the values of variables at the input to loop body 258 may not be the same as the final values intended for output 257 of WHILE loop block 251. Commit block 250 ensures that the values of the variables at output 257 of WHILE loop 251 are not computed until conditional block 261 determines that WHILE loop 251 has ended. The software-to-hardware compiler may determine that the value of some variables (i.e., values 265) are the same throughout WHILE loop 251. Variable values 265 are deemed loop-invariant, and can be connected from input 253 of WHILE loop 251 directly to output 257.

Loop block 267, merge block 252, and commitctl block 256 are used to propagate the control flow through WHILE loop 251. As can be seen from the tables defining these blocks, WHILE loop 251 may itself be executed speculatively.

Figure 32:
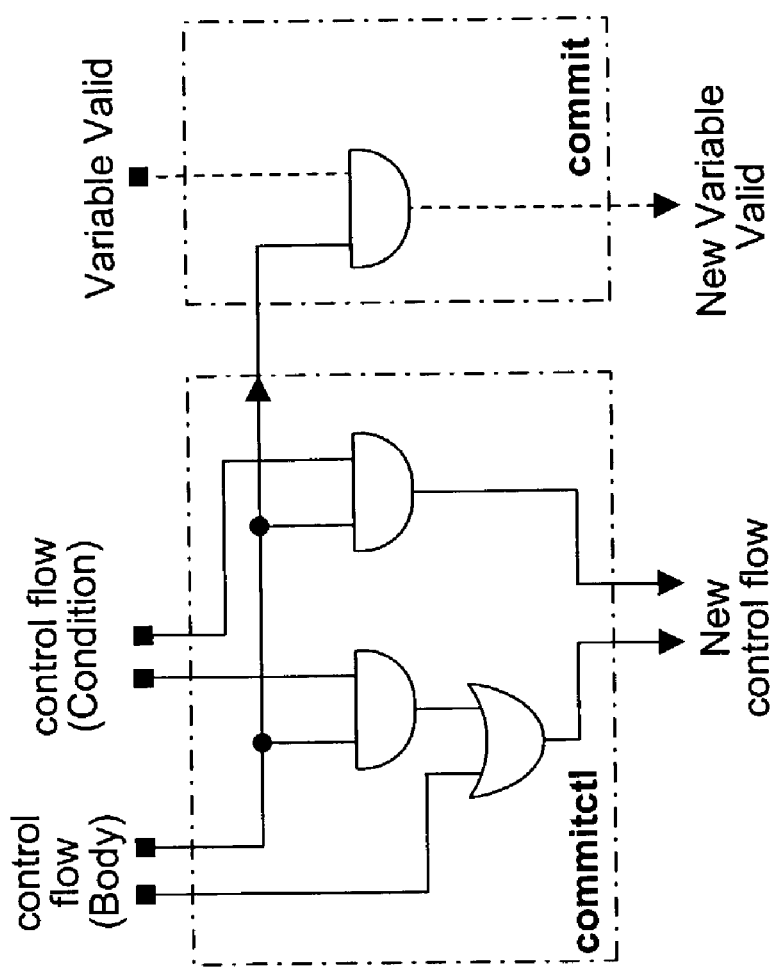
FIG. 32 are schematic diagrams of illustrative commitctl and commit blocks in accordance with the present invention.

The specification for commit block 250 is outlined in the following table. Commit block 250 waits for the loop to terminate before committing to give values to loop variant variables. Illustrative implementations of commit block 250 and commitctl block 256 is shown in FIG. 32.

| Commit | | | |
|---|---|---|---|
| Control flow (Body) | Control flow (Condition) | New Control flow | New Variables enabled? |
| Commit | Don't Care | Commit | No |
| Cancel | Commit | Commit | Yes |
| Cancel | Cancel | Cancel | Don't Care |
| Cancel | Speculate | Speculate | Yes |
| Speculate | Commit | Commit | No |
| Speculate | Don't Care | Speculate | No |

Figure 33:
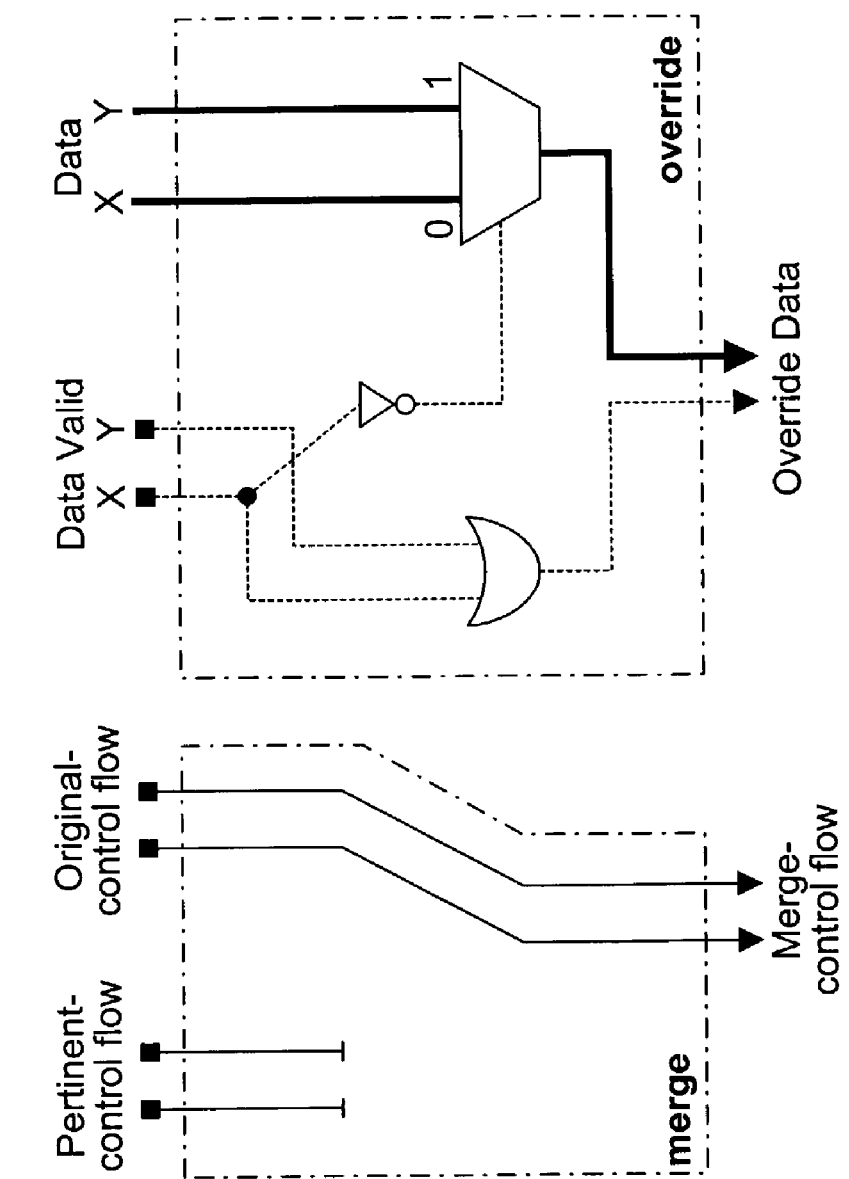
FIG. 33 are schematic diagrams of illustrative merge and override blocks in accordance with the present invention.

The specification for merge block 252 and override block 254 is outlined in the following table. Illustrative implementations of merge block 252 and override block 254 is shown in FIG. 33. Merge block 252 and override block 254 compute the flow-control and variables for the current loop iteration. Variables from the pertinent state override the input variables of loop block 258.

| Merge and Override | | | | | |
|---|---|---|---|---|---|
| Pertinent Control flow | Pertinent-Data | Original-Control flow | Original-Data | Merge-Control flow | Override-Data |
| Commit | Defined (X) | Don't Care | Don't Care | Commit | Defined (X) |
| Don't Care | Don't Care | Cancel | Don't Care | Cancel | Don't Care |
| Speculate | Defined (X) | Commit | Undefined | Commit | Defined (X) |
| Speculate | Defined (X) | Commit | Defined (Y) | Commit | Defined (X) |
| Speculate | Defined (X) | Speculate | Don't Care | Speculate | Defined (X) |
| Don't Care | Undefined | Commit | Undefined | Commit | Undefined |
| Don't Care | Undefined | Commit | Defined (Y) | Commit | Defined (Y) |
| Don't Care | Undefined | Speculate | Undefined | Speculate | Undefined |
| Don't Care | Undefined | Speculate | Defined (Y) | Speculate | Defined (Y) |

The specification for loop body block 258 is outlined in the following table. Loop body block 258 decides when to store the pertinent state. When the loop condition fails, then loop body block 258 generates a cancelled control flow (i.e., the state from the body is invalid and must not be stored).

| Control flow (Body) | Done | Enable State save |
|---|---|---|
| Don't Care | False | No |
| Commit | True | Yes |
| Cancel | True | No |
| Speculate | True | Yes |

There are several simplifications that can be made to the circuit of FIG. 31. For example, override block 254 only chooses values from pertinent state 255 when the values held there are valid. The pertinent control flow signal is either "commit" or "speculate" and the input control flow may only override a speculative pertinent state. Thus, the pertinent control flow signal does not need to be stored; and values are only stored in pertinent state 255 when loop body block 258 asserts the done signal. Because of this latter simplification, the values in pertinent state 255 are either all computed or all uncomputed. Therefore, it is only necessary to store a single computed bit in pertinent state 255.

Figure 34:
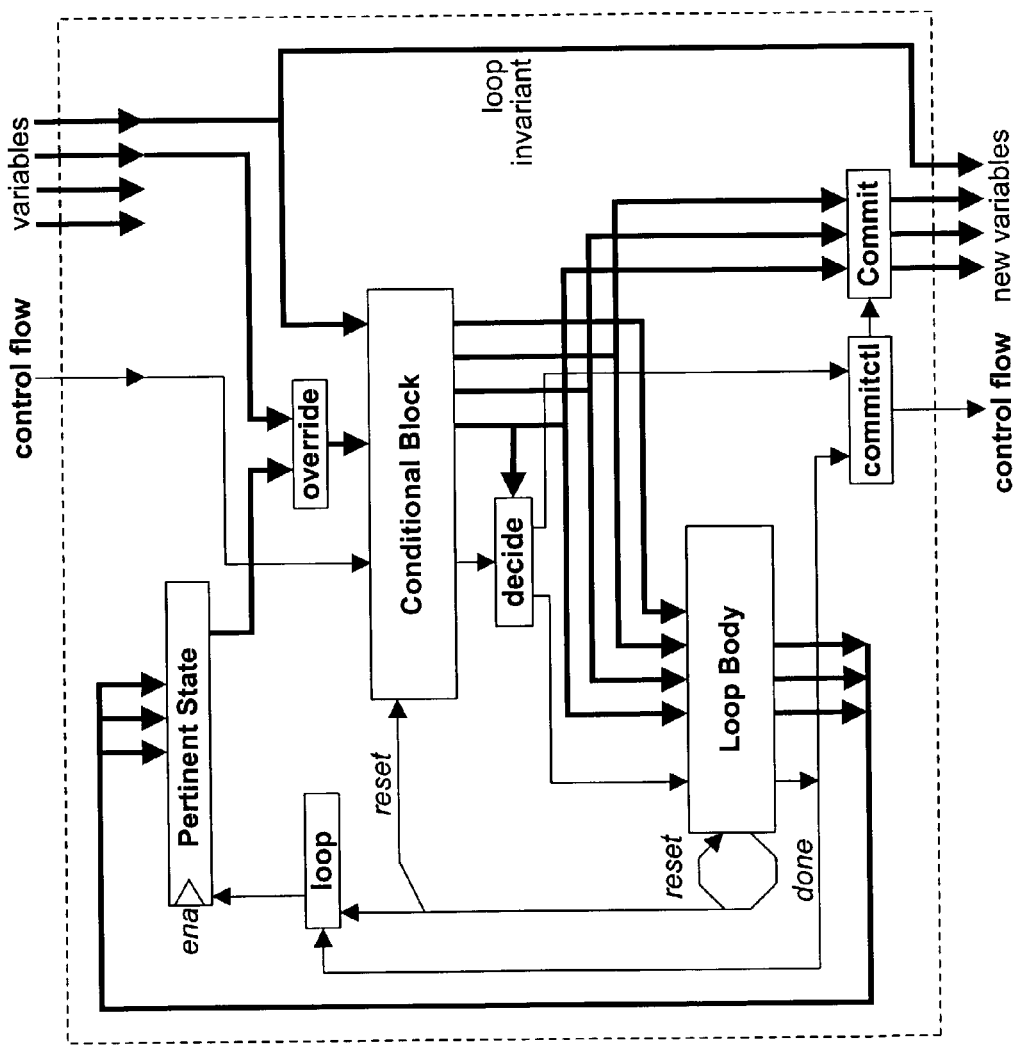
FIG. 34 is a diagram of a simplified version of the circuit of FIG. 25 in accordance with the present invention.

Taking this simplifications into account, the circuit of FIG. 31 may be redesigned to a circuit such as that shown in FIG. 34.

In general, a program will spend most of its time performing computations within loops. It is therefore important to make loops iterate as fast as possible. Two main factors that prevent loops from being executed faster are limited resources (i.e., parallelism) and data dependencies. In hardware, parallelism is less of an issue than in software. Therefore, data dependencies are likely to be a larger source of performance inefficiency than limited resources.

As described thus far, loops iterate once the new values of all the loop variant variables are known. However, in some circumstances a performance gain may be achieved by partially starting the next iteration with a subset of the values currently available. This can be done through loop-pipelining.

Figure 35:
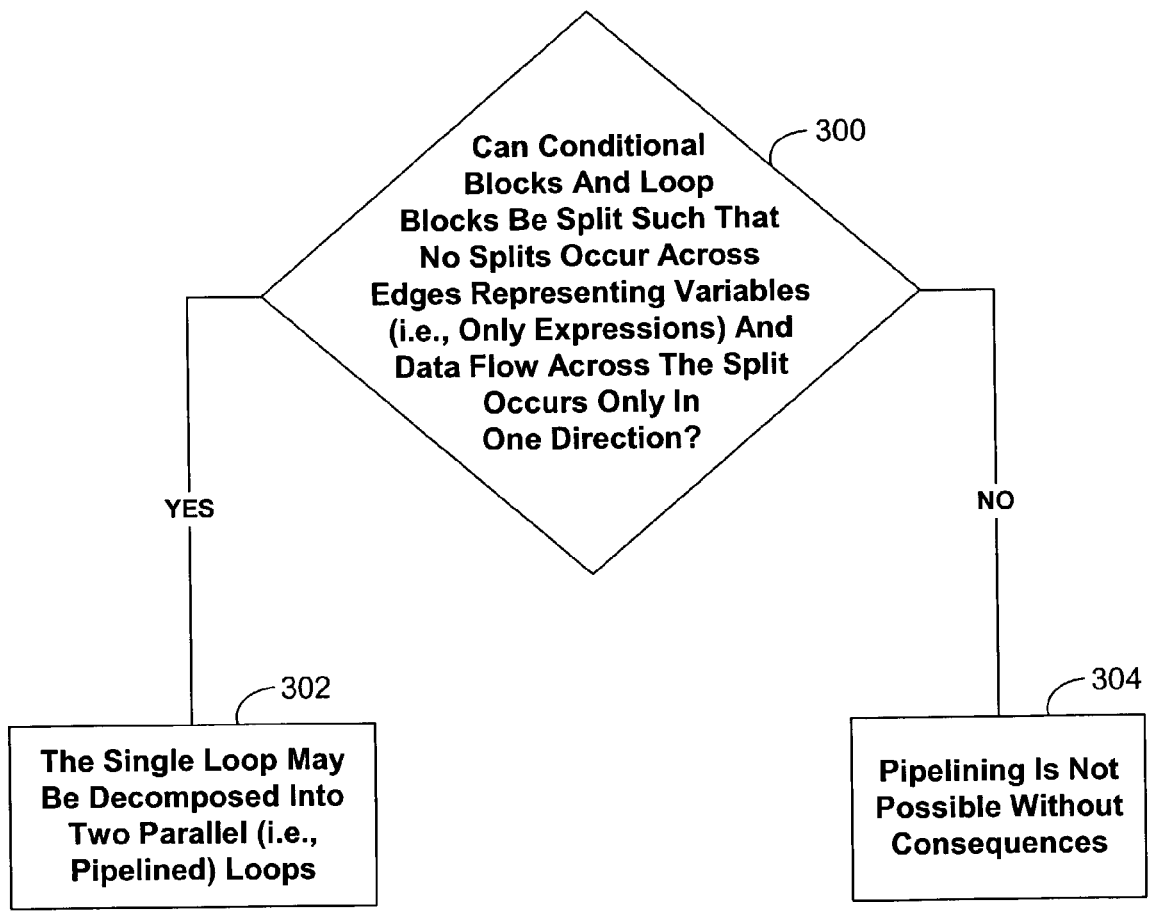
FIG. 35 is a decision diagram showing how to determine if pipelining is possible in a loop in accordance with the present invention.
Figure 36:
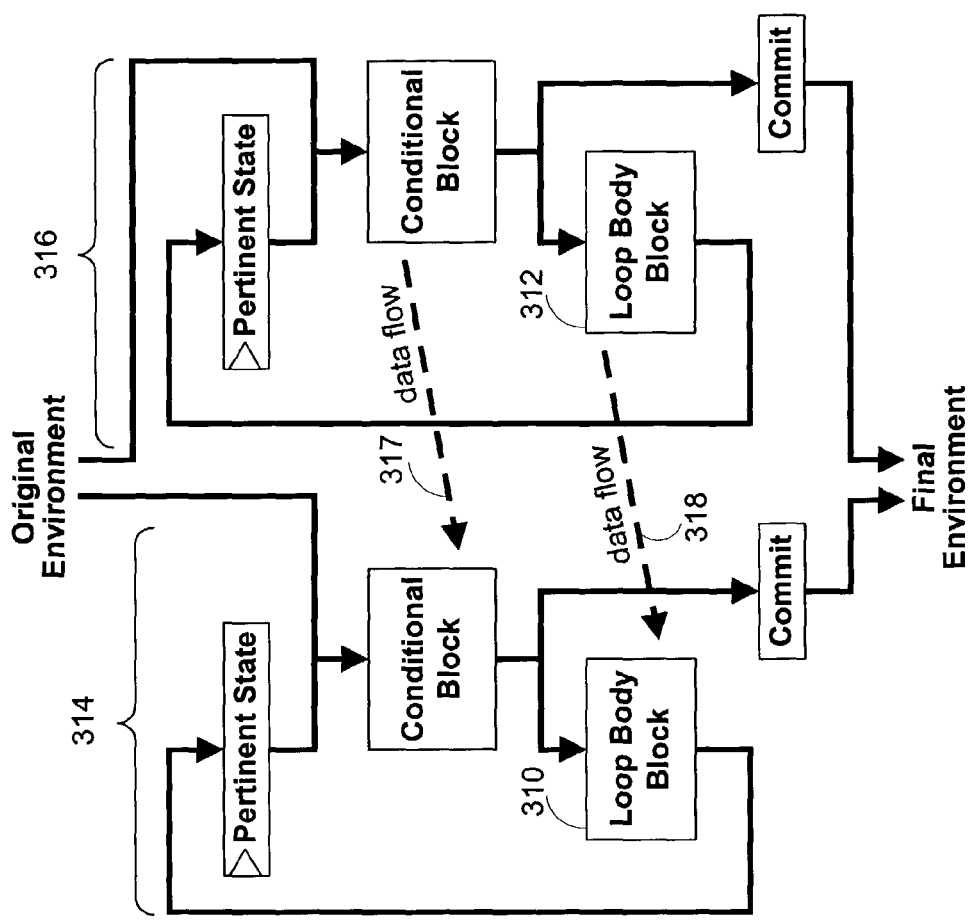
FIG. 36 is a block diagram illustrating loop-pipelining in accordance with the present invention.

FIG. 35 is a decision diagram that outlines illustrative requirements for determining whether loop-pipelining is feasible for a particular loop. If it is determined at box 300 that conditional blocks and loop blocks can be split such that no splits occur across edges representing variables (i.e., only expressions), and data flow across the split occurs in one direction only, then a single loop can be decomposed into two parallel (i.e., pipelined) loops at box 302. If the requirements of box 300 are not met, then pipelining is not possible without possible detrimental consequences (box 304). FIG. 36 shows an illustrative simplified implementation of loop-pipelining.

FIG. 36 shows two loops 314 and 316, having loop body blocks, 310 and 312, respectively, that may have been decomposed from a single loop by loop-pipelining. One loop does not depend on values computed in the other. Thus, data flows in one direction. It may be possible to further decompose these loops by further loop-pipelining.

Data flow edges 318 and 317 may be implemented using FIFO's or any other suitable data structure, (i.e., one per edge). This offers the advantage that loops with variable loop iteration speed iterate at a speed closer to the average iteration speed, rather than at the slowest speed.

In order to maintain the functionality of the original loop, each decomposed loop 314 and 316 sends and receives the correct amount of data flow information on every iteration. If inter-loop data flow is implemented using FIFO's, one particular embodiment of the software-to-hardware compiler may wait for all FIFO's to have pushed and popped in the loop, before commencing the next iteration.

Pipelines may be simultaneously reset by resetting all blocks, and all relevant FIFO's. Pipelines may be reset in this manner even after many decompositions.

With regard to nested loops, when a loop has been repeatedly decomposed, there will be many parallel sub-loops with dataflow between them. Each sub-loop may be treated as an individual block, and the dataflow dependencies may be ignored. This allows the next level sub-loop to be decomposed in a similar way, aided by the fact that fewer dependencies exist between blocks.

After decomposition, some loops may only depend on dataflow data (i.e., data-input independent loops). These loops can execute as soon as data becomes available on a dataflow edge. In one suitable approach, the entire program can be modeled as such a loop, in which external data arrives and leaves on dataflow edges.

Within a loop, some data paths will terminate at a dataflow edge (i.e., at a FIFO). A loop cannot iterate until all FIFO's have pushed/popped values, and sometimes a loop can be waiting for data to reach a dataflow edge. In these cases, the long paths that end at a dataflow edge can be decomposed (e.g., by adding intermediary dataflow edges). This results in groups of edges whose inputs are dataflow edges and whose outputs are dataflow edges. These groups are loops. Hence, further loop-decomposition has occurred.

Figure 37:
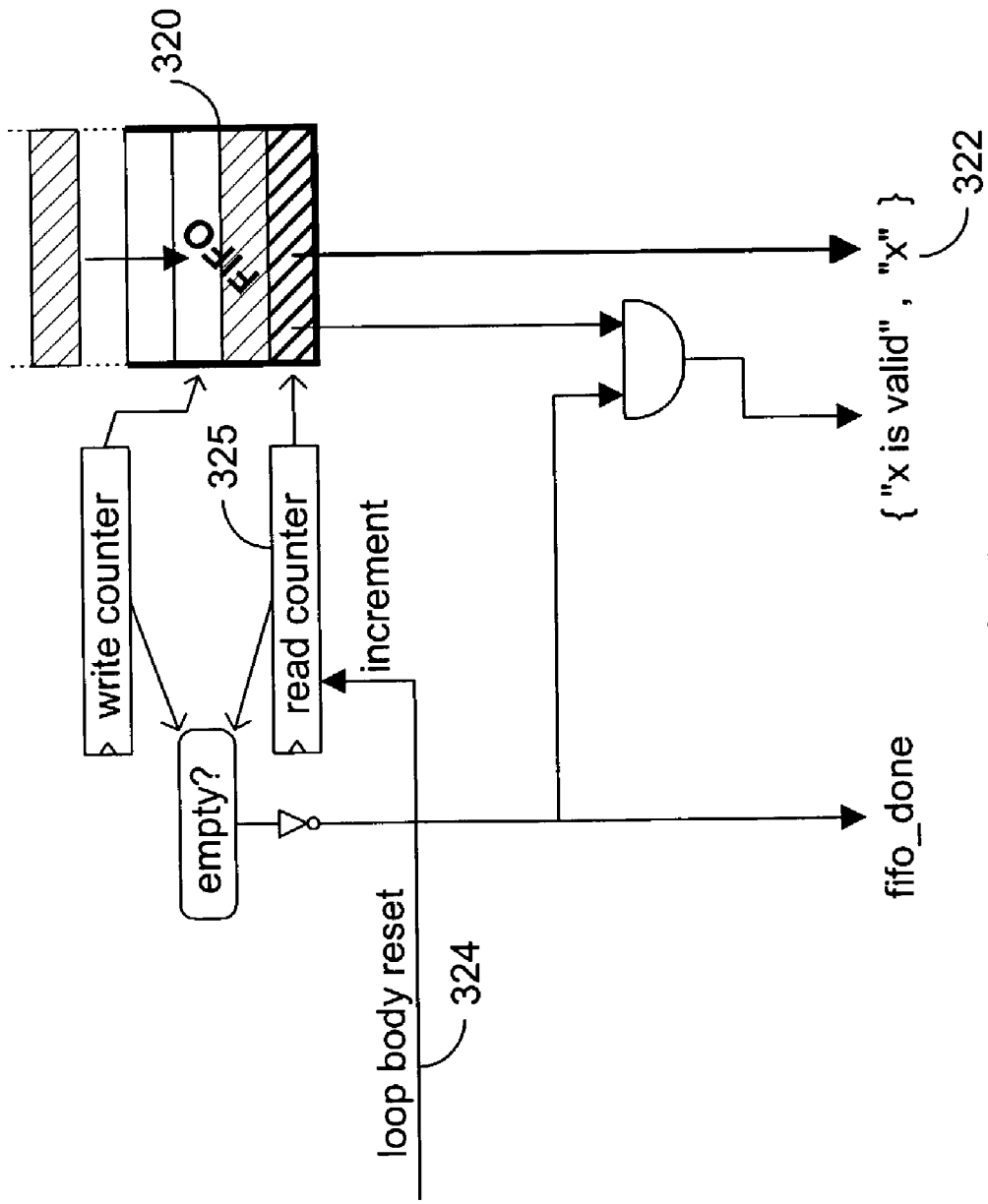
FIG. 37 is a schematic diagram of an illustrative FIFO that may be read to provide an input in accordance with the present invention.

FIG. 37 shows an illustrative pop interface buffer 320 (to be described later) that may be generated in hardware by the software-to-hardware compiler. A pop interface may be used to read data from a dataflow edge in a loop-pipeline. FIFO 320 may store the value of a given variable (or a set of variables). FIFO 320 may also store whether the value for the variable had been computed. For some instances, a variable is always computed before its value is stored on a FIFO, and so this extra bit may not always be required.

FIFO 320 may sometimes be empty. In these cases, the value of the variable that is supposed to be stored in FIFO 320 is deemed not to be computed, and the block in which FIFO 320 resides does not indicate that it has completed (and hence cannot be reset). FIG. 37 shows illustrative hardware that may be generated by the software-to-hardware compiler to achieve this.

If a FIFO is contained in a loop-body block, then the loop may require that block to be reset upon every iteration. Upon loop-reset, the FIFO is not reset, but simply "popped." That is, the current value on the FIFO is discarded, and the next value on the FIFO takes its place. This effect could be achieved by incrementing read-counter 325.

FIG. 37 shows FIFO 320 acting as an input. FIFO 320 supplies the current context with variable 322 taken from the head of FIFO 320. When all FIFO's have supplied a variable into the current context, and the execution frontier has reached all the context outputs, then the context can be reset. A FIFO does not reside in the context of the loop body but in the context of the loop itself, hence a FIFO is reset when the entire loop is reset. However, a loop body reset (e.g., loop body reset 324) pops a value from all the FIFO's used by it.

Figure 38:
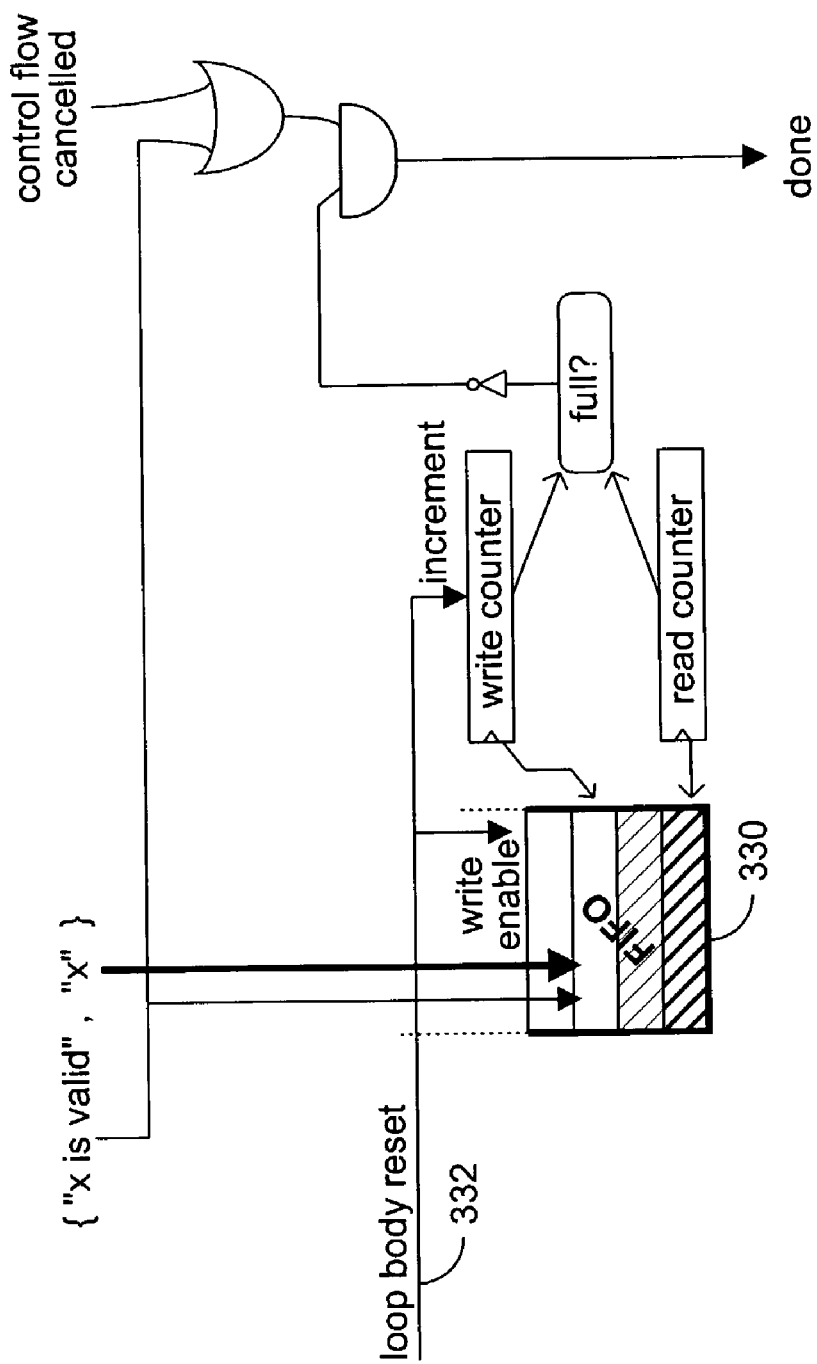
FIG. 38 is a schematic diagram of an illustrative FIFO to which data may be written in accordance with the present invention.

FIG. 38 shows how a push interface may be implemented. The context is not completed until the push has been performed (i.e., assuming the buffer is not full). Loop body reset 332 completes all pushes. FIFO 330 is reset by the reset for the entire loop.

A reset signal for a block may be asserted only when execution of that block is complete. That is, a reset signal is asserted when all FIFO's have either supplied (i.e., popped) valid data or are ready to absorb (i.e., push) valid data.

Once a block in a loop-body has completed execution, the outputs of the block are latched. The block is then reset and restarted. For a decomposed loop, only a subset of this latched data may be looped-back. The remainder is sent to the next loop in the decomposed sequence. In one suitable approach, the loop block will not restart until all required data from previous loops in the decomposed sequence is available, and all subsequent loops have read the previous data.

If a single register is used to buffer between loops in a decomposed sequence, then there may be many instances when a loop will stall, waiting for data. The software-to-hardware compiler may determine that it is more appropriate to insert FIFO buffers instead of single registers, in order to minimize stalling. This is especially beneficial if loops take an unpredictable amount of time in each iteration.

In one embodiment of the software-to-hardware compiler of the present invention, FIFO buffers may be inserted throughout a hardware design—not just in loops.

Most processor or system buses can be made to behave as FIFO buffers. Thus, the software-to-hardware compiler may decide at a late stage to split the design between two or more hardware units in a system. An example of a hardware unit may be other programmable logic devices, or even other software processors. In this way, the software-to-hardware compiler may split a design between software and hardware, guaranteeing the functionality remains the same, but potentially improving performance, cost or size. This split may be done either automatically or with some user input.

Figure 39:
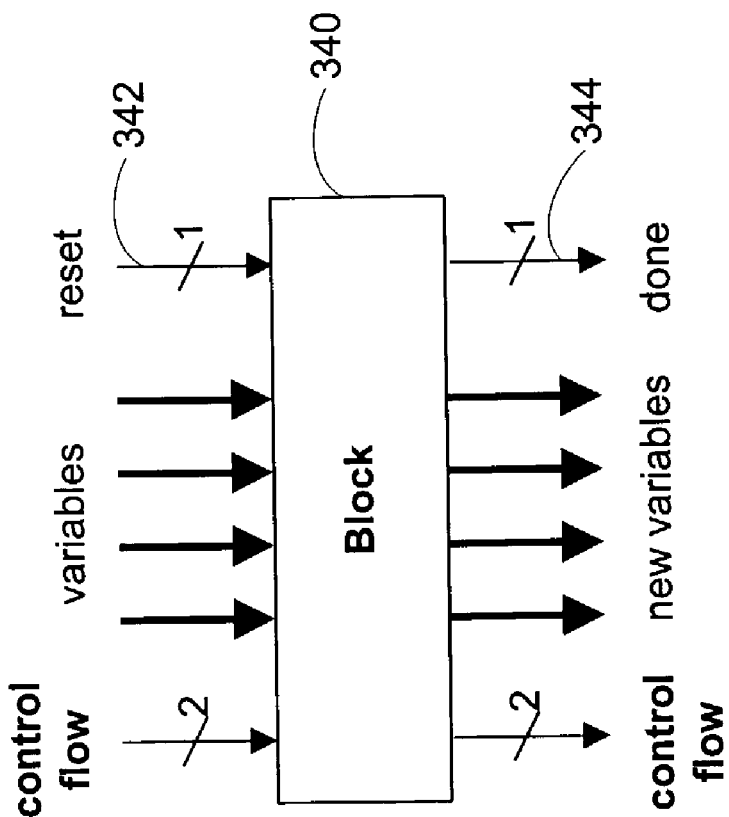
FIG. 39 is a block in accordance with the present invention.

FIG. 12 introduced a simple version of a block. Taking into account the additional control signals that may be used to implement features such as loops, sharing, pipelining, etc., FIG. 39 shows a more robust block 340. Reset signal 342 may be needed for loops and sharing. Reset signal 342 resets the context of block 340 on the next clock cycle. Only state-holding elements need to be reset.

Done signal 344 is asserted when no more variables in the output environment of a block will be computed. A reset cannot be applied until a block's done signal has been asserted.

Reset circuitry may incur large propagation delays for large designs. To reduce these delays, the compiler may insert extra latches in the reset paths provided that it can be guaranteed that the reset signal will reach all state elements in a block before the next valid data does.

The software-to-hardware compiler may ensure that, prior to optimization, every set of data wires has an associated control wire. The hardware will operate correctly, provided that the control wire goes high after the correct data values have been asserted. This allows registers to be added to data wires and control wires, provided that the number of registers added to a control wire is at least as many as the highest number of registers added to any data wire.

The approximate clock rate at which the hardware circuit will operate is determined by calculating the longest asynchronous path between any two registers. In order to maximize the clock rate of the hardware, the software-to-hardware compiler may ensure that all paths between registers do not exceed a particular length. The software-to-hardware compiler may determine whether to insert extra register stages to improve the clock rate. The number of register stages together with the clock rate determine the overall system performance.

It will be understood that the features and details of the software-to-hardware compiler described herein are merely illustrative and, to some extent, simplified. It will be understood that these, and other suitable features and details may be scaled to accommodate large programs.

To illustrate how the software-to-hardware compiler of the present invention converts a sequential program into hardware, the following C-code for determining the greatest common divisor (GCD) of two numbers will be compiled into hardware:

```
While      (x    !=y)      {
    If     (x    >y)
        x -= y;
    Else
        y -= x;
}
```

Figure 40:
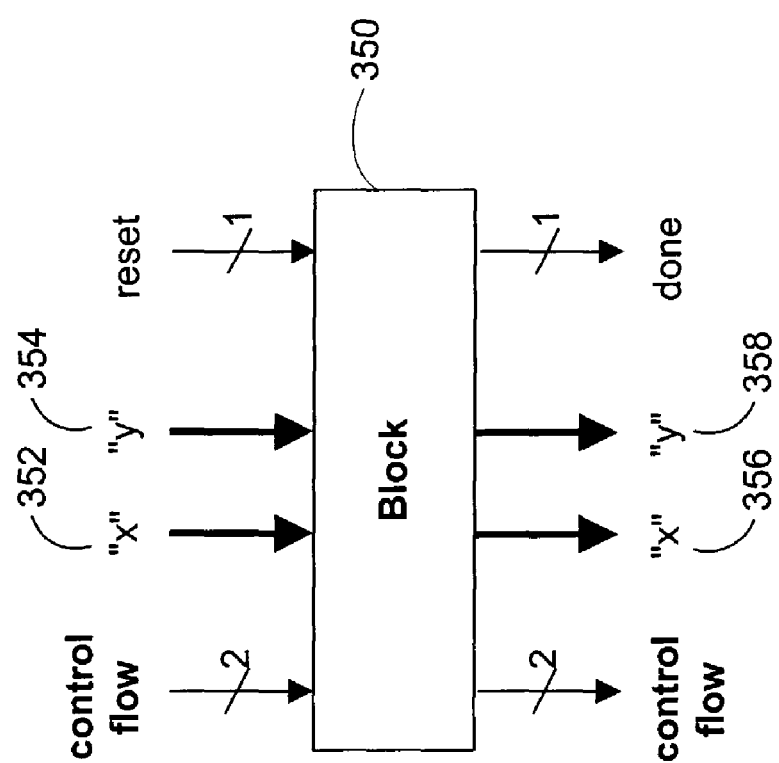
FIG. 40 is an illustrative block that may be used to implement a greatest common divisor program in accordance with the present invention.

Using the software-to-hardware compiler, this program may be translated into the block shown in FIG. 40. Block 350 contains the WHILE loop-body shown above. Inputs 352 and 354 translate to "x" and "y," respectively. Outputs 356 and 358 translate to the GCD of "x" and "y," which are provided when "x" equals "y" according the end-condition of the WHILE loop.

Figure 41:
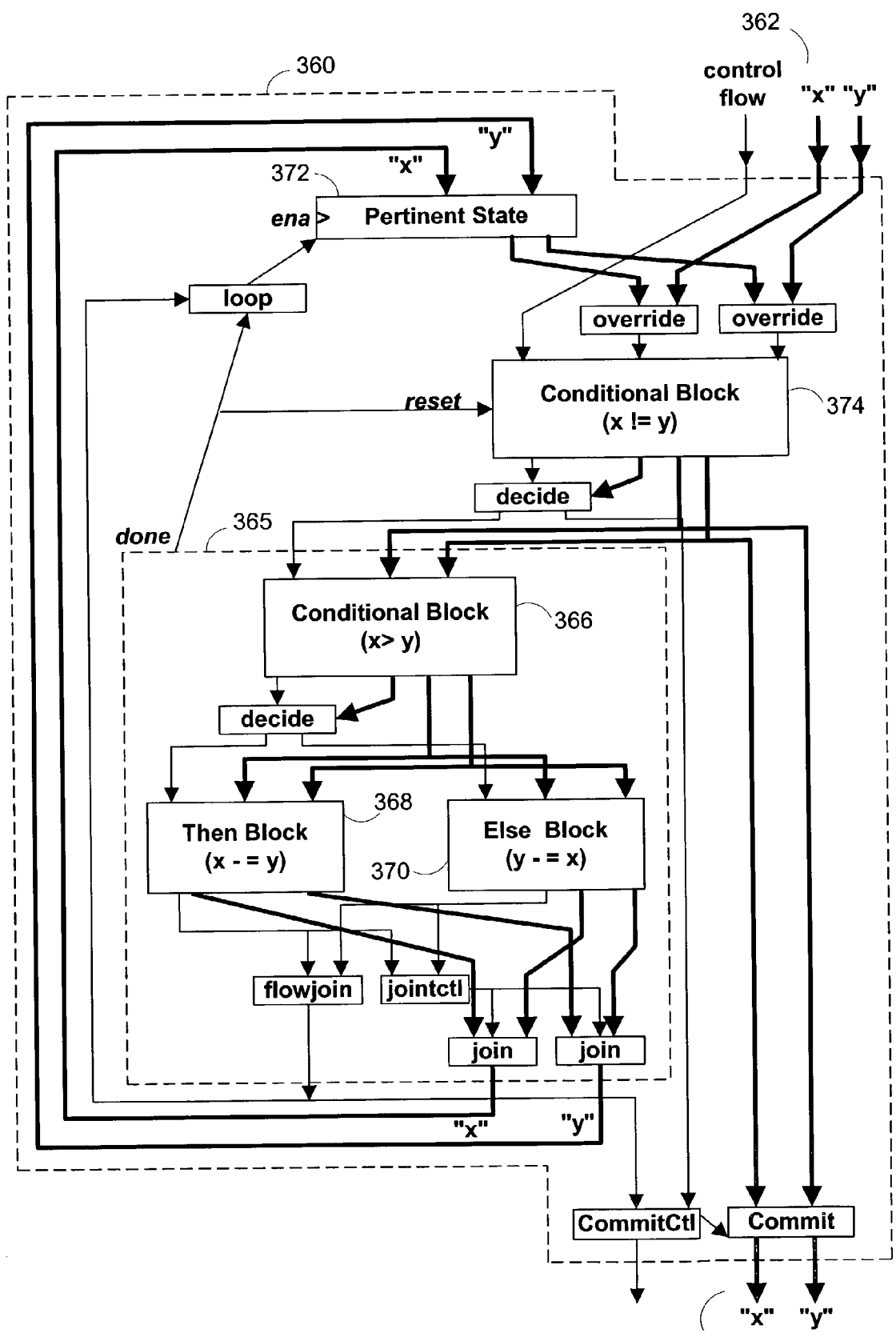
FIG. 41 is a schematic diagram of an illustrative circuit that may be used to implement the block of FIG. 34 in accordance with the present invention.

Using the transformations for WHILE loops and IF blocks, the resulting hardware is shown in FIG. 41. The GCD program is composed of several nested blocks, which in this case are contained within a single outer block—WHILE loop 360. WHILE loop 360 is based on the implementation of a WHILE loop as was shown in FIG. 37. In the case of the GCD program, there are only two variables the values of which matter—"x" and "y." Thus, input environment 362 and output environment 364 of WHILE loop 360 contain only these values.

A WHILE loop contains two sub-blocks, one for the conditional expression, (i.e., conditional block 374, which in this case computes "x!=y"), and one for the body of the loop. In this case, the loop body is itself composed of several sub-blocks, the outer-most of which is a single IF block. Using the implementation for an IF block as shown in FIG. 21, loop body 365 may be decomposed into several sub-blocks. That is, Loop body 365 may be decomposed into blocks that include one for the conditional expression of the IF (i.e., conditional block 366), one for the THEN expression (i.e., THEN block 368), and one for the ELSE expression (i.e., ELSE block 370). IF block 365 may only require the values of two variables in its input and output environments—"x" and "y". The values at the output of IF block 365 represent the values of "x" and "y" at the end of a WHILE loop iteration and are passed into pertinent state register 372 so that they may be used on the next iteration of the WHILE loop. The software-to-hardware compiler recursively transforms blocks until the entire program can be expressed in terms of interconnected operations and primitive hardware gates. In the case of the GCD example, FIG. 42 shows the resulting hardware.

Some control blocks have not been reduced to gates for clarity. As can be seen by in FIG. 42, the values for the variables "x" and "y" are given to GCD block 378. Because the pertinent state is initially unassigned, override blocks 380 and 382 select the original input values of the variables "x" and "y" to be used in the first iteration of WHILE loop 378. These values are compared using the "not-equals-to" operator 384, which feeds decide block 386. The decide block 386 determines whether the current values of "x" and "y" are the final values of "x" and "y" at the output of WHILE loop block 378. If not, then the control flow signals commit to the loop body block 388. By coupling the wires holding the values of "x" and "y" to subtractors 390 and 392, join blocks 394 and 396 may select whether ("x-y" and "y") or ("x" and "y-x") should be used as the updated values of "x" and "y," respectively. These values are assigned to pertinent state register 398 for the next iteration of the WHILE loop.

Figure 42:
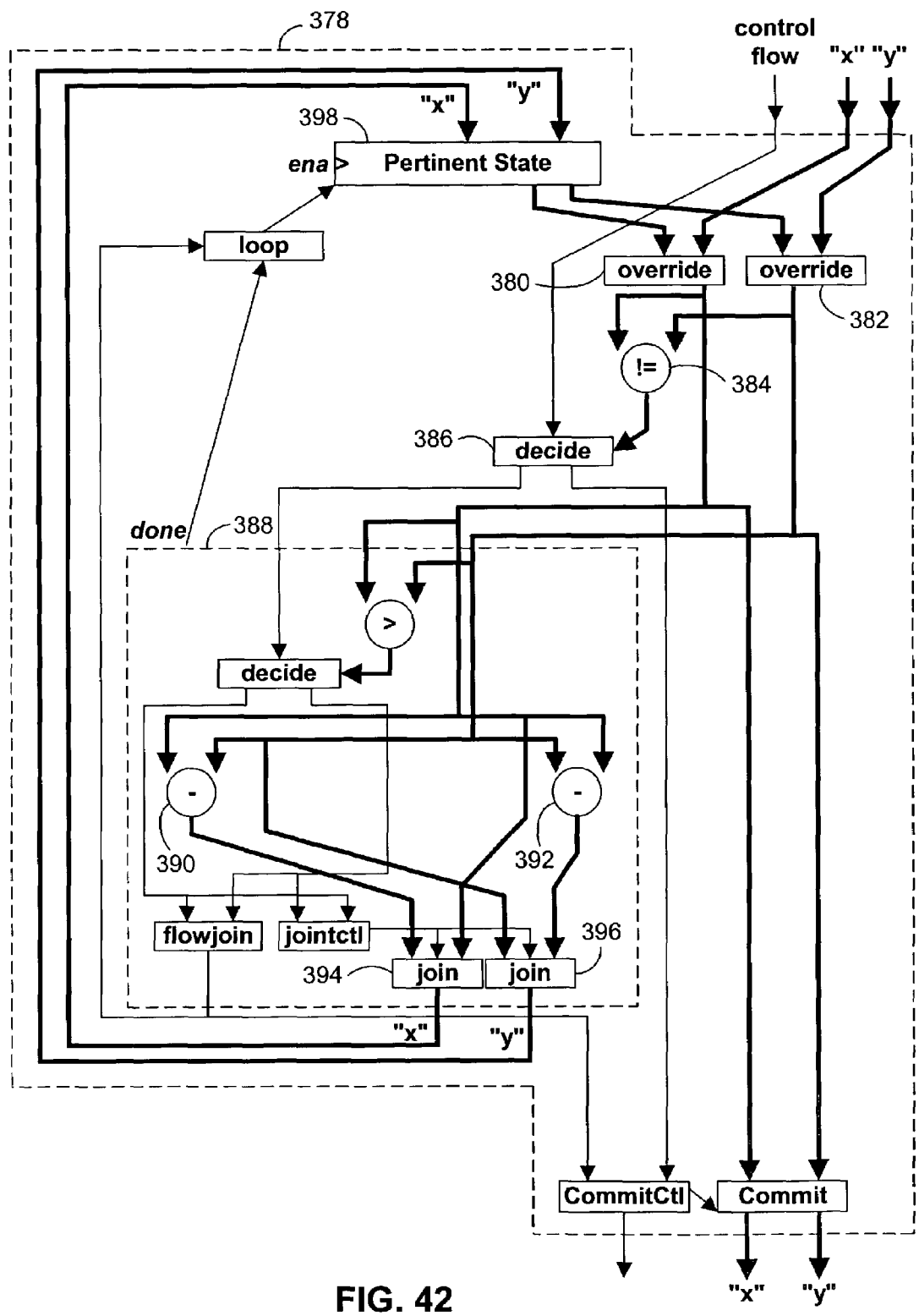
FIG. 42 is a schematic diagram the circuit if FIG. 35 shown with synthesized sub-blocks in accordance with the present invention.

A few extra control wires are needed to complete the circuit in FIG. 42, such "loop-block-done" and "loop-block-reset" signals. The exact hardware needed for these signals depend on how many registers or FIFO's have been inserted on any of the bold black lines. The software-to-hardware compiler may decide to implement any number of registers or FIFO's throughout the design, without affecting the entire circuit operating as a GCD. The software-to-hardware compiler may determine the number of register delays in computing the loop body, and assert the "loop-block-done"

signal after this time. If no registers are inserted, the "loop-block-done" signal may be asserted immediately. When the "loop-block-done" signal is asserted, the pertinent state register 398 may latch the values of "x" and "y" on the next clock cycle, as well as reset the loop-body. The "loop-body-reset" resets all registers within the loop-body. The software-to-hardware compiler may determine that sometimes only a subset of registers need to be reset.

In one embodiment of the software-to-hardware compiler of the present invention, ANSI-C programming language code may be parsed and compiled into hardware constructs. The following description is directed toward a software-to-hardware compiler that compiles programming implemented in software using an ANSI-C front end. This is merely an illustrative embodiment of the software-to-hardware compiler. It will be appreciated that any other suitable high-level software language and high-level software constructs may be compiled into hardware constructs by the software-to-hardware compiler. The following discussion includes several illustrative optimizations that may be used when generating hardware constructs in a programmable logic resource using the software-to-hardware compiler. It will be appreciated that the optimizations are merely exemplary and that any suitable modification may be made and that any other suitable optimization may be used, depending on, for example, the type of high-level software programming language being compiled.

In most C programs, it is assumed that data objects (e.g., data, variables, data structures, etc.) are accessed 32 bits at a time, and are assumed to be stored in a unique location within a single memory address space, although in reality this need not always be the case. The software-to-hardware compiler, while allowing this abstraction to be preserved, may perform optimizations that may improve the hardware implementation of the C program.

For example, when compiling an array of objects implemented in C into hardware, the software-to-hardware compiler may store the array of objects in RAM (e.g., internal RAM or external RAM) with the address of the array being word aligned.

Structures, as used in C, may include many fields, some of which may be bit-fields (i.e., according to ANSI-C standards). Structure packing is not specified by ANSI-C. This may be problematic if the software-to-hardware compiler must generate software and hardware versions of data-structures. In order to remedy this, extra constraints may be generated by the software-to-hardware compiler in order to ensure that the hardware representation is consistent with most software compilers' representations.

The software-to-hardware compiler may assume that fields are aligned at the next nearest boundary consistent with their size (e.g., char fields are char aligned, word fields are word aligned, and bit fields are bit-aligned). The software-to-hardware compiler may generate a warning or error when bit-fields attempt to cross word boundaries without intermediary padding (e.g., a ":0" bit-field or non-bit-field object).

A C-object may be defined as one or more regions of bits starting from an origin. For example, the illustrative variable definition "int x" uses a region of 32 bits starting from the origin of variable "x." In the illustrative structure definition "struct { ..., int f; ... } s," field "f" uses a region of 32 bits starting from the origin of structure "s" plus the offset of the field within the structure (i.e., based on the position of "f" in the structure definition). In the illustrative region definition "int a[4]," "a[i]" uses a region of 32 bits starting from the origin of "a" and repeating every 32 bits, four times. In the illustrative structure region definition "struct { ..., int f; ... } s[5]," field "f" uses a region of 32 bits starting from the origin of "s" plus the offset of the field within the structure (i.e., based on the position of "f" in the structure definition), repeating every sizeof(s) bits, five times. In the illustrative structure region definition "struct { ..., int f[3]; ... } s[5]," field "f[i]" uses a region of 32 bits starting from the origin of "s" plus the offset of the field within the structure (i.e., based on the position of "f" in the structure definition), repeating every 32 bits, three times, and then this entire region is repeated every sizeof(s) bits, five times. Regions may repeat when, for example, a structure or an array is repeated such as when an array or structure is defined or when an array of regions is defined (e.g., multi-dimensional arrays).

The region of an object represents all the bits that may need to be accessed in order to store or retrieve the value of that object during the execution of the program.

In general, a region of an object may be defined as a single region that is a particular number of bits in size, as a fixed set of equivalently or substantially equivalently sized regions spaced at regular intervals, or an infinite set of equivalently or substantially equivalently sized regions. A region may always be defined relative to the physical address of a C variable.

Regions are transparent with regard to whether a variable should be implemented in software or in hardware. Regions are further transparent with regard to whether a variable should be stored in registers, internal or external RAMs, any other suitable memory device, or any combination thereof. Regions may be used to indicate which objects overlap and which objects may share the same physical (storage) device or devices.

One of the features provided by ANSI-C is the ability to use unions. Unions may include one or more objects whose memory space is shared. Unions may be useful for implementing protocols at the bit-level, for implementing tree data structures, and for any other suitable use.

A structure within a union has the same representation as an equivalent structure outside of the union. In addition to this, ANSI-C specifies that when two structures within a union have the same initial sequence of objects, then each of those objects is aliased to its counterpart. For example, in the union:

```
Union {
    int x;
    Struct {
        Int x;
        Float f;
    } s1;
    Struct {
        Int x;
        Int y;
    } s2;
    Struct {
        Int x : 5;
        Int y;
    } s3;
} u;
```

{u.x, u.s1.x, u.s2.x} all alias the same integer variable, whereas u.s2.y and u.s3.y do not alias the same integer variable because the sequence of objects preceding y does not match.

Because the origins of all of a union's subtypes are the same, unions permit regions for different C-objects to overlap. It is possible to decompose C-objects (i.e., their respective regions) into disjoint sub-regions such that any two regions are either disjoint, or one region is a superset of the other. The latter case may be used to handle regions that overlap other regions.

C-objects within unions may require that multiple regions be accessed in order to store or retrieve the value.

With regard to casting, the ANSI-C standard only permits two forms of casts. The first is casting to (void*) and back to the original type. The second is casting a union to one of its subtypes. In both of these cases, regions do not need to be decomposed further.

These rules do not permit casting arbitrary pointers to (Char*) or to some other (struct*) because resulting objects would need to access partial regions within regions, and these regions may not be determined at compilation time.

Unlike a conventional microprocessor-based system, a hardware-based platform may access multiple RAMs simultaneously.

A region may be entirely stored on a single RAM device as would be done conventionally with a microprocessor. Alternatively, a region may be stored across more than one RAM device. Different regions of a particular object may be stored on a single RAM device or, alternatively, across more than one RAM device. For example, FIG. 43 shows RAM device 1000 that may be used to store an entire region of array a[1 . . . M] as well as entire region of array b[1 . . . N]. In another suitable arrangement, FIG. 44 shows RAM device 1002 storing a region of array a[1 . . . P] (i.e., where P<M), with the remainder of this array being stored on at least one other RAM device, such as RAM device 1004, which stores the region of array a[Q . . . M] (i.e., where P<Q<=M). Any such suitable arrangement may be used by the software-to-hardware compiler for storing regions. It will be appreciated that the use of a RAM device is merely illustrative. Any other suitable memory device may be used.

Performance gains may sometimes be achieved if the same region is stored on multiple RAM devices. This allows multiple read accesses to the same region (e.g., of a variable) to be achieved in a single clock cycle. It also means that a region write is performed on all copies of the region, reducing the memory bandwidth for other reads. The software-to-hardware compiler may be configured to determine whether to make copies of a region by comparing the gains to the losses in doing so. For example, the compiler may take into account available resource information, the region size, the object-types, any other suitable information, or any combination thereof in making a determination.

In doing the foregoing analysis, the software-to-hardware compiler may further determine how many copies of the region would be optimal. By preventing regions from being split across devices, generation of hardware by the software-to-hardware compiler may be made easier. However, this does not affect whether multiple copies of that region may reside on more than one device.

Figure 45:
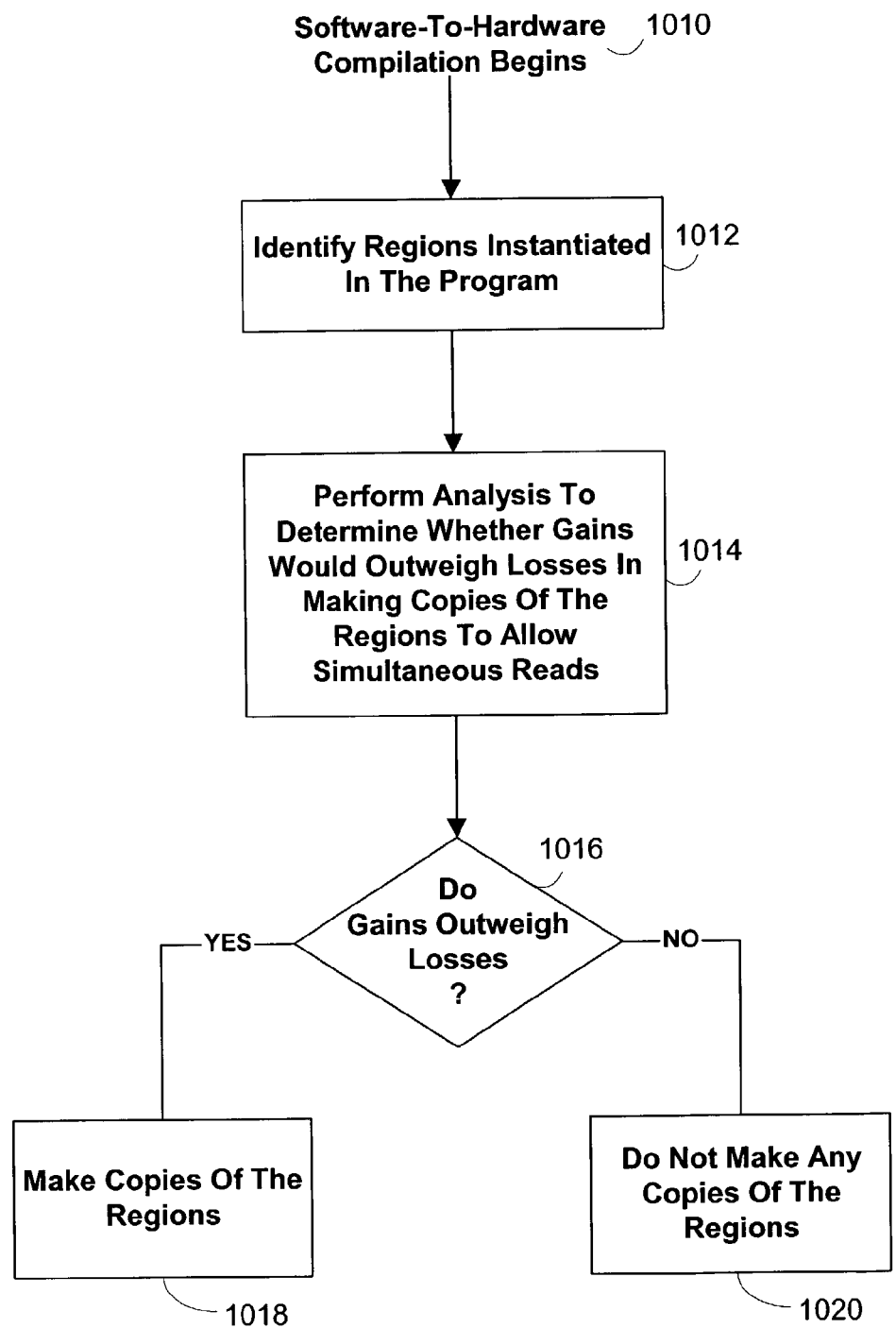
FIG. 45 is a flow chart of illustrative steps involved in making copies of regions in accordance with the present invention.

FIG. 45 is a flow chart of illustrative steps involved in determining whether copies of a region are to be made on additional RAM devices. At step 1010, the software-to-hardware compiler begins compilation of a software program into hardware. At step 1012, the software-to-hardware compiler identifies regions that are instantiated in the program. At step 1014, the software-to-hardware compiler performs an analysis to determine whether the gains of making copies of any of the regions would outweigh the losses. If, at step 1016, it is determined that the gains outweigh the losses, then copies of the regions are made on additional RAM devices at step 1018. If, at step 1016, it is determined that the gains do not outweigh the losses, then copies of the regions are not made at step 1020. That is, some regions may be copied, whereas others may not be copied.

In one illustrative situation, the software-to-hardware compiler may decide that the losses outweigh the gains because the C objects associated with the regions may be written to a number of times much greater than they are read. In this situation, it would be inefficient to constantly make copies of changes being made for the benefits of being able to perform relatively very few reads in a single clock cycle.

Throughout the execution of a program, the set of locations for a region may remain static. In another suitable approach, this need not be the case. For example, certain loops may work faster if there are more copies of a region, but later parts of the program may find it too cumbersome to maintain all the copies. In view of this, the software-to-hardware compiler may be configured to create more copies of a region using spare memory bandwidth within certain loops. In another suitable approach, the software-to-hardware compiler may generate hardware constructs that dynamically analyzes, during run-time of the program, whether the optimization discussed with regard to FIG. 45 may be achieved. If it is determined that making copies of regions will achieve a worthwhile optimization, the hardware constructs may dynamically make copies of the particular regions in the particular quantity needed to achieve the optimization. The copies may subsequently be overwritten if not needed.

With regard to pointers, according the ANSI-C standard, a pointer may point to any C-object with the exception of bit fields and NULL. Pointers may also point to functions, but not to labels.

Because multiple copies of a C-object's region may be held in different RAM devices (as previously discussed), a pointer may target any of these copies. Writing to a value through a pointer involves writing to all copies of a region, whereas reading from a value through a pointer may only entail reading from one of the copies. In this way, multiple reads from different locations within the same region may be done in the same clock cycle.

Difficulty arises when pointers are used in a combination of software and hardware. Software is efficient at dereferencing pointers, but if software attempts to dereference a pointer to a hardware-only accessible RAM, then problems may ensue. There are several solutions for overcoming these problems. For example, in one suitable solution, all hardware RAM may be made accessible to software. In certain circumstances, this solution may, however, be inefficient and may result in extra hardware. It may also make it more difficult to resolve multiple copies.

Another suitable solution is that an address range may be set aside to represent RAM locations accessible from hardware. The software may then need to check every pointer to determine whether or not it should access it or send a request to the hardware to do so instead. In certain circumstances, this solution may, however, be inefficient in software and may also make hardware/software partitioning more difficult.

Figure 46:
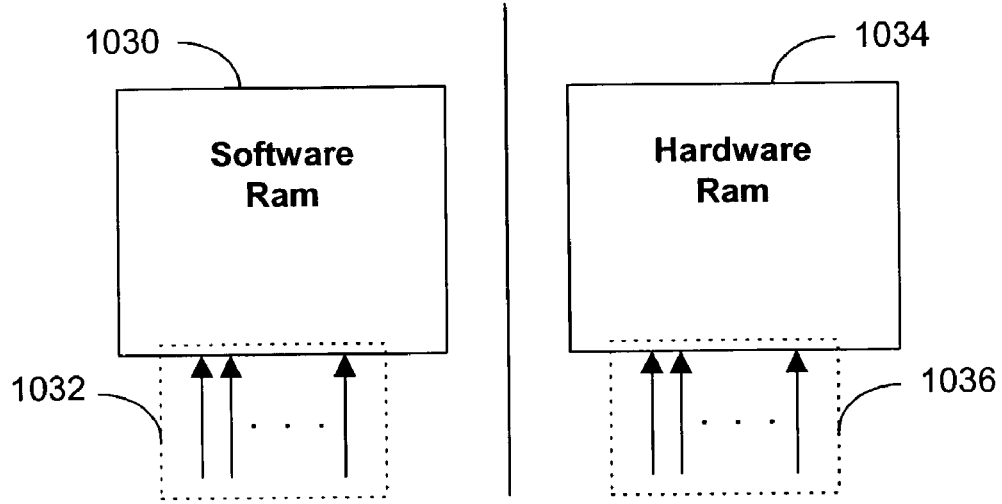
FIG. 46 is a block diagram illustrating having separate pointers for hardware and for software in accordance with the present invention.

Another suitable solution involves splitting pointers into two categories. One category includes pointers that always refer to software-based RAM. The second category includes pointers that always refer to hardware-based RAM. This is illustrated in FIG. 46, which shows software RAM 1030 (implemented on a software platform) to which pointers 1032, belonging a software category, point. Pointers 2036, belonging to a hardware category, point to hardware RAM

1034 (implemented on a hardware platform). In the case of multiple hardware platforms, there may be multiple hardware pointer categories. Pointers to dual port RAM may be used by two different platforms.

With regard to instances, generally, the software-to-hardware compiler may generate a unique block of hardware for each C construct. It therefore follows that C functions may be shared among every function call. In one suitable approach, functions may be the only mechanism by which sharing may be introduced.

A function call may be used for encapsulation purposes. When used for performance reasons, the function may be inlined. Inlined functions may be implemented using "#define" macros or by using the non-ANSI keyword "inline" in front of the function declaration.

The software-to-hardware compiler may add automated optimizations to introduce additional sharing in the hardware or to unroll duplicate blocks that are used heavily.

With regard to "labels" and "gotos," conventional loops are typically less difficult to deal with than labels and gotos. Gotos from within loops may cause many problems. For example, they may not allow pipelining to be finished cleanly. Gotos may also prohibit speculative loop iterations.

Figure 47:
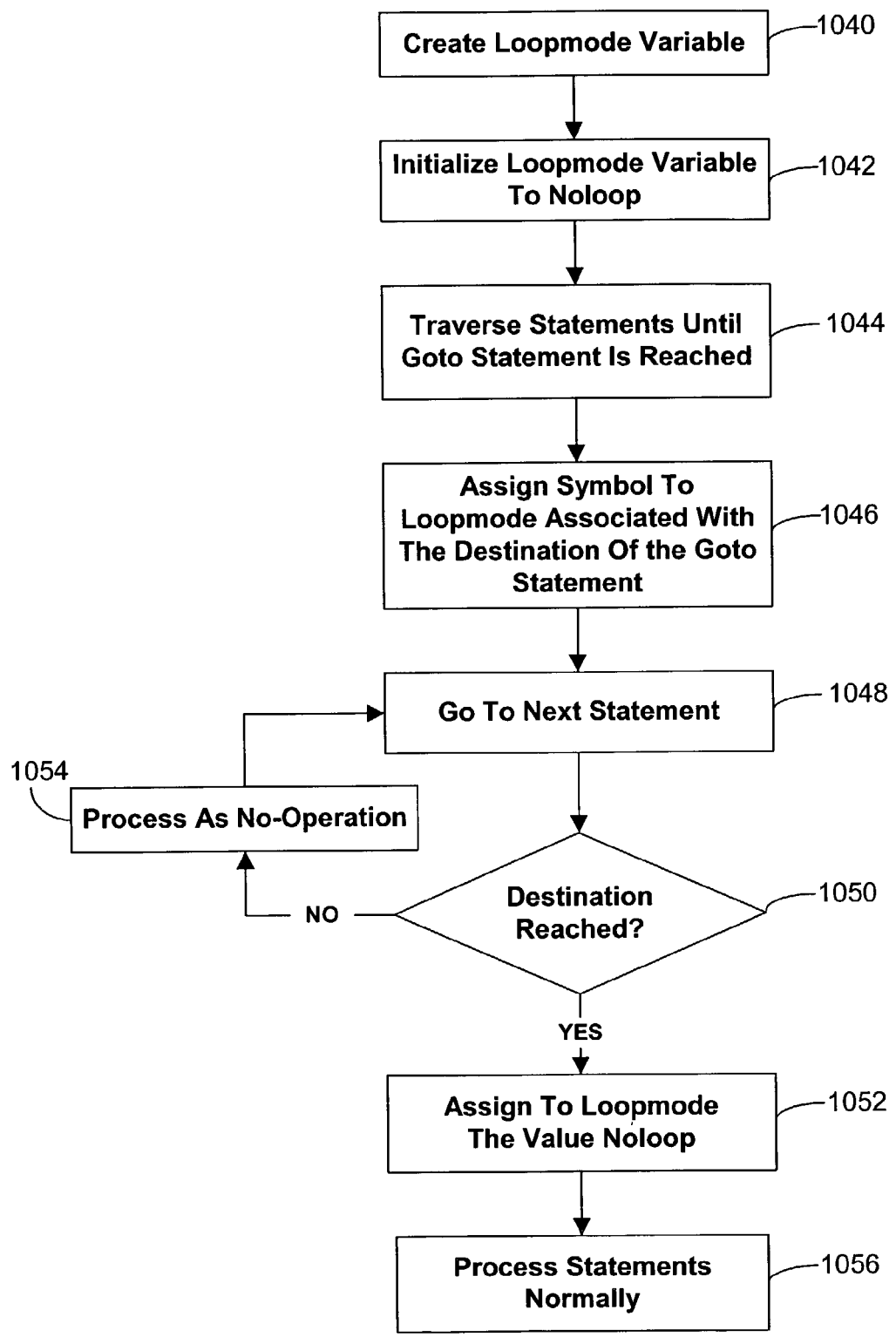
FIG. 47 is a flow chart of illustrative steps involved in compiling a goto statement into hardware in accordance with the present invention.

The software-to-hardware compiler may compile gotos into conventional loops and conditional statements, enabling a high degree of speculation to coexist with programs that include goto statements. A special variable may be introduced for this purpose called "loopmode." Initially, loopmode takes a special value called NOLOOP. Goto statements assign a symbol (i.e., representing the destination label) to loopmode. The software-to-hardware compiler ensures that while loopmode is not equal to NOLOOP, all statements act as no-operations until the required label is reached. Labels check loopmode, assigning it back to NOLOOP if the current value of loopmode corresponds to that label. This process is illustrated in FIG. 47. At step 1040, the loopmode variable is instantiated. At step 1042, the loopmode variable is initialized to NOLOOP. At step 1044, statements are traversed (and processed) until a goto statement is reached. At step 1046, after just having coming across a goto statement, a symbol denoting the destination associated with the goto statement is assigned to loopmode. At steps 1048, 1050, and 1054, the statements following the goto statement of the program are traversed, but processed as no-operation (i.e., no operation being performed), until the destination is reached. At step 1052, when the destination is reached, loopmode is again assigned the NOLOOP value and the remaining statements are processed normally at step 1056 (including repeating these steps if another goto statement is encountered).

If the end of a function is reached and loopmode is not NOLOOP, then control may jump to the beginning of the function. More particularly, the software-to-hardware compiler may insert a function-wide loop that checks loopmode. This may also be done by introducing a plurality of smaller loops within the function.

If loopmode is implemented as a one-hot encoding (i.e., where every bit is treated as a separate variable), then it may be possible to execute multiple goto statements speculatively. That is, different bits of loopmode may correspond to different destination labels.

When a program no longer has any gotos, it may be represented as an (ordered) set of nested blocks, where (non-speculative) control flow moves up and down the block hierarchy.

In forward goto statements (i.e., where the destination is further in code that has not been yet encountered), control flow is transferred to a label located further in the program (i.e., in the code text). All blocks between forward goto statements and their labels may be required to be conditional on the value of loopmode corresponding to this label.

In backward goto statements (i.e., where the destination is at a location in the code before the goto statement), control flow is transferred to a label in the program that has already been encountered. A "do-while" loop that is based on loopmode having the value of "label" (i.e., the destination) may be inserted to surround, at least, the last backward goto statement and the label. A loop that satisfies this constraint may already exist, and may be taken over for this purpose. All blocks between the first goto and the end of the loop, as well as all blocks between the start of the loop and the label may be required to be conditional on the value of loopmode corresponding to this label.

With regard to functions, the software-to-hardware compiler compiles a function into a single hardware block that may be used every time a call is made to the corresponding function. Two function calls may occur at the same time. Thus, all calls may be arbitrated as with any other shared resource.

Figure 48:
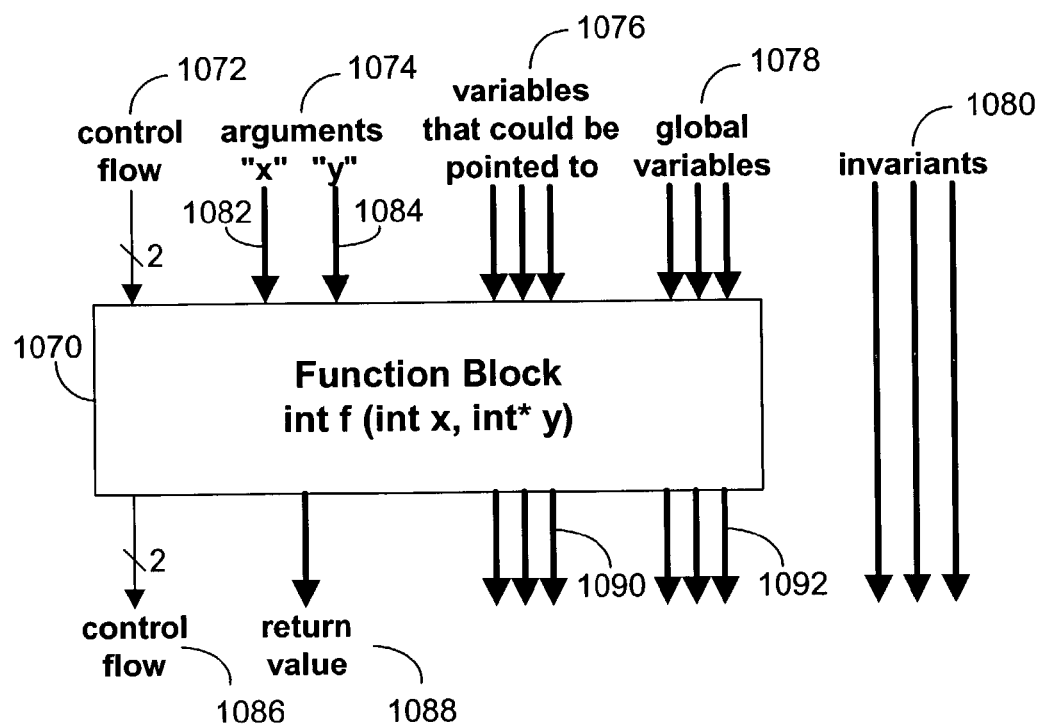
FIG. 48 is a block diagram of an illustrative function block in accordance with the present invention.

It will be appreciated that, as with any other hardware block, a function block may take an input environment and produce an output environment. FIG. 48 shows an illustrative function block 1070 that takes as input an environment having control flow 1072, arguments 1074, variables that may be pointed to 1076, and global variables 1078. Invariants 1080 may also be used by function block 1070, assuming invariants 1080 are not changed in any way. The output environment of function block 1070 may include control flow 1086, return value 1088, variables that may be pointed to 1090, and global variables 1092. As illustrated, function block 1070 takes as input arguments 1082 and 1084 ("x" and "y" respectively).

Some variables may belong to more than one category in the input environment, output environment, or both. For example, argument 1084 may point to argument 1082, or argument 1084 may point to one of global variables 1092. The software-to-hardware compiler may ensure that each variable instance may only be allowed to get passed into a block at a single point. This prevents the need to update multiple copies of a variable.

The ANSI-C standard specifies that a function's arguments should be copied when a function is called (i.e., within a function call, the arguments may be changed without affecting any global variables).

When functions have pointers as arguments, where those pointers are used to access other values within the program, invariant analysis and symbol set inference analysis (to be discussed below) may be used to determine the set of variables that may be accessed by that pointer.

Some functions may return values. The return value of a function may be treated as a global variable, which is written to by the function.

A function block may form expressions that may be used by the calling function. A function block may need to compute expressions that were already calculated by the calling function. Every function call-site is different, so expressions computed at one call site may not have been computed at another.

The software-to-hardware compiler may be configured to make no attempt at using expressions across function boundaries. In another suitable approach, the software-to-hardware compiler may be configured to generate "global expressions" or any other suitable shared resource that may be used to avoid recalculating the same expression.

Recursive functions introduce difficulties into the software-to-hardware compilation. These difficulties stem from the fact that a function is a shared resource that only releases it's lock when it returns (i.e., a value). A function call will stall until it can acquire exclusive use of the function block hardware. If a function was to call itself, the call would stall because the lock has not been released, but the lock will not be released until the function completes, and hence the hardware will deadlock. In order to avoid the deadlock situation, the software-to-hardware compiler may be configured to generate circuits that do not deadlock. The technique for doing this will be illustrated using the following example program:

```
int f(int x, int y) {
    if (y == 0)
        return g(x, y);
    else
        return 0;
}
int g(int x, int y) {
    return h(x, y);
}
int h(int x, int y) {
    return f(x + y, y - 1);
}
```

Figure 49:
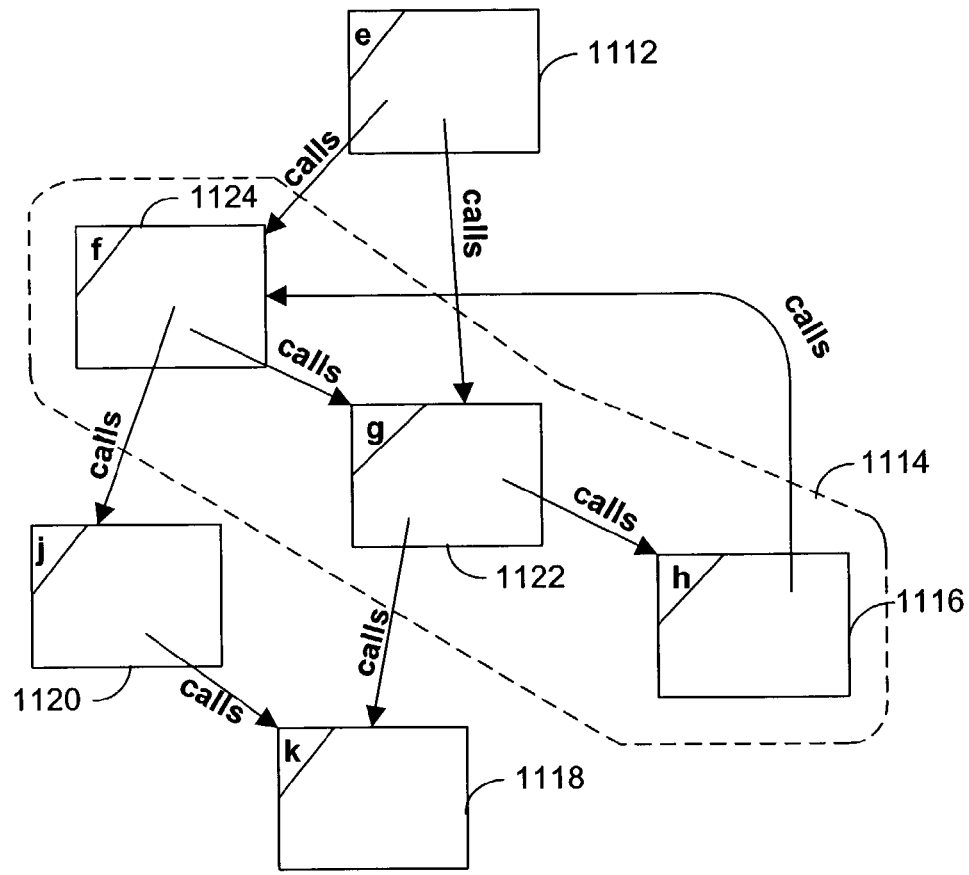
FIG. 49 is a block diagram of an illustrative call graph in accordance with the present invention.

The software-to-hardware compiler may construct the program's function call graph. Sets of potentially recursive functions are identified. FIG. 49 illustrates function call graph 1110 corresponding to the above program. Recursive call set 1114 includes functions 1124, 1122, and 1116, which correspond to functions f, g, and h, respectively, defined above. Functions 1112, 1120, and 1118 are illustrative functions that may call or be called by functions 1124, 1122, and 1116.

Figure 50:
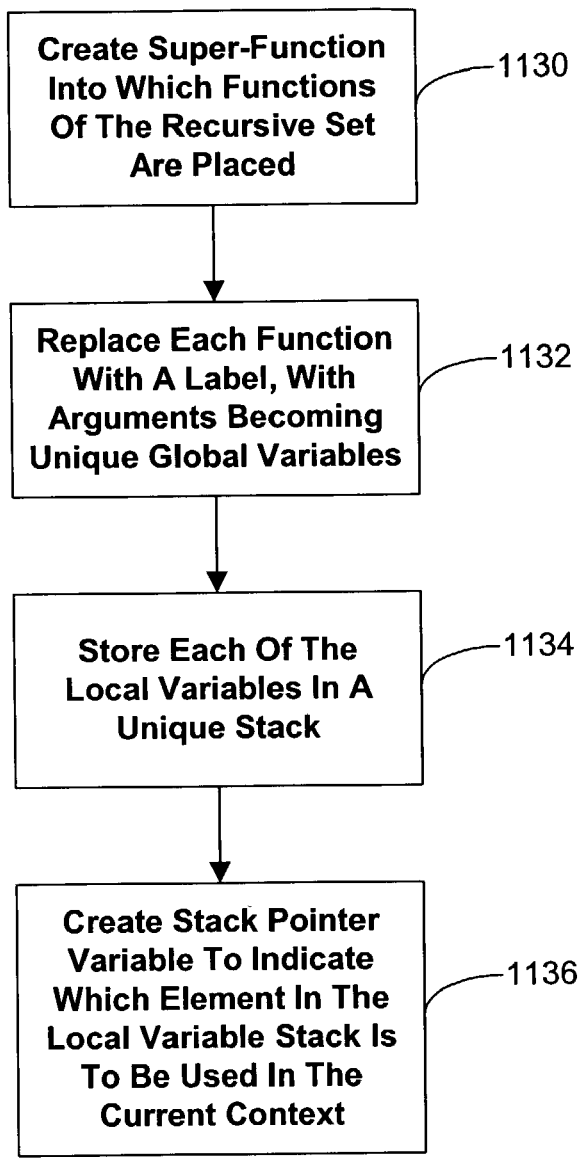
FIG. 50 is a flow chart of illustrative steps involved in compiling a recursive function into hardware in accordance with the present invention.

All functions that form a potentially recursive set may be collapsed as shown by the flow chart of illustrative steps of FIG. 50. At step 1130, a new super-function is created into which the functions of the recursive set are placed. At step 1132, each function is replaced with a label, and its arguments become unique global variables. In software, local variables are stored on a single global stack. Although this technique may be used in the hardware implementation, parallelism may be inhibited because all variable accesses typically pass through a single RAM. Alternatively, as shown at step 1134, each local variable may be stored in a unique stack (i.e., each variable is converted into an array), and, at step 1136, a stack pointer variable is introduced to indicate which element in all the variable arrays is to be used in the current context. Every function has an associated stack depth value (e.g., indicated using "#pragma" in the source code), and this stack depth indicates the depth of the variable arrays.

Figure 51:
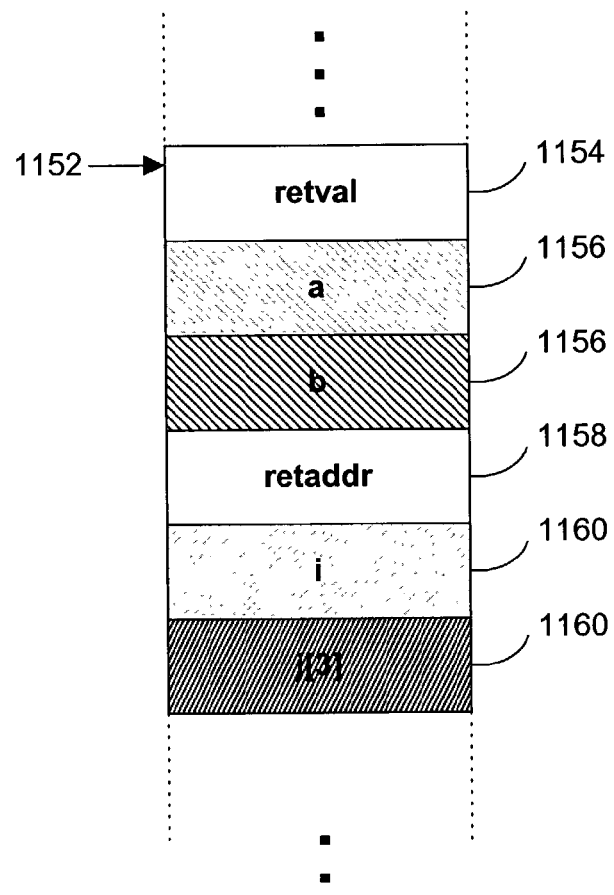
FIG. 51 is a block diagram of an illustrative function stack in accordance with the present invention.

FIG. 51 shows an illustrative unique function stack 1150. Stack 1150 includes return variable 1154, which may be a global variable indicating the return value of the function. Also stored in stack 1150 are arguments 1156, which are the parameters passed into the function. Return address 1158 indicates the location of the program to which to return after completing the execution of the instant function. Also stored in stack 1150 are local variable 1160 that are instantiated from within the instant function. Any other suitable objects may be stored in stack 1150. Stack pointer 1152 may be used to indicate which element is to be used in the current context.

Figure 52:
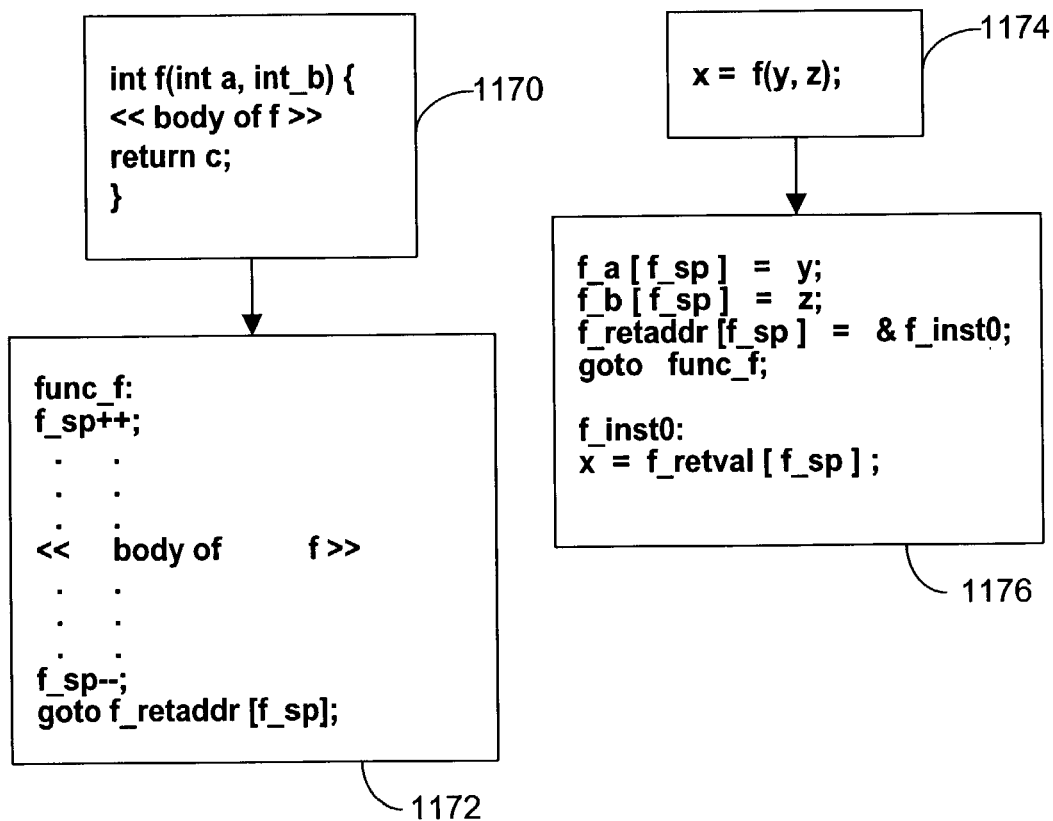
FIG. 52 is a block diagram of an illustrative way in which a function and a function call may be collapsed in accordance with the present invention.

Calls to any collapsed function may be performed by assigning values to appropriate argument variables, and then issuing a goto command to the function label. Some calls may be identified as recursive calls. Recursive calls additionally augment the stack pointer variable. This process is illustrated in FIG. 52, which shows definition 1170 of function f being collapsed into collapsed function 1172. The software-to-hardware compiler compiles program 1170 into a form where symbol set inference analysis is made easier.

In C, most variables are typically stored in a stack. The stack uses a 32-bit wide memory. Maintaining this size in hardware may cause the hardware to become large and slow. To obtain gains, the software-to-hardware compiler may implement a separate stack for every function. Symbol set inference analysis may then optimize the size of the stack on an individual basis. This preferably results in the resultant hardware not always being 32-bits wide, not using only a single memory device (i.e., allowing multiple memory devices to hold copies of the stack for increased parallelism as described above), or both.

As shown in FIG. 52, collapsed program 1172 is implemented in hardware using the individual stack implementation of FIG. 51. The "f_sp" variable refers to the stack pointer variable. After execution of function f is completed, a goto statement directs processing to continue at the return address defined by f_retaddr[f_sp] (i.e., indexed by the stack pointer).

Function call 1174 may be collapsed in accordance with the hardware implementation of the function as shown by collapsed function call 1176. Collapsed function call 1176 includes the assignment of the function arguments to the argument variables in the stack indexed by the stack pointer. The return address is defined to be the location just after the goto statement that directs the process flow to function f (i.e., collapsed function 1172). After completion of the execution of function f, the return value is stored (i.e., in variable "x").

The program transformations described above result in the super-function shown below. The resulting call graph should be acyclic, and arbitration may be used to resolve simultaneous function calls without the possibility of deadlock.

```
Int f_x[Stacksize], f_y[Stacksize],
    f_retval[Stacksize], f_retaddr[Stacksize];
Int f_sp = 0; //stack pointer
Int g_x[Stacksize], g_y[Stacksize],
    g_retval[Stacksize], g_retaddr[Stacksize];
Int g_sp = 0; //stack pointer
Int h_x[Stacksize], h_y[Stacksize],
    h_retval[Stacksize], h_retaddr[Stacksize];
Int h_sp = 0; //stack pointer
Void super(int which_fn) {
    Switch (which_fn) {
    Case f: goto f;
    Cage g: goto g;
    Case h: goto h;
    };
f:
    ++f_sp;
    If (f_y == 0) {
        g_x[g_sp] = f_x[f_sp];
        g_y[g_sp] = f_y[f_sp];
        g_retaddr = &g_call_0;
        goto g;
g_call_0:
        f_ret[f_sp] = g_ret[g_sp];
    } else {
        f_ret[f_sp] = 0;
    }
    --f_sp;
    if (f_retaddr[f_sp] != 0)
```

-continued

```
        goto f_retaddr[f_sp];
    else
        goto super_end;
g:
    ++g_sp;
    h_x[g_sp] = g_x[f_sp];
    h_y[g_sp] = g_y[f_sp];
    h_retaddr = &h_call_0;
    goto h;
h_call_0:
    g_ret[f_sp] = h_ret[g_sp];
    --g_sp;
    if (g_retaddr[g_sp] != 0)
        goto g_retaddr[g_sp];
    else
        goto super_end;
h:
    ++h_sp;
    f_x[g_sp] = h_x[f_sp] + h_y[f_sp];
    f_y[g_sp] = h_y[f_sp] - 1;
    h_retaddr = &f_call_0;
    goto f;
f_call_0:
    h_ret[f_sp] = f_ret[g_sp];
    --h_sp;
    if (h_retaddr[h_sp];
        goto h_retaddr[h_sp];
    else
        goto super_end;
super_end:
    return;
}
```

In C, it is possible to declare local variables within any set of curly braces, including those nested within conditional expressions. In software, every time a variable declaration is encountered, space is reserved on the stack at that point. In view of this, the code shown below reserves 100 words on the stack (i.e., as opposed to 150 words). At the end of each curly brace, the stack space is reclaimed.

```
if (c) {
    int x[100];
    << code using x[ ] >>
} else {
    int y[50];
    << code using y[ ] >>
}
```

As a further optimization, the software-to-hardware compiler may bind together local variables using nested unions. This allows local variables that will never coexist (e.g., as is the case with x[ ] and y[ ] in the code above) to share the same memory bits.

C permits functions to take a variable number of arguments (i.e., using the " . . . " notation). The software-to-hardware compiler may convert the argument into a union of all the possible calling instances. A special union field may be assigned an enumerated value to indicate which instance of arguments is currently valid.

As previously mentioned, the software-to-hardware compiler may take symbol set inference analysis into account when generating hardware constructs from corresponding software constructs.

Most processors work best when all data is handled in predetermined, consistent quantities. For example, many processors handle data in only 32-bit quantities. In these cases, all software operations are optimized for 32-bits such that handling data that requires less than this should be padded out to the standard 32-bit size.

Hardware designs, however, typically treat wires and latches as scarce resources. Data that can be represented in fewer than 32-bits should be represented as such with the consequence being that resulting adders, multipliers and registers will reduce in size. Whatever reductions to data widths are made, the resulting hardware should behave as though the data was 32-bits wide. Although 32-bit optimization is described herein, it will be understood that hardware may be generated for any suitable quantity (e.g., 64-bit, 128-bit, etc.) that is optimized for a particular processor.

The software-to-hardware compiler may be configured to automatically reduce data-widths to satisfy the above constraint (i.e., treating wires and latches as scarce resources), while generating smaller circuits. For example, the software-to-hardware compiler may determine to what extent a region may need to be defined such that extraneous bits that will never likely be accessed are not included in the resultant region. In one suitable approach, symbol-set inference analysis may be used to accomplish this.

This optimization may be applied to the initial abstract syntax tree before creating a control/data flow graph. The control/data flow graph may be used to generate more efficient hardware by considering the symbol sets associated with each variable, subexpression, or both. For example, pointers only need to affect objects to which they may point. All other objects remain invariant.

Every time a variable is written to, or an expression is calculated, an annotation may be added to indicate the range of possible values that the variable or expression may take on.

The range of possible values is represented as a pair of symbol sets. This pair may include a maximal symbol set and minimal symbol set. A symbol set is a set of symbolic (or numeric) values. The maximal symbol set is the largest possible set of these values. The maximal symbol set may include values that do not ever actually appear on the wire, while the minimal symbol set is a subset of the possible values that may appear on the wire.

Symbol set inference attempts to increase the minimal symbol set, and reduce the maximal symbol set until the two sets are equal. When this is the case for all wires in the control/data flow graph, then symbol set inference may be considered to be complete.

Every integer in a C program may behave as though it can use a 32-bit representation. An illustrative symbol set corresponding to an integer may have, for example, any of the following forms: a set of discrete values not exceeding some number (e.g., 32) (e.g., {0, 4, 16, 17, 19}); a range of values with a given interval between them (e.g., {(−4); −4+6, (4)+6+6, . . . , (−4)+(6*N)}); and a negated range, indicating values that wraparound an N-bit boundary (e.g., {5000, 5000+1000, . . . , (2^N wrap), . . . , −5000+1000, −5000}). Any such suitable symbol set may be used to represent an integer.

When symbols of a symbol set are used for enumeration, according to the ANSI-C standards, the symbols are numbered sequentially (i.e., unless overridden). When an integer is used as an enumeration, only valid enumeration values are allowed. The software-to-hardware compiler may therefore keep a record of an enumeration's symbolic names and their values.

The software-to-hardware compiler may ensure that all symbols will eventually have a binary representation, but for ease of optimization, most symbols may be kept symbolic until the last phase. With regard to pointers, for example, addresses are held symbolically (e.g., {&a, &b, &c}). Pointers may also point to array elements. To prevent large symbol sets, the software-to-hardware compiler may need only consider two cases: the case where a pointer only points to one specific element within an array; and the case where a pointer points to any element within an array.

Aliasing or pointer casts may generate symbol sets that include both address and integer values. The software-to-hardware compiler may ensure that a variable with this property may not be permitted to have values that would not be consistent with its use. For example, multiplying and dividing a variable by another variable may only be allowed when the variables are integers and not addresses. Likewise, pointer arithmetic is only permitted on pointers.

Arithmetic may be performed on a pointer cast as an integer. Providing the net effect of that arithmetic is to leave the pointer value unchanged, then the result may be able to be used as a valid pointer. It will be understood that symbolic addresses may take on any numerical value, provided that no two symbolic addresses take on the same value (i.e., if the two symbolic addresses are in the same symbol set). It will further be understood that symbolic addresses may take on the same values as numerical values within the same symbol set.

Arrays may be assumed to include elements that may take on any value from an array-wide symbol set. The array itself cannot be directly manipulated, and so an array-level symbol set is not necessarily needed.

Although structures may be assigned to one another (e.g., using a bitwise copy), in one suitable approach they may be treated as individual assignments, making a structure-wide symbol set not necessary.

Members of a union may be disjointed into regions (e.g., associated with integral objects that make up the union). Each region has a symbol set, but no assertions about the symbol set for objects composed of more than one region can be made. That is, except that the symbol set of objects composed of more than one region is at most the cross-product of the symbol sets for all the regions.

Functions may have addresses and may be called (indirectly) using a function pointer. Because an indirect function call has different syntax to an indirect memory access, function address symbols may share values with data address symbols.

Figure 53:
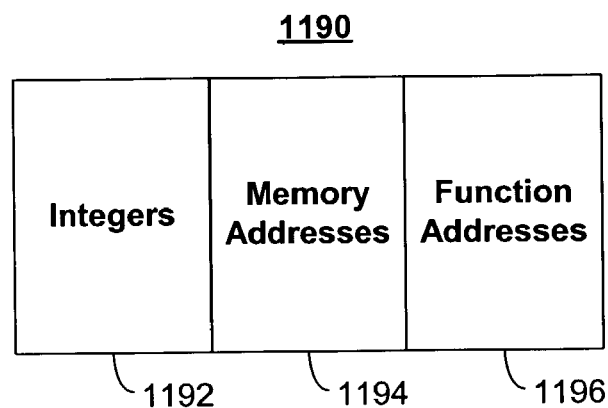
FIG. 53 is a block diagram of an illustrative region in accordance with the present invention.

A symbol set may be composed of three parts, each containing zero or more elements. These three parts of a symbol set 1190, as illustrated in FIG. 53, may include a set of integers 1192 (or an integer range), a set of memory addresses 1194, and a set of function addresses 1196.

Memory and function addresses may be kept symbolic, and may represent a single object, or an array of objects. It may be assumed that it is not possible to generate a memory address for an object by performing pointer arithmetic on another object (i.e., consistent with the ANSI-C standard).

Addresses may be bit-truncated, and later reassembled back into their original values. It may not, however, be possible to bit-splice two addresses together.

The software-to-hardware compiler may be able to represent an entire symbol set that needs to be bit-spliced. For example, "{1, 2, 3, 6} [1 . . . 3]" may be used to represent bits 1 to 3 of the symbol set "{1, 2, 3, 6}". In this example, the symbol set may be collapsed to "{1[1 . . . 3], 2[1 . . . 3], 3[1 . . . 3], 6[1 . . . 3]}={0, 1, 1, 3}={0, 1, 3}," but this is often unnecessary and may even hinder some optimizations. By keeping symbol sets expanded as much as possible, it may be possible to recognize when two equal symbol sets are being spliced back together again. However, sometimes it may be necessary to collapse symbol sets, and in these cases, addresses may be left with bit-splicing annotations.

When symbol sets need to be spliced together (e.g., when a C object that depends on two or more regions, which have different symbol sets, is accessed), it may be assumed that only equivalent addresses are spliced back together. A note may be made of bit-spliced addresses that remain incomplete. For example:

{&a[0 . . . 15], &b[0 . . . 15], &c[0 . . . 15]}
  bit-spliced with
{&a[16 . . . 31], &b[16 . . . 31], &d[16 . . . 31]}
  gives
{&a, &b} U (Remainders: {&c[0 . . . 15]} X {&d[16 . . . 31]})

When integers are first defined, they may take on an extreme pair (i.e., minimal and maximal) of symbol sets, as shown in the table below:

| Type | Minimal Symbol Set | Maximal Symbol Set |
|---|---|---|
| Char | { } | {0, 1, . . . , $2^8 - 1$} |
| Short | { } | {0, 1, . . . , $2^{16} - 1$} |
| Int | { } | { $-2(2^{16})$, $-(2^{16}) +1$, . . . , $2^{16} - 1$ } |
| Int: B(bitfield) | { } | {0, 1, . . . , $2^B - 1$} |
| Unsigned | { } | {0, 1, . . . , $2^{32} - 1$} |
| Long | { } | {0, 1, . . . , $2^{32} - 1$} |
| Float | These are treated as special structures. | |
| Double | (e.g., a composition of unsigned integer bitfields) | |
| Pointers | { } | { All_type_compatible_objects } |

Some variables in a C program may be initialized to given values. The entire state of the C program may be encapsulated by the state of all the regions. Because each region is distinct, each region may be assigned an initial state. It follows, therefore, that each region may be assigned an initial symbol set.

Symbol sets may be calculated by traversing through the abstract syntax tree. At any stage, an environment encapsulates the current symbol sets for all C variable objects.

Some C variable objects may contain integral object regions that overlap. In these cases, the symbol set for the most recently used variable may be left intact, while aliased variables may have their symbol sets bit-truncated. The net result is that symbol sets do not contain information that may conflict between aliased C variables.

With regard to expressions, expressions are formed by combining one or more expressions with an operator. The resulting symbol set for an expression depends on the symbol sets for the sub-expressions as well as on the operator used.

An expression's symbol set may be required to still be a valid symbol set (i.e., either a discrete set of values (subject to a maximum set size) or a range of values with a fixed distance between them). This implies that an operator generates a more conservative estimate of a symbol set (i.e., including values that could never actually occur). This is erring on the side of safety, and prevents symbol sets from getting too large.

Type conversion from a (void*) generates an expression that includes either all integer values or all address values. This type conversion may also serve to indicate that the program should not have reached a particular point (i.e., where the conversion takes place) if the expression consists of address values when integer values are expected or vice versa. This gives rise to the potential for working back through existing symbol sets, extracting values that would lead to illogical values at a later point. This technique may require computing symbol sets of inputs given the output symbol set, and may thus not be feasible for all operators, expressions, or both.

Figure 54:
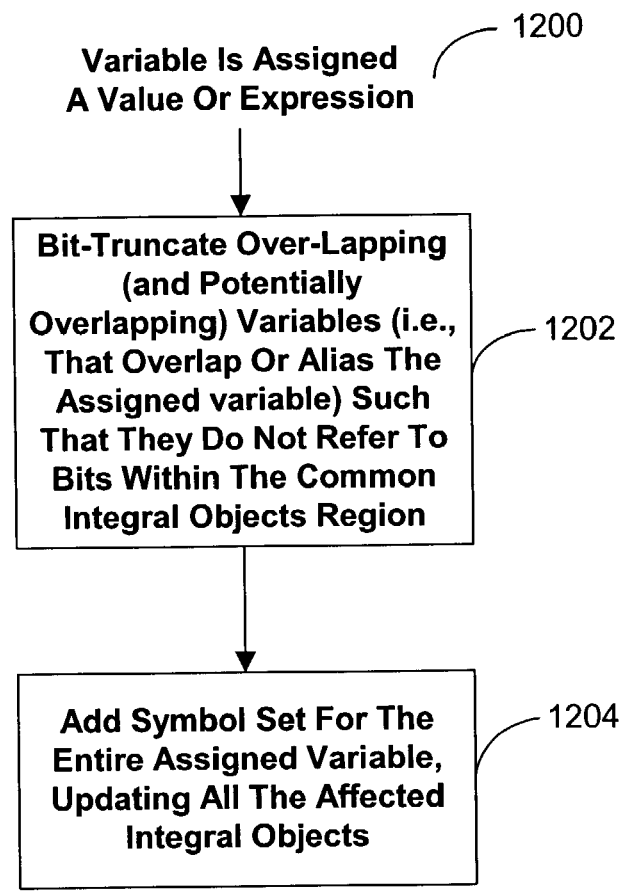
FIG. 54 is a flow chart of illustrative steps involved in updating an environment in response to a variable assignment in accordance with the present invention.

As shown by the flow chart of illustrative steps involved in updating an environment in response to a variable assignment of FIG. 54, when a variable is assigned a value (or an expression) at step 1200, then the symbol set for that variable (held within the current symbol set environment) may be updated. Updating the environment may be done taking into account that symbol sets for other variables that overlap or alias the assigned variable may need to be updated as well. At step 1202, overlapping (and potentially overlapping) variables (i.e., regions) may be bit-truncated such that they do not refer to bits within the common regions. At step 1204, the symbol set for the entire assigned variable is then added, updating all the affected regions.

In the case of array assignments, only one array element is assigned a new value at a time, such that the symbol set for the entire array is augmented, rather than overwritten.

In the case of pointer assignments, all C-objects that may be affected are augmented (not overwritten) with the assigned value. C-objects that overlap may be augmented twice, and may need to be partitioned into integral object level symbol sets.

In one suitable approach, pointer arithmetic may only be permitted on array-based pointers, and in particular, pointer comparisons may only be made on pointers to the same array (i.e., as specified by the ANSI-C standard). This makes pointer operations independent of their symbolic encoding to a large extent.

With regard to IF-THEN-ELSE statements, the resultant IF-THEN-ELSE blocks may temporarily split the control flow based on a conditional expression. Often, the conditional expression ensures that certain values within symbol sets are not possible in the THEN-part or in the ELSE-part. The final symbol set environments for the THEN-part and the ELSE-part may be merged (i.e., unioned) to produce the final environment for the whole IF-THEN-ELSE block.

With regard to functions, inlined functions may be traversed as though they were part of the original code. Non-inlined functions may be shared, and the symbol sets for function-level variables may be required to reflect all the possible values they may take (i.e., not on an instance by instance basis, but over the entire program).

A function that takes pointers as arguments may need symbol sets to indicate the set of all possible objects (i.e., regions) that may be read or modified by it.

Each function may maintain an image of an environment that will represent the superset of all possible values for all possible arguments to the function (including variables that can be indirectly modified by the function), as well as an image of the environment resulting from calling the function with the input environment. Every time a function call is made, the current environment may be used to augment the function's environment. The symbol sets for the variables modified by the function may then be recomputed, and the calling function is then resumed with the resulting environment. If a function call is made that does not augment the function's input environment, then the function's output environment may be used directly without the need to re-infer the symbol sets.

With regard to loops, at the end of a loop, the body of the loop is re-run with the symbol set environment used for the first loop iteration augmented with the environment from the end of the loop. Each loop iteration may augment the symbol set environment, and this entire process may end once a fixed point is reached, whereby the environment at the end of the loop is the same as the environment at the beginning of the loop.

It may take a relatively long time to reach a fixed-point. A number of assumptions may therefore be needed in order to get to a fixed-point quicker. In one suitable approach, only N loop iterations may be allowed, and it may be assumed that with each iteration, each minimal symbol set approaches its maximal symbol set. This process may be repeated again, but the chances of the loop not reaching a fixed point over the next N loop iterations may be greatly reduced. This technique is merely illustrative. Any other suitable technique may be used to extrapolate integer values (e.g., based on what operations are performed within the loop body).

It may be impossible (i.e., incomputability problem) for the software-to-hardware compiler to infer minimal symbol sets in general. This may result in a loss of some significant hardware reductions. One suitable approach for getting around this may be through the use of assert statements.

Assert statements provide the programmer with a mechanism to indicate that certain values of variables are not possible. For example, "Assert((x==5)||(x==6))" indicates that the maximal (and minimal) symbol sets for x are limited to {5, 6}. "Assert((x>=3) && (x<10) && (x % 2==0))" indicates that the maximal (and minimal) symbol sets for x are subsets of {3, 5, . . . , 9}. It may not be possible for the software-to-hardware compiler to make use of arbitrarily complex assert statements (i.e., incomputability problem again), but it may be possible to include support for some useful assertions. For example, function call optimization may benefit from the knowledge that two pointer arguments do not point to the same object. For example, "Assert(p!=q)" may be used in this situation.

It will be understood that two variables may have the same symbol set, but this does not indicate that the two variables always take the same value as each other. This property is known as equivalence, and if it refers to the same variable before and after some operations, it is referred to as invariance.

Invariance and equivalence may assist symbol set inference, particularly when two symbol sets are bit-spliced together. Invariance may also be used when producing the control and data flow graphs because loop invariants do not need to be stored in the looping-register.

When all the symbol sets are known, there may be some variables with empty symbol sets. These variables may have never been initialized, and may generate a warning if they are used for an operator. Some symbol sets may contain a single element. Variables with such a symbol set are constant because they can only take one value.

When all the symbol sets are known, and regions have been assigned RAM locations (or registers), symbolic values (e.g., addresses) may be given numerical values. There is potential benefit in assigning indirect values to addresses (e.g., encoding an address as a relatively small number that may be used to lookup the real address). The advantage of this approach is that while the address is being moved around, it would require fewer wires, latches, or both to store the indirect value. If an object already permits some numerical values, then these values may be reused to represent indirect addresses. Addresses for objects that may be of the same type may reuse the numerical data values. Addresses for objects that cannot be the same type do not need to have different values.

Pointers to array elements may be encoded by bit-splicing the array indices together. This presumes that all indices have been padded to be a power of two. Alternatively, efficient address decoding logic may be generated. Array pointers need not use an indirect addressing scheme. Certain special cases may be taken into account, such as when a pointer always references the same array.

Invalid pointer references may occur, but are guaranteed not to occur if the program obeys all the laws of ANSI-C. It may always be possible to cast an arbitrary integer to a (void*) and then to a pointer of some type. This pointer may actually point to valid data especially if an indirect addressing scheme is used.

For a given object, all pointers may be either direct or indirect. Also, all pointers in a symbol set point to RAM locations (or registers) accessible from the same platform (i.e., hardware and software pointers are not mixed).

All instances of object addresses may be assigned an individual encoding, platform, or both. More particularly, every address reference (e.g., even to the same object) may be allowed to have a different encoding, platform, or both. When an object may hold one of many addresses, all those addresses may share the same encoding, platform, or both (i.e., a form of encoding unification). The result of this process is sets of addresses that may share the same encoding, but with no such constraint between addresses in different sets.

Another aspect of the present invention is directed toward communication between hardware devices, between software devices, and between software and hardware devices. Hardware devices include any suitable device implemented in hardware, such as programmable logic resources. Software devices include any suitable device that executes software constructs, such as microprocessors. It will be understood that a device may include multiple devices coupled to one another.

According to the present invention, communication between devices can be implemented using a FIFO buffer. For clarity, a FIFO will be regarded as having two separate interfaces: one which is responsible for adding data elements to the FIFO (i.e., a "push" interface), and one which is responsible for reading and removing data elements from the FIFO (i.e., a "pop" interface). A push interface also indicates when it is able to accept a new data element, and a pop interface indicates when it is possible to read and remove a data element. It will be appreciated that the present invention may be implemented using data structures other than FIFO's. For example, stacks, priority queues, or any other suitable data structure or selection algorithm may be used in accordance with the present invention.

In hardware, one suitable embodiment of a FIFO interface is a set of data wires and control wires. Data wires may be used to carry a binary representation of the data element to be pushed or popped. One control wire indicates whether a push or pop can be completed, and another control wire indicates whether a push or pop should be attempted. The behavior of a FIFO when a push or pop is attempted but cannot be completed is undefined, and is regarded as an illegal use of the interface.

In software, a FIFO interface may be implemented as a single function call or set of function calls (e.g., a set of C-functions, C++-methods, or any other suitable construct in C, C++, Modula, JAVA, LISP, etc.). At minimum, a push interface may be a single function with a single argument and no return value. The argument of such a function is the data element or a pointer to the data element required to be added to the FIFO. Such a function would only complete when the FIFO has successfully accepted the data element. At minimum, a pop interface in software may be a single function with no arguments and a single return value. Such a function would only complete when the FIFO has successfully removed a data element, and the return value would be a copy of the data element removed or a pointer to a copy of the data element removed.

In one suitable arrangement, one FIFO interface may be instantiated in a hardware device and the corresponding FIFO interface may be instantiated in a software device. According to the present invention, these interfaces are used as though there was a single FIFO buffer between the devices.

In another suitable arrangement, both FIFO interfaces may be instantiated in hardware. That is each interface resides in a different physical hardware device.

In general, multiple independent FIFO buffers may be needed between devices (i.e., software devices, hardware device, or both). Although each FIFO buffer has only one push interface and one pop interface, the size of data elements in each FIFO may be different.

Figure 55:
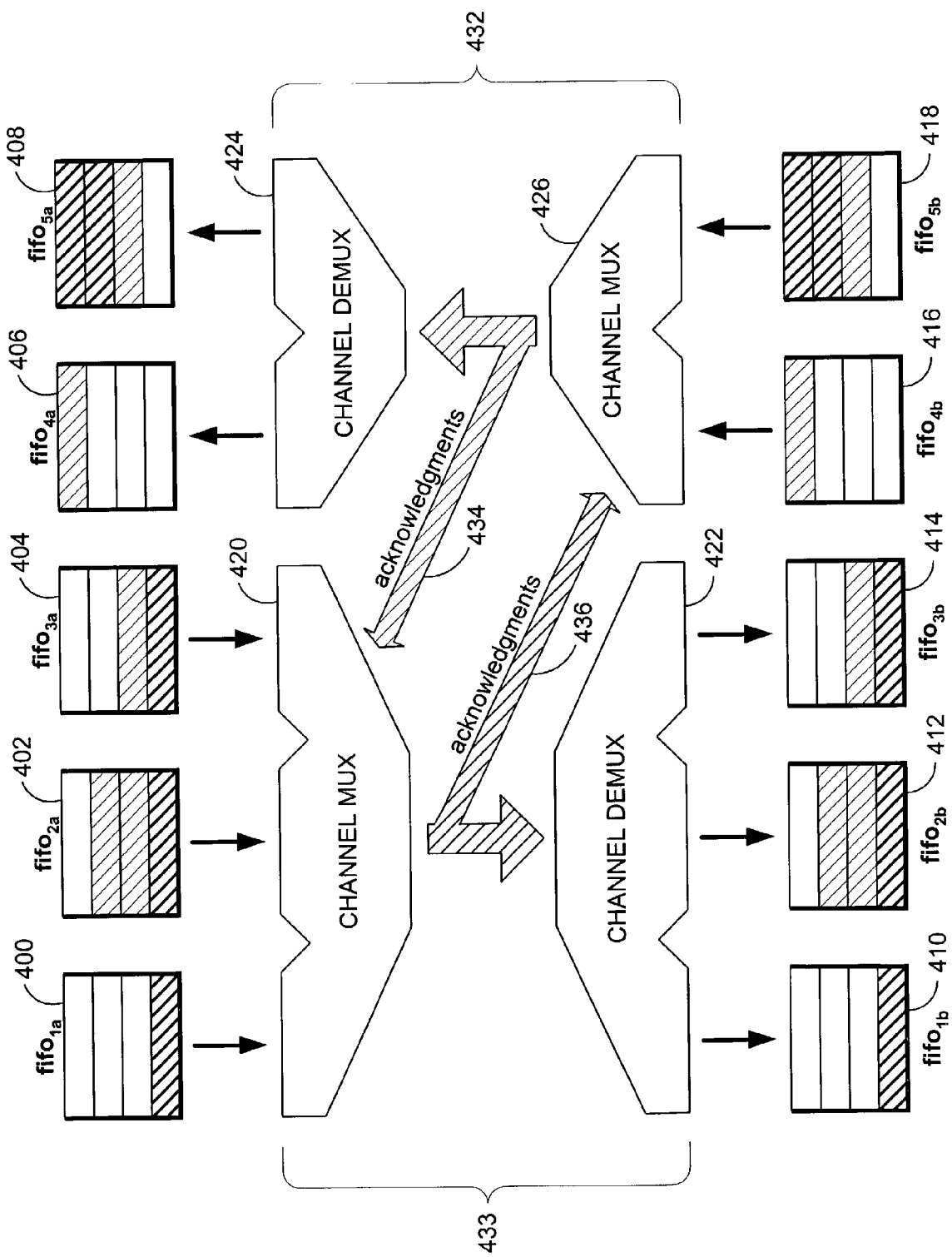
FIG. 55 is a block diagram illustrating how communication may be accomplished between platforms across a channel in accordance with the present invention.

FIG. 55 shows how several FIFO's buffers communicate between two separate devices. The entities in FIG. 55 are intended to replicate the functionality of five separate FIFO buffers. It will be understood that any suitable number of FIFO buffers may be used and that FIG. 55 is merely illustrative. Each FIFO buffer has two interfaces available to the user who will ultimately be unaware of the channel multiplexer and channel demultiplexer. For example, a push interface for buffer 400 and a pop interface for buffer 410 make up the interfaces needed for a single FIFO buffer. FIFO push interfaces for buffers 400,402, and 404, and FIFO pop interfaces for buffers 406, and 408 reside on one device, and FIFO pop interfaces for buffers 410,412, and 414, and FIFO push interfaces for buffers 416 and 418 reside on the other device.

These buffers will be referred to herein as "push interface buffers" and "pop interface buffers." Interface buffers reside on the same device as their respect interfaces. The number of data elements that each of these buffers can hold is not important, except that a push interface buffer needs to know the maximum number of data elements that its corresponding pop interface buffer can hold. For purposes of illustration and not by way of limitation, it will be assumed that all buffers hold the same number of data elements.

Hardware resources, software resources, or both may be added for transporting data elements from push interface buffers to pop interface buffers. In one suitable embodiment, two separate channels are used to transport data elements, one in each direction. This is illustrated in FIG. 55 in which channel 433 is a unidirectional channel that carries data elements from push interface buffers 400,402, and 404 to pop interface buffers 410, 412, and 414, respectively. Channel 432 is also a unidirectional channel that carries data elements in the opposite direction—from push interface buffers 416 and 418 to pop interface buffers 406 and 408.

In another suitable embodiment, a single bidirectional channel may be used by time-multiplexing data being sent in either direction.

Each push interface buffer attempts to send a number of data elements to the corresponding pop interface buffer. When the pop interface buffer pops a number of data elements, an acknowledgment is sent to the push interface buffer (e.g., in acknowledgments 434 or 436). Until an acknowledgment is received, the push interface buffer assumes that all unacknowledged data elements still reside in the pop interface buffer. Thus, the push interface buffer will not send a data element that might overfill the pop interface's buffer.

As shown in FIG. 55, acknowledgments 436 are sent to push interface buffers 416 and 418 by pop interface buffers 406 and 408 via channel multiplexer 420 to channel multiplexer 426. Likewise, acknowledgments 434 are sent to push interface buffers 400, 402, and 404 by pop interface buffers 410, 412, and 414 via channel multiplexer 426 to channel multiplexer 420.

In one suitable approach, each acknowledgment may be used to acknowledge that a fixed number of data elements have been popped. This number may vary from FIFO buffer to FIFO buffer but should be constant during channel operation.

In one embodiment, a cluster of data elements may be sent across the channel of the present invention, where the size of clusters may vary during channel operation. The push interface buffer keeps track of the sizes of each cluster sent, and the pop interface keeps track of each cluster size received. Each acknowledgment may be used to acknowledge when a cluster of data elements have been popped.

In one suitable approach, the present invention may require that a channel multiplexer (e.g., multiplexers 420 and 426 of FIG. 55) combine packets from the pop interface buffers onto a single channel buffer. Extra hardware resources, software resources, or both may be used to transport packets from this single channel buffer to a channel demultiplexer.

Channel demultiplexers 422 and 424 determine to which pop interface buffer an incoming data element is destined. For every FIFO buffer whose push interface buffer resides on the same device and whose pop interface buffer resides on the same device, a unique identifier, referred to herein as a "FIFO ID," is assigned. When a push interface buffer sends a number of data elements, they are preceded with a header that indicates the FIFO ID as well as the number of data elements to follow. The sequence of a header followed by a number of data elements is referred to herein as a "frame." Channel multiplexers 420 and 426 are responsible for storing sequences of frames in their respective channel buffers, and channel demultiplexers 422 and 424 are responsible for decoding these frames.

Figure 56:
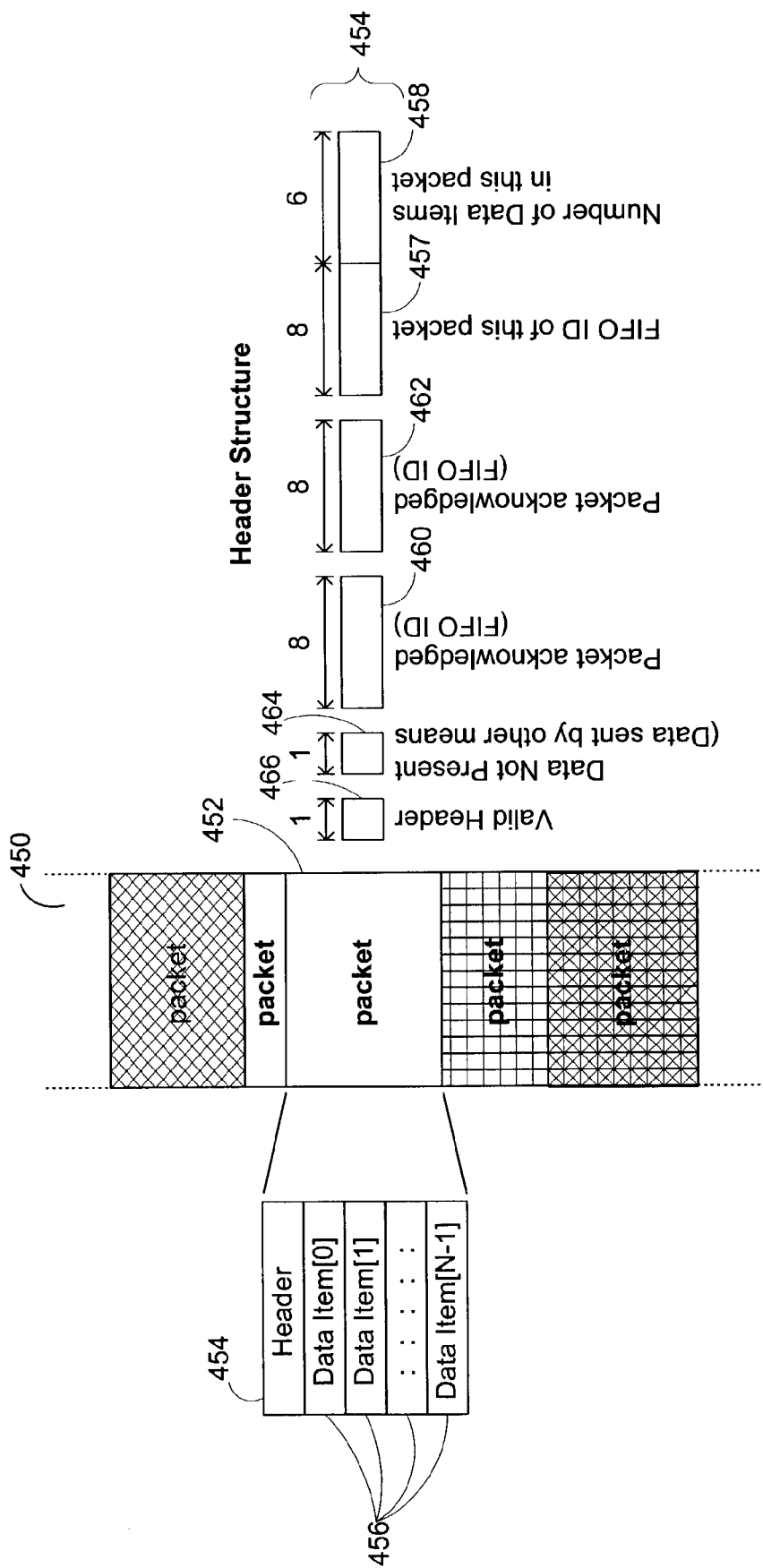
FIG. 56 shows an illustrative packet specification in accordance with the present invention.

FIG. 56 shows a typical sequence of packets, each packet 452 having a header 454 and data items 456. Header 454 may include bit 466 indicating whether header 454 is valid. Bits 457 indicate the FIFO ID associated with packet 452. Bits 458 indicate the number of data items in packet 452. Acknowledgments 460 and 462 may be sent as part of frame header 454. As shown in FIG. 56, the number of FIFO ID's is limited to 256, and frame header 454 allows up to two acknowledgments 460 and 462 to be sent. A FIFO ID of "0" may be used to indicate when no acknowledgment needs to be sent. When no data needs to be sent over a channel, a special dummy frame header may be used if the channel requires that data be sent every clock cycle. Bit 464 in frame header 454 may be used for this purpose.

Channel 450 is shown as being 32-bits wide. However, it will be appreciated that any suitable width channel may be used. Protocols may be devised that may accommodate smaller or larger data widths. It will be further appreciated that a fixed channel size does not necessarily imply that the interface buffer must be padded (or packed) into that fixed size.

The communication interface of the present invention may be implemented using any suitable data transport medium. In general, these transport media are in the form of a direct interconnect, shared memory, or a bus.

A direct interconnect transport medium couples two devices with point to point wires. For example, frames may be sent directly to the channel demultiplexer across the wires. If the width of the FIFO does not match the number of wires in the transport medium, then data serialization may be used.

Figure 57:
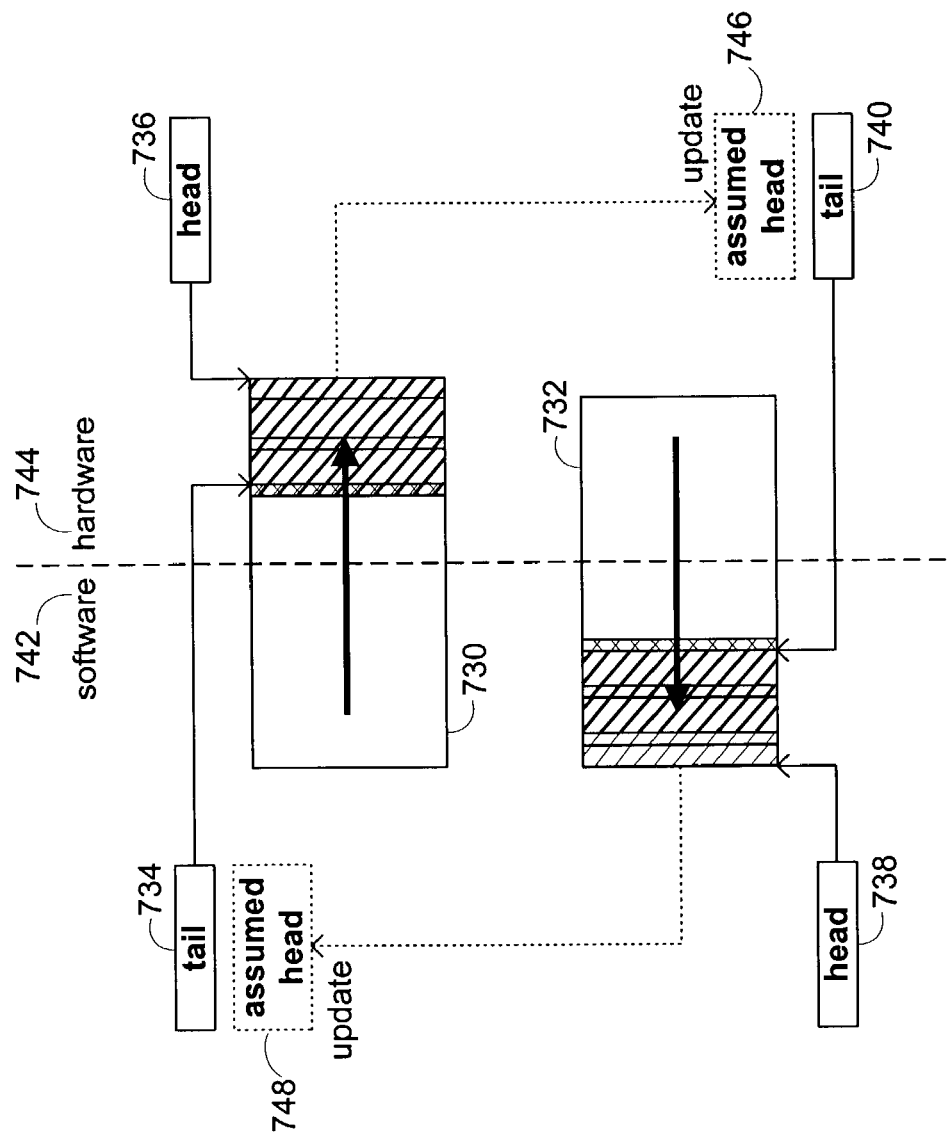
FIG. 57 is a block diagram of an illustrative shared memory-based channel implementation for software/hardware communication in accordance with the present invention.

A shared memory transport medium couples two devices with a dual-port memory (or a time-multiplexed single port memory). For example, the channel buffer in the channel multiplexer may be implemented using the shared memory to store frames as shown in FIG. 57. The channel multiplexer would be responsible for pushing frame data onto shared memory, and the channel demultiplexer could read directly from the same memory.

FIG. 57 shows buffers 730 and 732 in shared memory partitioned between software devices 742 and hardware devices 744. Each of devices 742 and 744 is responsible for a "head" and "tail" pointer used to push and pop data elements onto buffers 730 and 732. That is, software devices 742 use head and tail pointers 738 and 734 and hardware devices 744 use head and tail pointers 736 and 740. To avoid having the buffers popped when empty, or pushed when full, special acknowledgments are inserted in buffers 730 and 732 by one device to update the other device of the current value of the head pointer. These updates are stored using assumed head pointers 746 and 748. The values are conservative assumptions because by the time they are read, the actual head pointer may have changed.

Figure 58:
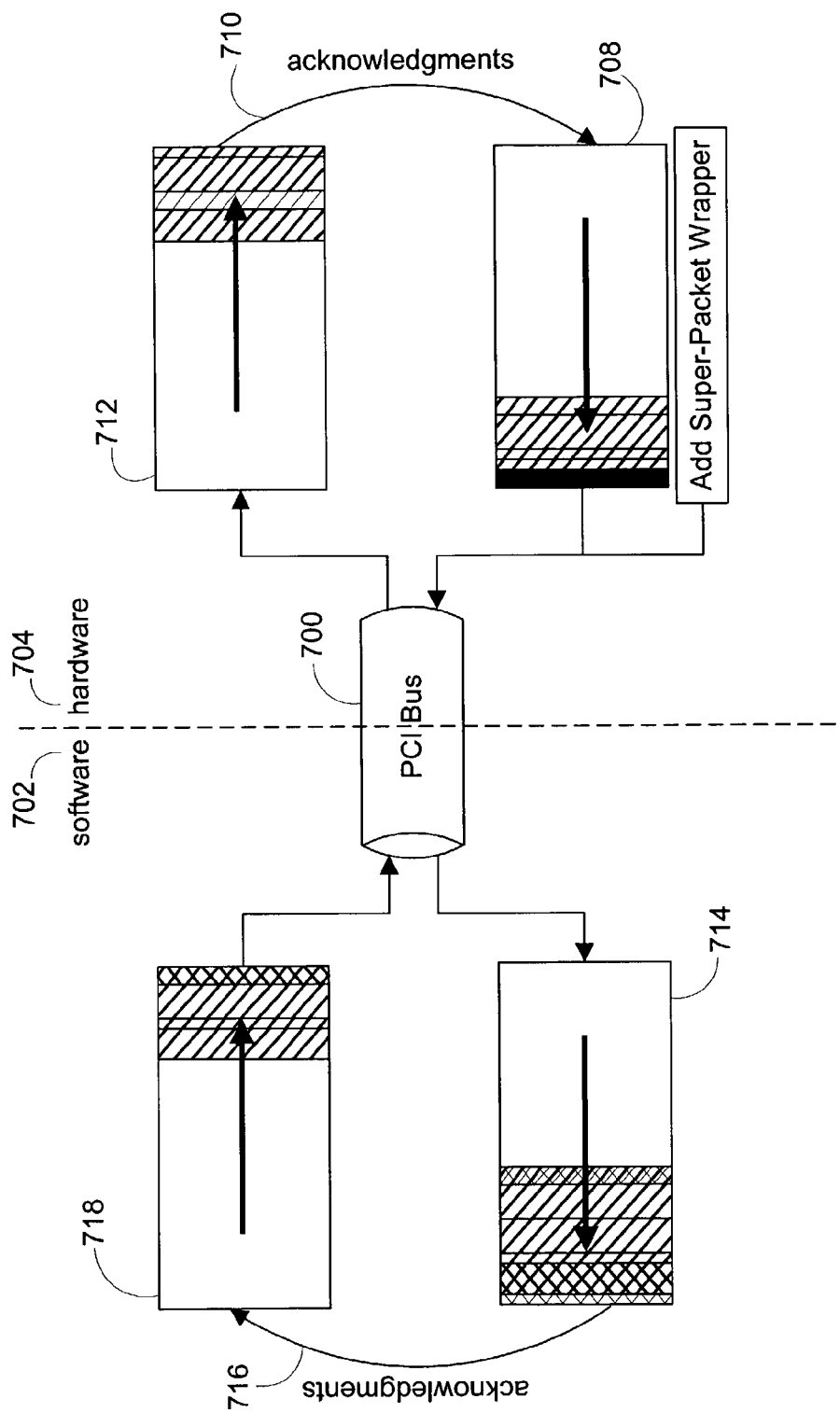
FIG. 58 is a block diagram of an illustrative bus-based channel implementation for software/hardware communication in accordance with the present invention.

FIG. 58 illustrates a bus-based channel implementation. In particular, FIG. 58 shows how a channel multiplexer and channel demultiplexer may be implemented using a PCI bus transport medium between a hardware device and a software device. It will be understood that any other suitable bus may be used. Software input buffer 714 and software output buffer 718 represent buffers contained in memory space that is accessible to both devices 702 and 704. Often, for speed of access, buffers 714 and 718 are located in the software device physical memory. Likewise, hardware input buffer 712 and hardware output buffer 708 represent buffers stored on hardware device 704.

Figure 59:
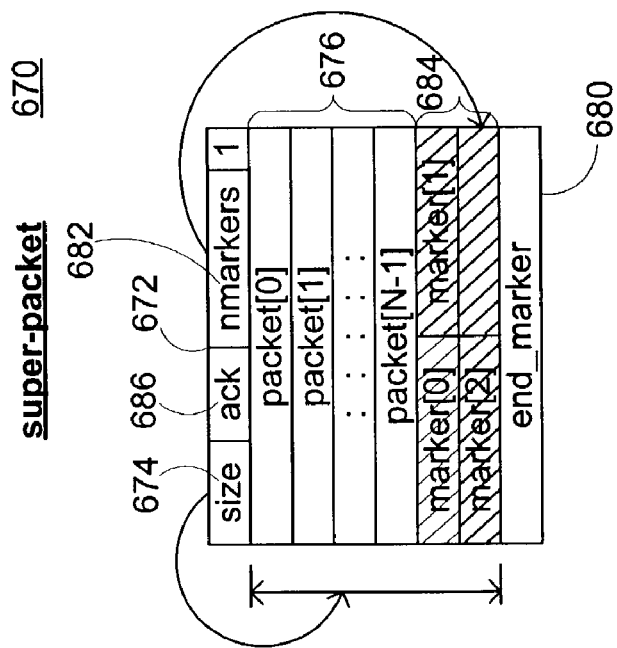
FIG. 59 is a super-packet in accordance with the present invention.

In one suitable approach, frames may be communicated from hardware device 704 to software device 702 in super-packets. As shown in FIG. 59, super-packet 670 includes a super-packet header 672, packets 676, markers 684, and an end_marker 680. Markers 684 include indices to entries 676 in super-packet 670 that could be mistaken for an end-_marker. Markers 684 will depend on data 676 within packets, and thus need to be determined for every super-packet 670. When super-packet 670 has been sent, no further super-packets can be sent until super-packet acknowledgment 716 is received back from software devices 702. Acknowledgment 716 is sent once the entire super-packet has been processed by software devices 702.

Super-packets are beneficial because they allow for the use of polling as opposed to interrupts and interrupt handlers. Provided that data is communicated on a regular basis between hardware device 704 and software device 702, this leads to a dramatic improvement in performance on systems where the software device can access software input buffer 714 at speeds much faster than the bus transfer speeds, or when a large number of relatively small super-packets need to be sent in succession.

Super-packet header 672 is used to detect the presence of end_marker 680. If the location after the location indicated in size bits 674 in super-packet 670 is not an end_marker, then the system is able to detect that the transfer of super-packet 670 to software input buffer 714 has not yet completed. When a super-packet transfer has completed, and the packets within have been transferred to their respective buffers, software devices 702 are able to use markers 684 within the super-packet to set all locations that could be mistaken for an end_marker to a value that is not an end_marker. Thus, the software input buffer is left in a state where a new super-packet is ready to be received. Initially, however, the software input buffer should contain values that are not end markers.

Super-packets may always be written from the start of the software input buffer. Thus, the super-packet header is always at the same location in memory. Super-packets are not needed for data transfers from software to hardware because the hardware is usually informed directly when a bus transfer is initiated and completed. However, software device 702 ensures that it does not overfill hardware input buffer 712, and so must sometimes wait for special acknowledgments from hardware device 704 indicating that packets have been popped from the hardware input buffer. These acknowledgments may be carried in super-packet header 672, using bits 686. Transfers of packets from software to hardware may be initiated from software. In one embodiment of the present invention, this can be achieved by writing to a special memory location reserved by the bus for the hardware device.

The present invention ensures that deadlock cannot occur by always allowing software output buffer 718 to send an acknowledgment of a super-packet in software input buffer 714, even though hardware input buffer 712 may be full. So as not to overfill hardware input buffer 712, hardware device 704 intercepts acknowledgments before they are added to hardware input buffer 712, and does not add them to the header input FIFO.

Figure 60:
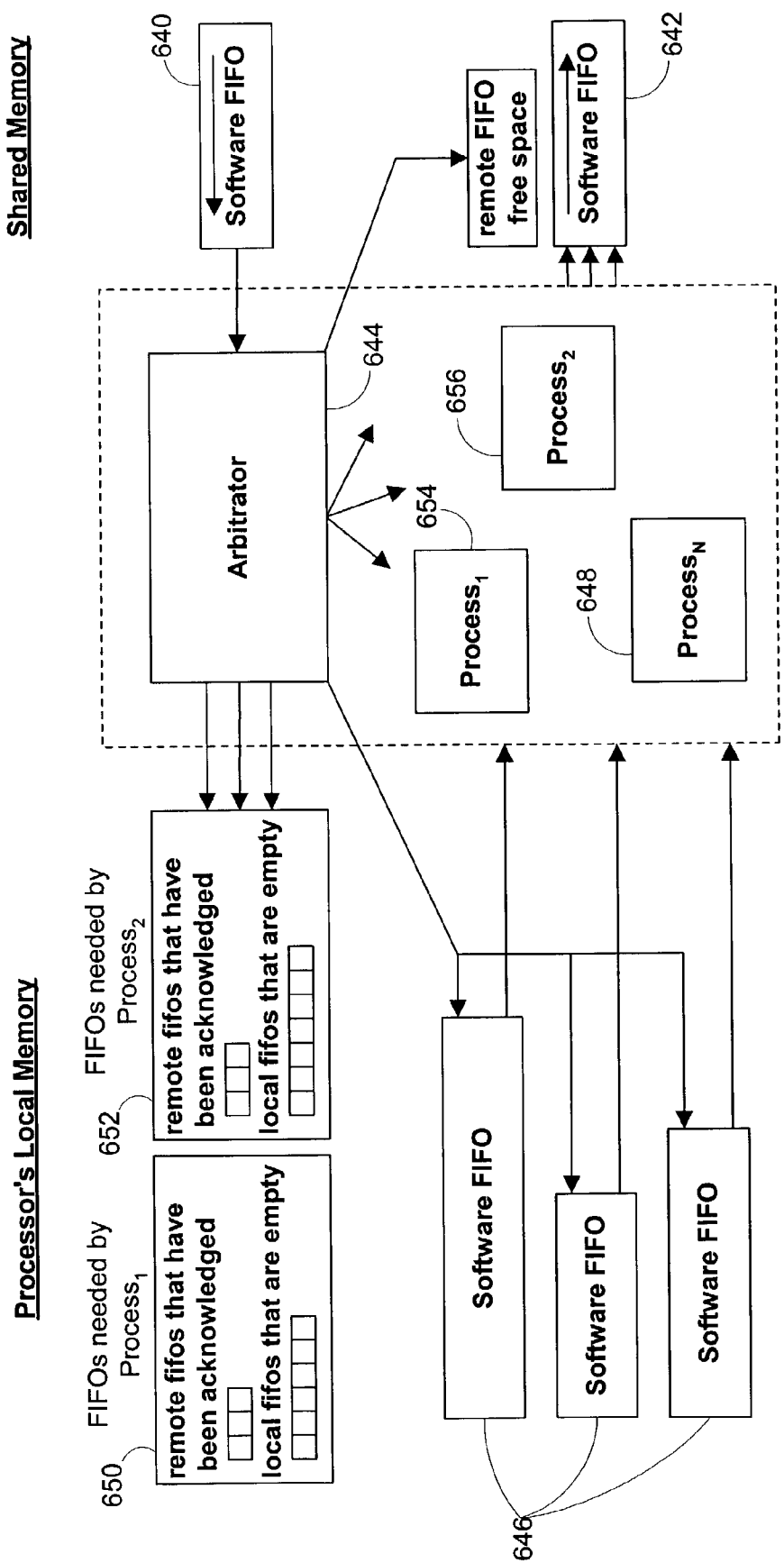
FIG. 60 is a block diagram illustrating how shared memory may be used to provide communication between hardware and software in accordance with the present invention.

FIG. 60 shows how multiple FIFO's 646 may reside in a software device's memory space. On a multi-tasking operating system, multiple processes 654,656 and 648 may be pushing or popping data from FIFO's 646. An arbitrator 644 is an embodiment of a software channel multiplexer and demultiplexer, and as such, keeps track of FIFO acknowledgments (as shown by boxes 650 and 653, which reside in local memory), and may be responsible for sending data elements to and from channel buffers 640 and 642 which correspond to buffers 714 and 718 shown in FIG. 58. In one suitable embodiment of the present invention, arbitrator 644 may be implemented as a device-driver.

Channel multiplexers and channel demultiplexers for FIFO interface buffers residing on a hardware device may be implemented based on what is shown in FIGS. 61-67.

Figure 61:
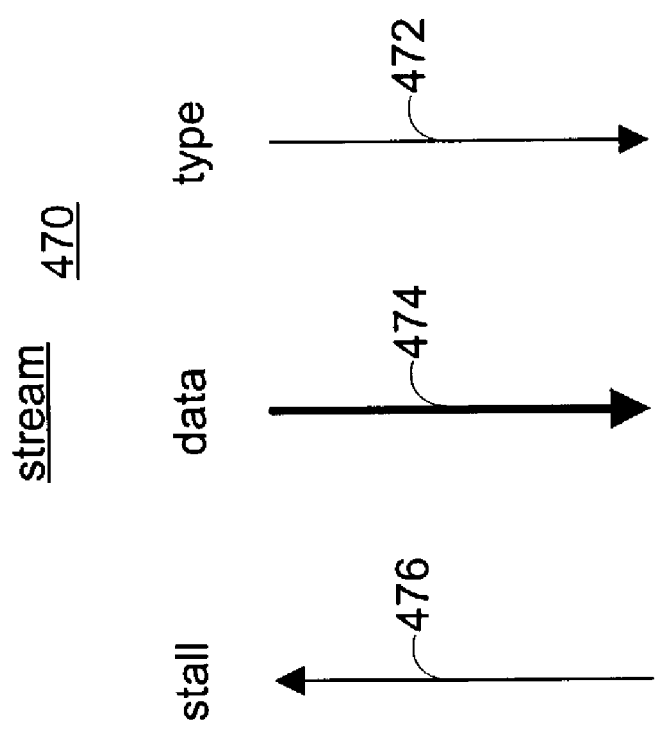
FIG. 61 is a stream in accordance with the present invention.

FIG. 61 defines a "stream" 470 using a set of wires. Stream 470 is a set of wires 474 on which is sent serialized frame data. An additional type wire 472 is used to indicate when data wires 474 hold a frame header. Stall wire 476 may be used to indicate that the channel multiplexer buffer is full, and hence all transmission of frames must stall. Frame data sent to a channel demultiplexer can never stall because the communication system of the present invention ensures that the destination pop interface buffer can never be full.

Figure 62:
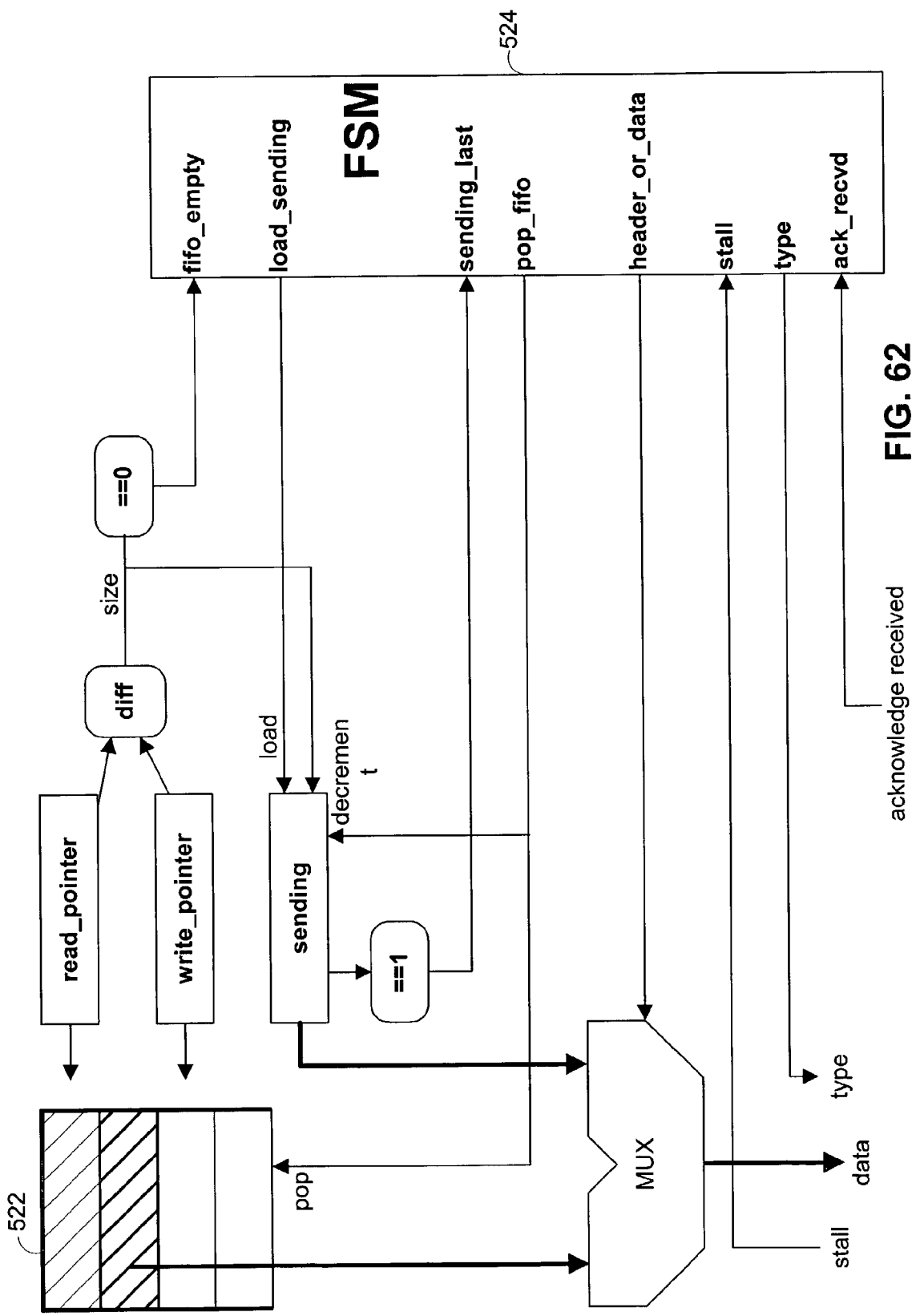
FIG. 62 is a block diagram illustrating how data elements from a push interface buffer may be constructed into a frame in accordance with the present invention.

FIG. 62 shows how data elements from push interface buffer 522 may be constructed into a frame (complete with frame header). Finite state machine (FSM) 524 may create a frame of data elements from push interface buffer 522. FSM 524 may require a number of signals shown in FIG. 62 to determine whether any data elements exist on push interface buffer 522, and if so, sends a number of data elements as a single frame. As illustrated in FIG. 62, it is assumed that the remote pop interface buffer can hold at least as many data elements as buffer 522, and that no more frames can be sent until an acknowledgment has been received. The arrangement of FIG. 62 results in a single stream. If no packet data can be sent, then the stream data sent is a packet composed of only an invalid packet header.

Figure 63:
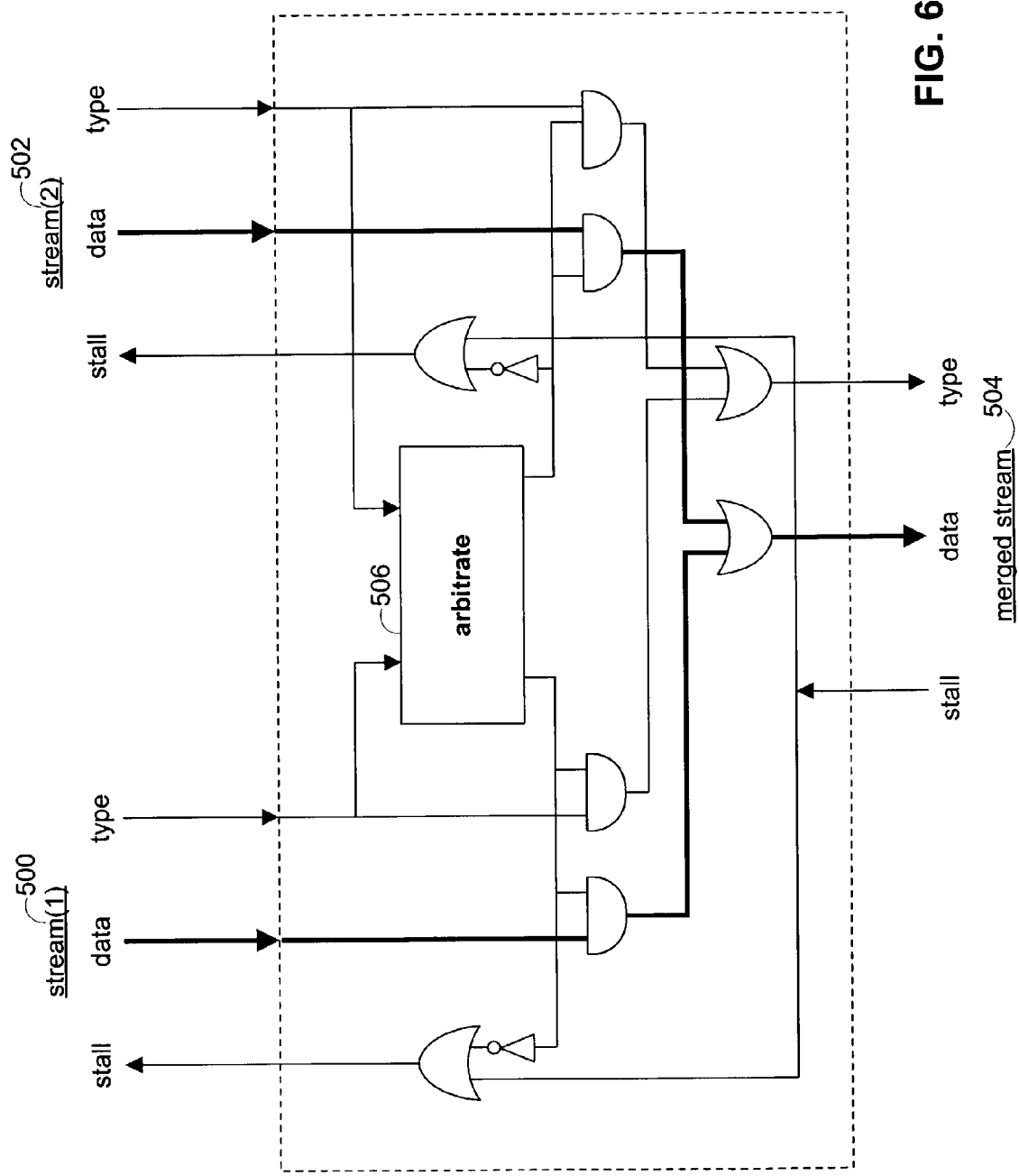
FIG. 63 is a schematic diagram of an illustrative stream merge block in accordance with the present invention.

FIG. 63 shows how two streams may be merged. Arbitrator 506 may implement a fair algorithm that switches between packets on stream 500 and packets on stream 502, depending on which has a valid frame header and/or which stream was chosen last time. Arbitrator 506 uses the AND and OR gates as a multiplexer to choose which stream is sent, and which is stalled.

Cascading the stream-merging circuits allows multiple FIFO streams to eventually merge into a single stream 504.

Figure 65:
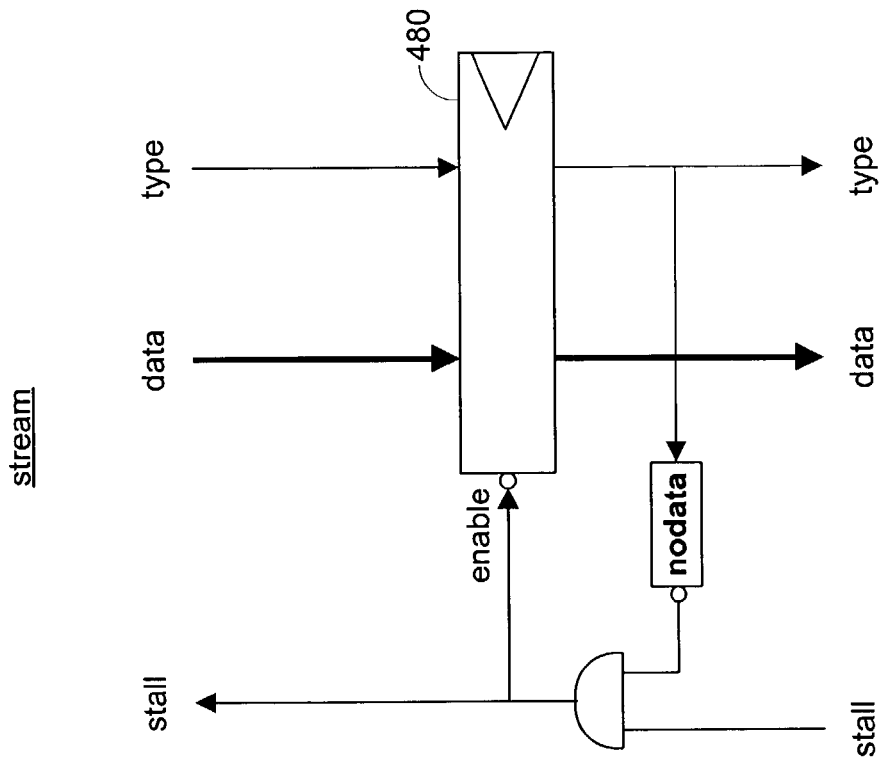
FIGS. 64 and 65 are schematic diagrams for two illustrative implementations for buffering a stream in accordance with the present invention.
Figure 64:
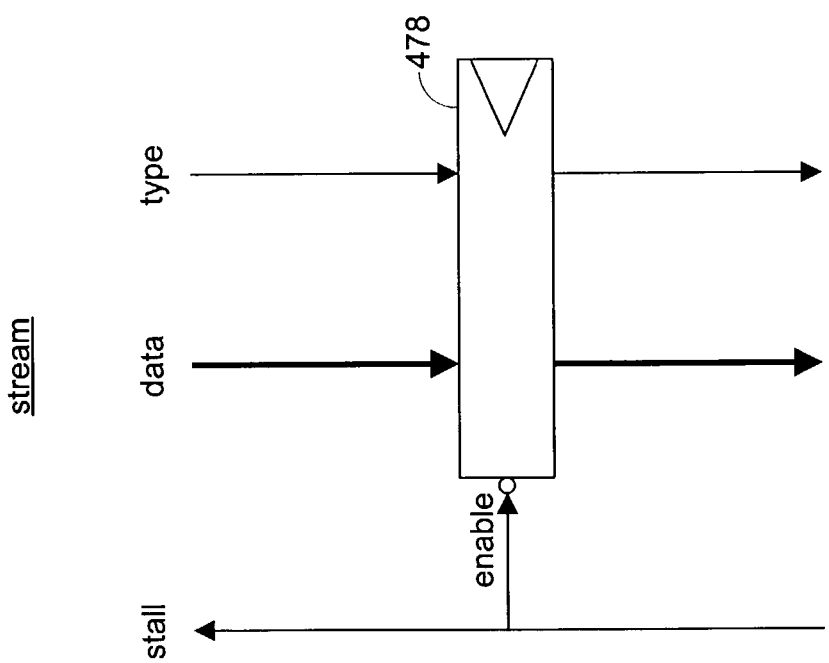

If a large number of streams need to be merged, then it may be desirable to insert pipelining into the streams because this reduces the propagation delay between registers, thus allowing the stream-merging to run at higher clock frequencies. FIG. 64 shows how a register 478 may be inserted into a stream. FIG. 65 shows how, with additional hardware, a register 480 may be inserted into a stream while ensuring that the stream does not stall when register 480 holds an invalid frame-header.

Figure 66:
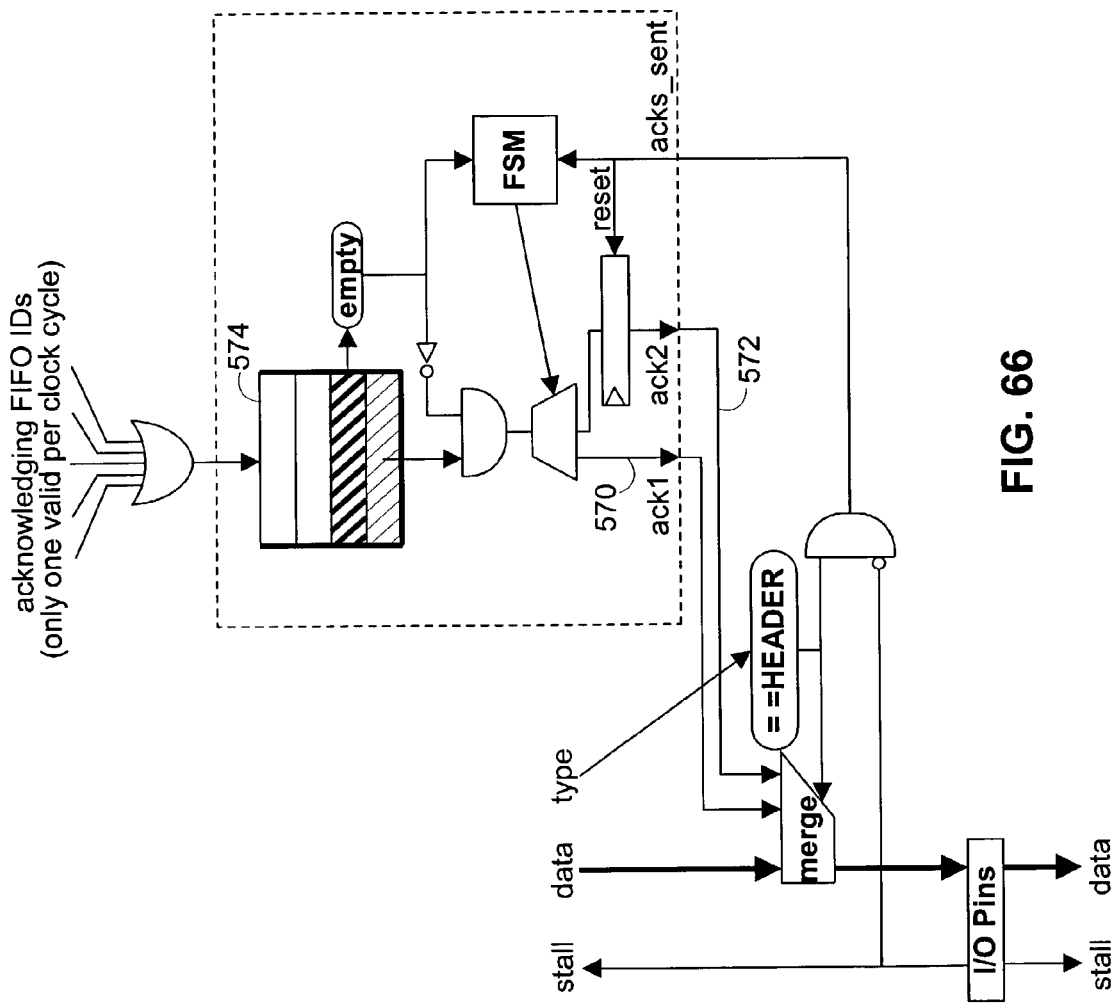
FIG. 66 is a schematic diagram of an illustrative circuit for allowing a merged stream to pass through input/output pins in accordance with the present invention.

FIG. 66 shows how a stream may be modified to include pending acknowledgments before being sent to the channel buffer (or I/O pins in the particular arrangement shown in FIG. 66). Acknowledgments from pop interface buffers may be queued on a separate buffer 574. In this embodiment of the present invention, two acknowledgments may be sent with every frame, so extra hardware 570 and 572 is used to implement a deserializer. If no acknowledgments are pending, the FSM is responsible for resetting the acknowledgments to a special value. Because only one pop interface buffer can be receiving a frame at any one time, only one acknowledgment can be added to acknowledgment FIFO 574 at any one time.

Figure 67:
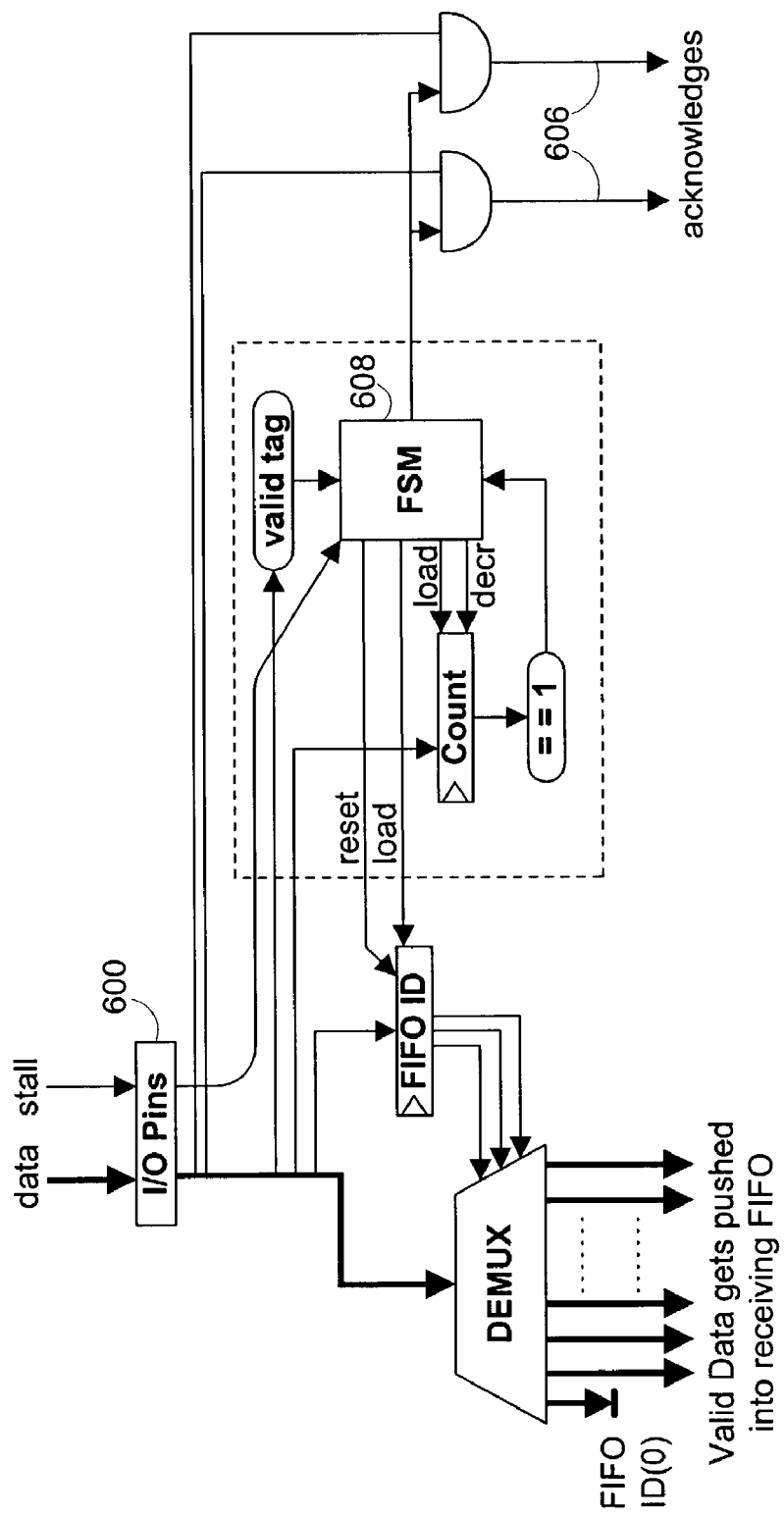
FIG. 67 is a schematic diagram of a circuit used on a remote platform to receive data from a data channel in accordance with the present invention.

FIG. 67 shows how a channel demultiplexer may be implemented in hardware. Frames are received on I/O pins 600 or from a channel demultiplexer buffer, and FSM 608 is used to read each frame header and pass on its contents to the relevant pop interface buffer. Acknowledgments 606 are also extracted from the frame headers so that the pop interface buffers on this device can receive them.

Thus, a software-to-hardware compiler with symbol set inference analysis is provided. One skilled in the art will realize that the present invention can be practiced by other than the described embodiments, which are presented for purposes of illustration and not of limitation, and that the present invention is limited only by the claims which follow.

What is claimed is:

1. A method for optimizing hardware generated by a software-to-hardware compiler based on software source code for a program, the method comprising:
    identifying pointer variables in the program wherein each of the pointer variables is associated with a data width representing an amount of hardware resources;
    determining ranges of objects to which the pointer variables can possibly point during execution of the program;
    in response to the determining ranges of the objects, reducing the data width of at least one of the pointer variables when generating the hardware, wherein the reduced data width pointer variables are implemented such that they point to objects in the determined ranges of objects;

determining whether making simultaneous reads to multiple copies of any of the reduced data width pointer variables stored on multiple memory devices would result in a net optimization; and making at least two copies of the reduced data width pointer variables across more than one memory device that were determined to result in an optimization in the analysis.

2. A method for optimizing hardware generated by a software-to-hardware compiler based on software source code for a program, the method comprising:

determining ranges of values that variables in the program can possibly represent during execution of the program wherein each of the variables in the program is associated with a data width representing an amount of hardware resources;

in response to the determining ranges of the values, reducing the data width of at least one of the variables when generating the hardware, wherein the hardware is configured to build and maintain reduced data width variable regions that correspond to the determined ranges of values;

determining whether making simultaneous reads to multiple copies of any of the reduced data width variable regions stored on multiple memory devices would result in a net optimization; and making at least two copies of the reduced data width variable regions across more than one memory device that were determined to result in an optimization in the analysis.

3. The method of claim 2 wherein the determining ranges of values comprises determining ranges of values that variables in the program can possibly represent during execution of the program based on "assert" statements in the software source code.

4. The method of claim 2 wherein the determining ranges of values comprises determining ranges of values that variables in the program can possibly represent during execution of the program based on symbol set inference analysis.

5. A method for optimizing hardware generated by a software-to-hardware compiler based on software source code for a program, the method comprising:

identifying regions instantiated in the program wherein each of the regions in the program is associated with a data width representing an amount of hardware resources;

reducing the data width of at least one of the regions when using symbol set inference analysis to minimize the regions to be used by the hardware generated by the software-to-hardware compiler;

determining whether making simultaneous reads to multiple copies of any of the reduced data width regions stored on multiple memory devices would result in a net optimization; and making at least two copies of the reduced data width regions across more than one memory device that were determined to result in an optimization in the analysis.

6. The method of claim 5 further comprising:

dynamically performing an analysis during run-time to determine whether the making simultaneous reads to any of the reduced data width regions stored on multiple memory devices would result in a net optimization; and dynamically making during run-time the at least two copies.

7. The method of claim 5, wherein the using symbol set inference analysis comprises:

generating a plurality of stacks, wherein each of the plurality of stacks is allocated a data width that minimizes hardware resources used, wherein each of the plurality of stacks is associated with one of a plurality of functions defined in the source code, and wherein each of the plurality of stacks stores function arguments, local variables, a return value, and a return address; and generating a plurality of stack pointers, wherein each of the plurality of stack pointers is associated with one of the plurality of stacks, and wherein each of the plurality of stack pointers points to the one of the plurality of stacks with which it is associated.

8. The method of claim 5 wherein the using symbol set inference analysis comprises determining ranges of values that variables in the program can possibly represent during execution of the program based on "assert" statements in the software source code.

9. The method of claim 5 wherein the using symbol set inference analysis comprises:

identifying pointer variables in the program;

determining ranges of objects to which the pointer variables can possibly point during execution of the program; and generating the hardware, wherein the pointer variables are implemented such that they can point only to objects in the ranges of objects.

10. The method of claim 5 wherein the using symbol set inference analysis comprises:

determining ranges of values that variables in the source code can possibly represent during execution of the program; and generating the hardware, wherein the hardware is configured to build and maintain regions that correspond to only the ranges of values.

11. A programmable logic resource having hardware constructs generated by a software-to-hardware compiler based on software source code for a program, the hardware constructs configured to build and maintain regions that correspond to ranges of values associated with variables wherein each of the regions is associated with a data width representing an amount of hardware resources and to reduce the data width of at least one of the regions, wherein the ranges of values of the reduced data width regions are limited to those ranges of values that can possibly occur during execution of the program, and wherein it is determined whether making simultaneous reads to multiple copies of any of the reduced data width regions stored on multiple memory devices would result in a net optimization and making at least two copies of the reduced data width regions across more than one memory device that were determined to result in an optimization in the analysis.

12. The system of claim 11 wherein the ranges of values are based on "assert" statements in the software source code.

13. The system of claim 11 wherein the ranges of values are based on symbol set inference analysis.

14. A programmable logic resource having hardware constructs generated by a software-to-hardware compiler using symbol set inference analysis based on software source code for a program, the hardware constructs configured to use regions in memory devices to store objects corresponding to the software source code, wherein each of the regions is associated with a data width representing an amount of hardware resources and the data width of at least one of the regions is reduced, and wherein it is determined whether making simultaneous reads to multiple copies of any of the reduced data width regions stored on multiple memory devices would result in a net optimization and making at least two copies of the reduced data width regions across more than one memory device that were determined to result in an optimization in the analysis.

15. The programmable logic resource of claim 14 wherein the hardware constructs are further configured to:

dynamically perform an analysis during run-time to determine whether the making simultaneous reads to any of the reduced data width regions stored on multiple memory devices regions would result in a net optimization; and dynamically make the at least two copies during run-time.

16. The programmable logic resource of claim 14, wherein the hardware constructs are further configured to:

generate a plurality of stacks, wherein each of the plurality of stacks is allocated a data width that minimizes hardware resources used, wherein each of the plurality of stacks is associated with one of a plurality of functions defined in the source code, and wherein each of the plurality of stacks stores function arguments, local variables, a return value, and a return address; and generate a plurality of stack pointers, wherein each of the plurality of stack pointers is associated with one of the plurality of stacks, and wherein each of the plurality of stack pointers points to the one of the plurality of stacks with which it is associated.

17. The programmable logic resource of claim 14 wherein the hardware constructs are generated by the software-to-hardware compiler based on "assert" statements in the software source code to indicate a range of values variables can possibly represent in the program.

18. The programmable logic resource of claim 14 wherein the hardware constructs are further configured to use pointer variables that can point to objects in only ranges of objects that can be pointed to in the program.

19. The programmable logic resource of claim 14 wherein the hardware constructs are further configured to build and maintain regions that correspond to only ranges of values that objects defined in the source can possibly represent in the program.

* * * * *